(12) United States Patent
Ishizuya et al.

(10) Patent No.: US 6,835,932 B2
(45) Date of Patent: Dec. 28, 2004

(54) THERMAL DISPLACEMENT ELEMENT AND RADIATION DETECTOR USING THE ELEMENT

(75) Inventors: Tohru Ishizuya, Tokyo (JP); Junji Suzuki, Hachioji (JP)

(73) Assignee: Nikon Corporation, Tokyo (JP)

( * ) Notice: Subject to any disclaimer, the term of this patent is extended or adjusted under 35 U.S.C. 154(b) by 243 days.

(21) Appl. No.: 10/129,338

(22) PCT Filed: Sep. 3, 2001

(86) PCT No.: PCT/JP01/07608

§ 371 (c)(1),
(2), (4) Date: May 3, 2002

(87) PCT Pub. No.: WO02/21086

PCT Pub. Date: Mar. 14, 2002

(65) Prior Publication Data

US 2002/0153486 A1 Oct. 24, 2002

(30) Foreign Application Priority Data

Sep. 5, 2000 (JP) .................................. 2000-268839
Jun. 21, 2001 (JP) .................................. 2001-187945
Aug. 2, 2001 (JP) .................................. 2001-234569

(51) Int. Cl.$^7$ .............................................. G01J 5/00
(52) U.S. Cl. ............................ 250/338.1; 250/336.1; 250/341.1
(58) Field of Search ................ 250/341.8, 338.3, 250/338.4, 332, 341.1, 340, 338.1, 370.14, 370.01

(56) References Cited

U.S. PATENT DOCUMENTS

| | | | |
|---|---|---|---|
| 3,896,309 A | 7/1975 | Halsor et al. | 250/211 |
| 5,623,147 A | 4/1997 | Baert et al. | 250/338.1 |
| 5,777,328 A * | 7/1998 | Gooch | 250/338.4 |
| 5,844,238 A | 12/1998 | Sauer et al. | 250/332 |
| 5,929,440 A | 7/1999 | Fisher | 250/338.1 |

(List continued on next page.)

FOREIGN PATENT DOCUMENTS

| | | |
|---|---|---|
| JP | 64-20640 | 2/1989 |
| JP | 2-196457 | 8/1990 |
| JP | 8-193881 | 7/1996 |
| JP | 8-193888 | 7/1996 |

(List continued on next page.)

OTHER PUBLICATIONS

T. Ishizuya et al., "Optically Readable Bi–material Infrared Detector," *ITE Technical Report*, vol. 24, No. 17, Feb. 25, 2000, pp. 19–24.

*Primary Examiner*—David Porta
*Assistant Examiner*—Christine Sung
(74) *Attorney, Agent, or Firm*—Miles & Stockbridge P.C.

(57) ABSTRACT

A thermal displacement element comprises a substrate, and a supported member supported on the substrate. The supported member includes first and second displacement portions, a heat separating portion exhibiting a high thermal resistance and a radiation absorbing portion receiving the radiation and converting it into heat. Each of the first and second displacement portions has at least two layers of different materials having different expansion coefficients and stacked on each other. The first displacement portion is mechanically continuous to the substrate without through the heat separating portion. The radiation absorbing portion and the second displacement portion are mechanically continuous to the substrate through the heat separating portion and the first displacement portion. The second displacement portion is thermally connected to the radiation absorbing portion. A radiation detecting device comprises a thermal displacement element and a displacement reading member fixed to the second displacement portion of the thermal displacement element and used for obtaining a predetermined change corresponding to a displacement in the second displacement portion.

34 Claims, 23 Drawing Sheets

U.S. PATENT DOCUMENTS

| | | | | |
|---|---|---|---|---|
| 5,962,854 A | * | 10/1999 | Endo | 250/349 |
| 5,965,886 A | | 10/1999 | Sauer et al. | 250/332 |
| 6,080,988 A | * | 6/2000 | Ishizuya et al. | 250/338.1 |
| 6,249,001 B1 | * | 6/2001 | Sauer et al. | 250/338.1 |
| 6,465,784 B1 | * | 10/2002 | Kimata | 250/332 |
| 6,624,384 B2 | * | 9/2003 | Tsuchiya et al. | 219/121.69 |
| 6,642,562 B2 | * | 11/2003 | Watanabe | 257/292 |
| 2002/0036265 A1 | | 3/2002 | Ishizuya et al. | 250/338.1 |

FOREIGN PATENT DOCUMENTS

| | | |
|---|---|---|
| JP | 10-185680 | 7/1998 |
| JP | 10-253447 | 9/1998 |
| JP | 2000-9542 | 1/2000 |
| JP | 2000-146702 | 5/2000 |
| JP | 2000-221081 | 8/2000 |
| JP | 2000-326299 | 11/2000 |
| JP | 2001-041823 | 2/2001 |
| WO | 00/40938 | 7/2000 |

* cited by examiner

THERMAL DISPLACEMENT ELEMENT AND RADIATION DETECTOR USING THE ELEMENT

TECHNICAL FIELD

The present invention relates to a thermal displacement element used for a thermal radiation detecting device such as a thermal infrared-ray detecting device etc, and to a radiation detecting device using the same element.

BACKGROUND ARTS

For example, an electrostatic capacitance type thermal infrared-ray detecting device and a light reading type thermal infrared-ray detecting device, have hitherto involved the use of a thermal displacement element including a base body (substrate) and a supported member supported on this base body (Japanese Patent Application Laid-Open No. 8-193888, U.S. Pat. No. 3,896,309, Japanese Patent Application Laid-Open No. 10-253447 and others). The supported member has an infrared-ray absorbing portion receiving and converting infrared-rays into heat, and a displacement portion thermally connected to the infrared-ray absorbing portion and displacing based on a bimetal principle with respect to the base body in accordance with the heat. Accordingly, the radiation is converted into heat, and the displacement portion is bent corresponding to the heat and thus displaces.

In the case of the light reading type thermal infrared-ray detecting device, for example, a reflection plate reflecting the received reading beam is fixed to the displacement portion of the thermal displacement element, the reflection plate is irradiated with the reading beam, and the displacement occurred in the displacement portion is read as a change in a reflecting angle of the reading beam, thereby detecting a quantity of the incident infrared-rays.

Further, in the case of the electrostatic capacitance type thermal infrared-ray detecting device, a movable electrode portion is fixed to the displacement portion of the thermal displacement element, a fixed electrode portion is fixed to the base body in a way that faces to this movable electrode portion, a change in height (an interval between the movable electrode portion and the fixed electrode portion) of the movable electrode portion due to the displacement occurred in the displacement portion, is read as an electrostatic capacitance between the two electrode portions, thereby detecting a quantity of the incident infrared-rays.

In the conventional thermal displacement element, however, the supported member supported on the base body simply has the displacement portion and the infrared-ray absorbing portion. Hence, as far as a temperature of the base body is not so controlled as to be strictly kept at a fixed level by use of a temperature controller such as a Peltier element etc, it follows that a quantity of the displacement of the displacement portion fluctuates when affected by an ambient temperature even if the quantity of the incident infrared-rays is the same. Accordingly, the infrared-ray detecting device using the conventional thermal displacement element is incapable of accurately detecting the infrared-rays from a target object unless the temperature of the substrate is strictly controlled. If the temperature of the substrate is strictly controlled, an accuracy of detecting the infrared-rays can be improved by reducing the influence of the ambient temperature, but nevertheless a cost inevitably increases.

Moreover, in the conventional thermal displacement element, the supported member supported on the substrate simply includes the displacement portion and the infrared-ray absorbing portion, and the displacement portion is composed of two layers having different expansion coefficients. Accordingly, the two layers composing the displacement portion are structured very thin in order to enhance a respondency by decreasing a thermal capacity and therefore bent upward or downward with respect to the substrate by dint of stresses (internal stresses) of the respective layers which are determined under the conditions when forming the layers, and it is in fact quite difficult to make the displacement portion parallel with the substrate in a case where the infrared-rays from the target object do not enter. Thus, according to the conventional thermal displacement element, the displacement portion is bent upward or downward with respect to the substrate in an initial state (i.e., initially) where the infrared-rays from the target object are not yet incident, so that a variety of inconveniences arise in the conventional infrared-ray detecting device using this thermal displacement element.

Namely, for instance, in the conventional light reading type infrared-ray detecting device, the reflection plate fixed to the displacement portion is initially inclined to the substrate. Therefore, alignments of optical elements of the reading optical system need a labor when assembled. Further, the supported portion and the reflection plate of the thermal displacement element are defined as one pixel, and these pixels are arrayed one-dimensionally or two-dimensionally on the substrate, wherein there is formed an image of the infrared-rays in relation to the reading beams. In this case, the reflection plate of each of the pixels is initially inclined to the substrate, and hence the respective reflection plates can not be positioned within the same plane on the whole, with the result that level differences occur stepwise between the respective reflection plates. Accordingly, for example; in a case where the image of the infrared-rays is obtained by forming images (that are images with light quantities of respective portions being different corresponding to inclinations of the corresponding reflection plates)of the respective reflection plates in relation to the reading beams, there arises such an inconvenience that the reading optical system for forming this image needs to have a large depth of field or the image formed becomes an image as if the original image is viewed obliquely.

Further, for example, in the conventional electrostatic capacitance type infrared-ray detecting device, the movable electrode portion fixed to the displacement portion is initially inclined to the fixed electrode portion. Since an electrostatic capacitance between the two electrode portions is in inverse proportion to an interval between the two electrode portions, the inter-electrode electrostatic capacitance becomes larger as the electrode-to-electrode interval is narrower, and there also increases a change in the inter-electrode electrostatic capacitance with respect to the change in temperature due to the irradiation of the infrared-rays. Namely, the infrared-rays can be detected with a higher sensitivity as the electrode-to-electrode interval is narrower. If the electrode portions are brought into contact with each other, however, a change causing a further increase in the inter electrode capacitance can not occur, and a dynamic range is restricted, so that the electrode portions must not be brought into contact with each other. It is therefore preferable that the interval between the electrode portions be set as narrow as possible enough not to make the electrode portions contact with each other. According to the conventional infrared-ray detecting device, however, the movable electrode portion is, as explained above, inclined to the fixed electrode portion, and consequently there arises an inconvenience in which the sensitivity of detecting the infrared-rays declines or the dynamic range is restricted because of the inter electrode interval being too wide or the electrode portions being brought into contact with each other.

It is an object of the present invention, which was devised under such circumstances, to provide a thermal displacement element and a radiation detecting device using the same element that are capable of obviating the variety of inconveniences hitherto occurred due to the initial flexure of the displacement portion.

It is another object of the present invention to provide a thermal displacement element and a radiation detecting device using the same element that are capable of restraining, if the strict temperature control is not conducted, an influence by a change in ambient temperature to a greater degree than in the prior art and detecting the radiation at a high accuracy.

DISCLOSURE OF THE INVENTION

To accomplish the above objects, a thermal displacement element in a first mode of the present invention, comprises a substrate, and a supported member supported on the substrate. Then, the supported member includes first and second displacement portions, a heat separating portion exhibiting a high thermal resistance and a radiation absorbing portion receiving a radiation and converting it into heat. Each of the first and second displacement portions has at least two layers of different materials having different expansion coefficients and stacked on each other. The first displacement portion is mechanically continuous to the substrate without through the heat separating portion. The radiation absorbing portion and the second displacement portion are mechanically continuous to the substrate through the heat separating portion and the first displacement portion. The second displacement portion is thermally connected to the radiation absorbing portion. Note that the radiation may be various types of radiation of invisible light such as X-rays, ultraviolet rays etc and others in addition to the infrared-rays.

The thermal displacement element in the first mode has, at the supported member, the first displacement portion in addition to the second displacement portion that is thermally connected to the radiation absorbing portion and bent in response to the radiation. Accordingly, a positional relationship between the first and second displacement portions a relationship between film structures (layer structures) are properly determined as in, e.g., second and sixth modes which will be described later on, an initial inclination of the distal end of the second displacement portion, which is to occur due the initial flexure of the second displacement portion, can be reduced or canceled by the initial flexure of the first displacement portion. Therefore, according to the first mode, the reflection plate and the movable electrode are fixed to the distal end of the second displacement portion, thereby making it possible to obviate or relieve the various inconveniences inherent in the prior art that have hitherto been caused by the initial flexure of the displacement portion.

By the way, in the first mode, the first displacement portion is disposed on the side closer to the substrate on a mechanically continuous route in the supported member, and the second displacement portion and the radiation absorbing portion are disposed on the side farther away from the substrate. The heat separating portion is disposed therebetween. This heat separating portion controls a flow of the heat from the second displacement portion to the substrate. Accordingly, when the radiation absorbing portion receives the radiation of the infrared-rays, the X-rays, the ultraviolet rays etc from the target object, this radiation is absorbed by the radiation absorbing portion and converted into the heat. The second displacement portion absorbs the heat, and the temperature rises, whereby the second displacement portion is bent. Further, a quantity of the generated heat flowing to the first displacement portion is substantially equal to a quantity of the heat flowing out of the first displacement portion to the substrate, so that there occurs neither the heat absorption of the first displacement portion nor the change in temperature. Therefore, the first displacement portion is not bent. Hence, it follows that the distal end of the second displacement portion is inclined corresponding to a quantity of the radiation from the target object. Accordingly, as in fourteenth through eighteenth modes that will be explained later on, the reflection plate and the movable electrode are fixed to the distal end of the second displacement portion, the radiation of the infrared-rays etc from the target object can be detected.

Then, if the temperature of the substrate is not strictly controlled and when an ambient temperature changes, a heat flow depending on only the change in the ambient temperature reaches a thermal equilibrium. With this, changes in temperatures of the first and second displacement portions are equal. The first displacement portion and the second displacement portion are equally bent corresponding to the changes in these temperatures. As described above, the positional relationship between the first and second displacement portions and the relationship between the layer structures are properly determined as in, e.g., the second and sixth modes that will hereinafter be explained, whereby the inclination of the distal end of the second displacement portion that is to occur due to the flexure of the second displacement portion subsequent to the change in the ambient temperature, can be reduced or canceled by the flexure of the first displacement portion subsequent to the change in the ambient temperature. Therefore, according to the first mode, if the temperature of the substrate is not strictly controlled, there decreases a change quantity of the inclination of the distal end of the second displacement portion subsequent to the change in the ambient temperature, and the radiation can be detected at a higher accuracy.

As a matter of course, in the case of using the thermal displacement element in the first mode, the influence by the change in the ambient temperature may be prevented by encasing the thermal displacement element in a vacuum container etc and by strictly controlling the temperature of the substrate. In this case, the first displacement portion does not perform a behavior of displacing to cancel the change in the ambient temperature. Even in this case, however, the first displacement portion operates as a means for reducing or canceling the initial inclination of the distal end of the second displacement portion that is to occur due to the initial flexure of the second displacement portion, and a role of this first displacement portion is great.

In the thermal displacement element according to a second mode of the present invention, in the first mode, a direction of the first displacement portion from a proximal end toward a distal end of the first displacement portion is substantially opposite to a direction of the second displacement portion from a proximal end toward a distal end of the second displacement portion, and at least the two layers of the first displacement portion and at least the two layers of the second displacement portion are composed of the same materials and stacked in the same sequence.

Herein, the proximal end of the displacement portion is, on the route mechanically continuous from the substrate, a side end, proximal to the substrate (base body), of the side ends of this displacement portion. Further the distal end of the displacement portion is, on the route mechanically continuous from the substrate, a side end, distal from the substrate (base body), of the side ends of this displacement portion.

The second mode is an exemplification of one example of the positional relationship between the first and second displacement portions and the relationship between the layer structures.

In the thermal displacement element according to a third mode of the present invention, in the second mode, a length of the first displacement portion from a proximal end toward a distal end of the first displacement portion is substantially equal to a length of the second displacement portion from a proximal end toward a distal end of the second displacement portion.

As in the third mode, when the respective lengths are substantially equalized, the initial inclination of the distal end of the second displacement portion is further reduced, and the change quantity of the inclination of the distal end of the second displacement portion due to the change in the ambient temperature is further decreased, which is conceived preferable.

In the thermal displacement element according to a fourth mode of the present invention, in the third mode, a position of the proximal end of the first displacement portion is substantially the same as a position of the distal end of the second displacement portion as viewed in a widthwise direction of the first and second displacement portions.

As in the fourth mode, when the positions are substantially set the same, the first displacement portion is capable of canceling a displacement of the distal end of the second displacement portion in an initial heightwise direction with respect to the substrate, which is to occur due to the initial flexure of the second displacement portion, and also canceling a displacement of the distal end of the second displacement portion in the heightwise direction due to the change in the ambient temperature. Accordingly, the fourth mode is effective especially in the case of reading not the inclination of the distal end of the second displacement portion as a displacement quantity but the height of the distal end of the second displacement portion from the substrate as an incident radiation quantity.

In the thermal displacement element according to a fifth mode of the present invention, in any one of the first through fourth modes, there is provided such a structure that at least the two layers of the first displacement portion and at least the two layers of the second displacement portion can be formed simultaneously for every corresponding layer.

When adopting the structure in the fifth mode, the first and second displacement portions can be simultaneously manufactured in the same manufacturing processes. To be specific, for example, if the first and second displacement portions are each composed of two sheets of lower and upper layers, the lower layers of the first and second displacement portions can be simultaneously formed, and thereafter the upper layers of first and second displacement portions can be simultaneously formed. If the first and second displacement portions are manufactured in different manufacturing processes, it follows that a difference in layer characteristics ((internal) stress, layer thickness and others) between the first and second displacement portions become comparatively large. Accordingly, the first and second displacement portions come to have different degrees of their initial flexures and different degrees of flexure due to the change in the ambient temperature. In this point, according to the fifth mode, since the first and second displacement portions can be simultaneously manufactured in the same manufacturing processes, there is almost no difference in the layer characteristics between the first and second displacement portions, and the first and second displacement portions come to have almost no difference in the degrees of the initial flexures and the degrees of the flexures due to the change in the ambient temperature, which is conceived more preferable. Note that if the first and second displacement portions are disposed in close proximity to each other, the difference in the layer characteristics between the first and second displacement portions becomes still smaller, which is conceived much more preferable.

In the thermal displacement element according to a sixth mode of the present invention, in the first mode, a direction of the first displacement portion from a proximal end toward a distal end of the first displacement portion is substantially the same as a direction of the second displacement portion from a proximal end toward a distal end of the second displacement portion, and at least the two layers of the first displacement portion and at least the two layers of the second displacement portion are composed of the same materials and stacked in the reversed sequence.

The sixth mode is an exemplification of another example of the positional relationship between the first and second displacement portions and the relationship between the layer structures in the first mode.

In the thermal displacement element according to a seventh mode of the present invention, in the sixth mode, a length of the first displacement portion from a proximal end toward a distal end of the first displacement portion is substantially equal to a length of the second displacement portion from a proximal end toward a distal end of the second displacement portion.

As in this seventh mode, if the respective lengths are set substantially equal, the initial inclination of the distal end of the second displacement portion is further decreased, and a change quantity of the inclination of the distal end of the second displacement portion due to the change in the ambient temperature is further reduced, which is conceived preferable.

In the thermal displacement element according to an eighth mode, in any one of the first though seventh modes, when the first and second displacement portions are set in an unbent state, a tier on which at least one of the first displacement portion, the second displacement portion, at least a part of the heat separating portion and the radiation absorbing portion is positioned, is different from a tier on which the rest of them are positioned.

In the first through seventh modes, the first and second displacement portions, the heat separating portion and the radiation absorbing portion may all be disposed on the same tier. If a plurality of unit elements are arrayed one-dimensionally or two-dimensionally on the substrate, however, the components of the unit element or the components of the adjacent unit element can be so disposed as to be stacked up and down by arranging them on a tier different from others as in the eighth mode, whereby a so-called aperture ratio can be enhanced.

A thermal displacement element in a ninth mode of the present invention comprises a substrate, and a supported member supported on the substrate. Then, the supported member includes a heat separating portion exhibiting a high thermal resistance, a radiation absorbing portion receiving a radiation and converting it into heat and first and second displacement portions. Each of the first and second displacement portions has a plurality of individual displacement portions. Each of the plurality of individual displacement portions of the first displacement portion has at least two layers stacked on each other and composed of different materials having different expansion coefficients. Each of the plurality of individual displacement portions of the second displacement portion has at least two layers stacked on each other and composed of different materials having different expansion coefficients. The first displacement portion is mechanically continuous to the substrate without through the heat separating portion. The radiation absorbing portion and the second displacement portion are mechanically continuous to the substrate through the heat separating portion and the first displacement portion. The second displacement portion is thermally connected to the radiation absorbing portion.

In the thermal displacement element according to a tenth mode of the present invention, in the ninth mode, the plurality of individual displacement portions of the first displacement portion are sequentially mechanically connected in a predetermined direction from the proximal end of the first displacement portion toward the distal end of the first displacement portion. Then, the plurality of individual displacement portions of the second displacement portion are sequentially mechanically connected in a predetermined direction from the proximal end of the second displacement portion toward the distal end of the second displacement portion. A direction of the first displacement portion from a proximal end toward a distal end of the first displacement portion is substantially opposite to a direction of the second displacement portion from a proximal end toward a distal end of the second displacement portion. At least the two layers of each of the plurality of individual displacement portions of the first displacement portion and at least the two layers of each of the plurality of individual displacement portions of the second displacement portion, are composed of the same materials and stacked in the same sequence.

In the thermal displacement element according to an eleventh mode of the present invention, in the ninth or tenth mode, there is provided such a structure that at least the two layers of each of the plurality of individual displacement portions of the first displacement portion and at least the two layers of each of the plurality of individual displacement portions of the second displacement portion can be formed simultaneously for every corresponding layer.

Note that the ninth mode is not limited to the tenth mode but may include, for example, the following thermal displacement element. Namely, the plurality of individual displacement portions of the first displacement portion are sequentially mechanically connected in a predetermined direction from the proximal end of the first displacement portion toward the distal end of the first displacement portion. Then, the plurality of individual displacement portions of the second displacement portion are sequentially mechanically connected in a predetermined direction from the proximal end of the second displacement portion toward the distal end of the second displacement portion. A direction of the first displacement portion from a proximal end toward a distal end of the first displacement portion is substantially the same as a direction of the second displacement portion from a proximal end toward a distal end of the second displacement portion. At least the two layers of each of the plurality of individual displacement portions of the first displacement portion are composed of the same materials and stacked in the same sequence. At least the two layers of each of the plurality of individual displacement portions of the second displacement portion are composed of the same materials and stacked in the same sequence. At least the two layers of each of the plurality of individual displacement portions of the first displacement portion and at least the two layers of each of the plurality of individual displacement portions of the second displacement portion, are composed of the same materials and stacked in the reversed sequence.

In the thermal displacement element according to a twelfth mode of the present invention, in any one of the ninth through eleventh modes, when the first and second displacement portions are set in an unbent state, a tier on which at least one of the plurality of individual displacement portions of the first displacement portion, the plurality of individual displacement portions of the second displacement portion, at least a part of the heat separating portion and the radiation absorbing portion is positioned, is different from a tier on which the rest of them are positioned.

In the ninth through twelfth modes, the first and second displacement portions each have the plurality of individual displacement portions but are respectively substantially the same as those in the first, second, fifth and eighth modes, and the same advantages as those in these modes are obtained. Further, in the twelfth mode, the tier of the plurality of individual displacement portions of the first displacement portion can be changed, or the tier of the plurality of individual displacement portions of the second displacement portion can be changed. Hence, the so-called aperture ratio can be increased in a way that enhances a sensitivity (which is a displacement quantity with respect to the incident radiation quantity, and more essentially a radiation detection sensitivity) by increasing an entire length of the first and second displacement portions.

The thermal displacement element according to thirteenth mode of the present invention, in any one of the first through twelfth modes, further comprises a shielding portion for substantially shielding the first displacement portion from the radiation.

In the first through twelfth modes, if the first displacement portion has a radiation absorbing characteristic and if the radiation enters not only the radiation absorbing portion but also the first displacement portion, the first displacement portion absorbs the radiation, rises in temperature and displaces. This displacement acts in such a direction as to cancel a displacement that is to occur in the second displacement portion because of the radiation absorbing portion receiving the radiation, and is therefore a cause of a decline of the radiation detection sensitivity. Then, for preventing this decline of the sensitivity, as in the thirteenth mode, it is preferable to provide the shielding portion. As a matter of course, even if the first displacement portion has the radiation absorbing characteristic, the decline of the detection sensitivity is not so large, and hence the shielding portion is not necessarily provided. Particularly when the first displacement portion has almost no radiation absorbing characteristic, almost no decline of the detection sensitivity is brought about even if the shielding portion is not provided.

In the thermal displacement element according to a fourteenth mode of the present invention, in any one of the first through thirteenth modes, the radiation absorbing portion includes a radiation reflection portion having such a characteristic as to reflect some of the incident radiation, and the radiation absorbing portion is disposed from the radiation absorbing portion at an interval substantially given by $n\lambda_0/4$, where n is an odd-number, and $\lambda_0$ is a central wavelength of a desired wavelength band of the radiation, and substantially totally reflects the radiation.

According to the fourteenth mode, when the radiation enters the radiation absorbing portion from the side opposite to the radiation reflection portion, the radiation absorbing portion absorbs a part of the incident radiation, and the rest of the radiation is reflection by the radiation reflection portion and further reflected by the radiation absorbing portion. The reflected radiation again enters the radiation reflection portion. Therefore, an interference phenomenon occurs between the radiation absorbing portion and the radiation reflection portion, and, because of the interval between these two portions being set approximately odd-numbered times as large as ¼ of the central wavelength of the desired wavelength band of the incident radiation, the radiation absorbing portion absorbs the radiation substantially at the maximum, thereby increasing the radiation absorption rate of the radiation absorbing portion. Accordingly, even when a thermal capacity of the radiation absorbing portion is reduced by decreasing the thickness of the radiation absorbing portion, the radiation absorption rate can be increased. As a result, both of the detection sensitivity and the detection respondency can be enhanced.

A radiation detecting device according to a fifteenth mode of the present invention comprises a thermal displacement element in any one of the first through fourteenth modes, and a displacement reading member fixed to the second displacement portion and used for obtaining a predetermined change corresponding to a displacement in the second displacement portion.

Note that the supported member and the displacement reading member are structured as one single element (corresponding to a pixel), and a plurality of elements may be provided and arrayed one-dimensionally or two-dimensionally in the fifteenth mode. In this case, the present radiation detecting device configures an imaging device for capturing an image based on the radiation. As a matter of course, in the fifteenth mode, one single element may be enough to be provided simply for detecting the radiation.

In the radiation detecting device according to sixteenth mode of the present invention, in the fifteenth mode, the displacement reading member is a reflection portion reflecting received reading beam.

In the radiation detecting device according to a seventeenth mode of the present invention, in the fifteenth mode, the displacement reading member is a movable reflection portion and includes a fixed reflection portion fixed to the substrate, and the movable reflection portion and the fixed reflection portion substantially configure reflection type diffraction gratings and reflect the received reading beam as diffraction light.

In the radiation detecting device according to an eighteenth mode of the present invention, in the fifteenth mode, the displacement reading member is a half-mirror portion reflecting only some of the received reading beam and including a reflection portion fixed to the substrate in a way that faces to the half-mirror portion.

In the radiation detecting device according to a nineteenth mode of the present invention, in the fifteenth mode, the displacement reading member is a reading beam reflection portion reflecting the received reading beam, and includes a half-mirror portion fixed to the substrate in a way that faces to the reading beam reflection portion and reflecting only some of the received reading beams.

In the radiation detecting device according to a twentieth mode of the present invention, in the nineteenth mode, the displacement reading member serves as a radiation reflection portion disposed from the radiation absorbing portion at an interval substantially given by $n\lambda_0/4$, where n is an odd-number, and $\lambda_0$ is a central wavelength of a desired wavelength band of the radiation, and substantially totally reflecting the radiation.

In the radiation detecting device according to a twenty first mode of the present invention, in the fifteenth mode, the displacement reading member is a movable electrode portion and includes a fixed electrode portion fixed to the substrate in a way that faces to the movable electrode portion.

In the radiation detecting device according to a twenty second mode of the present invention, in the twenty first mode, the fixed electrode portion is disposed on the opposite side to the substrate with respect to the movable electrode portion.

In the radiation detecting device according to a twenty third mode of the present invention, in the twenty second mode, the movable electrode portion serves as a radiation reflection portion disposed from the radiation absorbing portion at an interval substantially given by $n\lambda_0/4$, where n is an odd-number, and $\lambda_0$ is a central wavelength of a desired wavelength band of the radiation, and substantially totally reflecting the radiation.

The fourteenth through twenty third modes are exemplifications of the radiation detecting device using the thermal displacement element in the first through fourteenth modes.

Note that the components other than the first and second displacement portions are preferably structured to each have a plane portion and an erect-up or erect-down portion formed erecting up or down over at least a part of the peripheral area of the plane portion in the first through twenty third modes. In this case, the plane portion is reinforced by the erect-up or erect-down portion, and the layer thickness can be reduced in a way that ensures a desired strength.

EMBODIMENTS OF THE INVENTION

In the following discussion, there will be explained embodiments where infrared-rays are used for radiation, and reading beam is visible light beam. According to the present invention, however, X-rays, ultraviolet rays and other various rays excluding the infrared-rays may be radiated, and beam other than the visible light beam may be used as the reading beam.

(First Embodiment)

Figure 1:
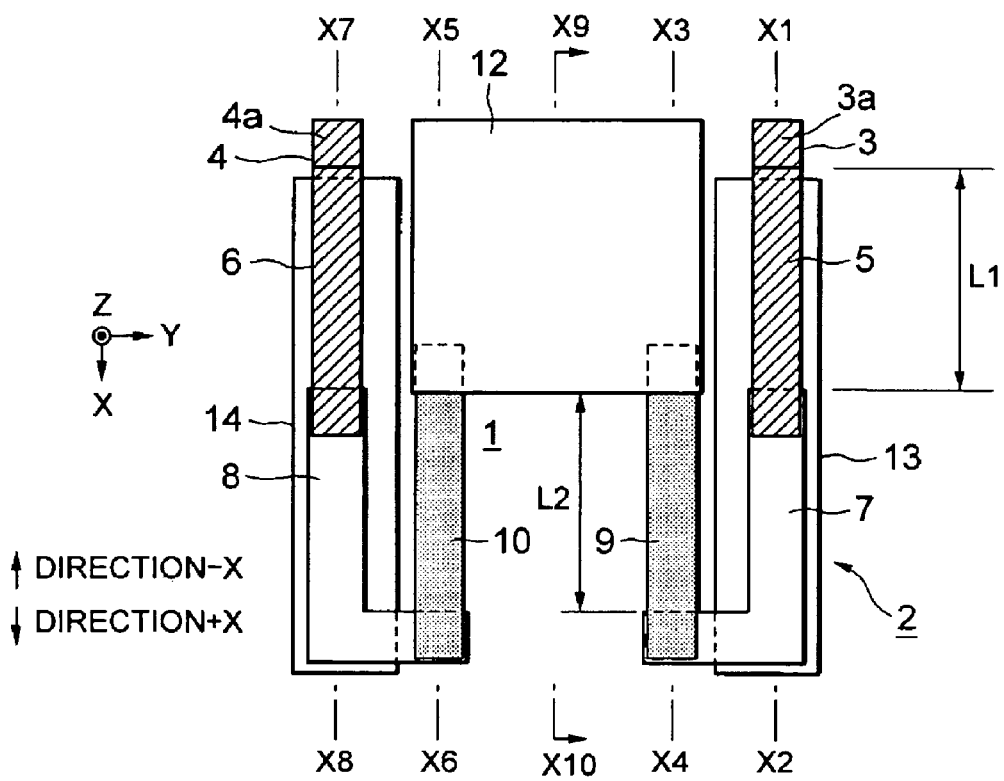
FIG. 1 is a schematic plan view schematically showing a unit pixel of a radiation detecting device in a first embodiment of the present invention.
Figure 2:
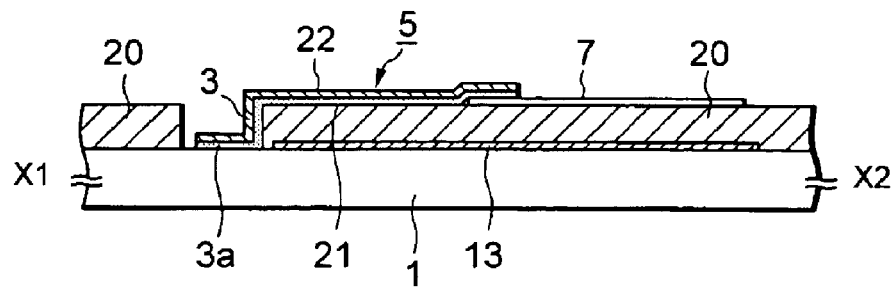
FIG. 2 is a schematic sectional view taken along the line X1–X2 in FIG. 1.
Figure 3:
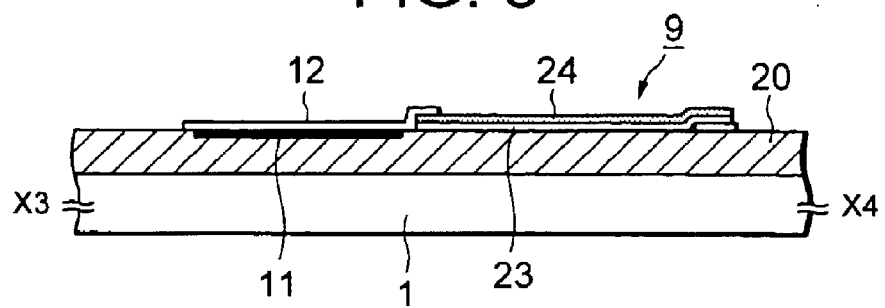
FIG. 3 is a schematic sectional view taken along the line X3–X4 in FIG. 1.

FIG. 1 is a schematic plan view schematically showing a unit pixel (unit element) of a radiation detecting device in a first embodiment of the present invention. FIG. 2 is a schematic sectional view taken along the line X1–X2 in FIG. 1. FIG. 3 is a schematic sectional view taken along the line X3–X4 in FIG. 1. FIGS. 1 through 3, however, show a state before a sacrifice layer 20 is removed in the process of manufacturing the radiation detecting device in this embodiment. This sacrifice layer 20 is illustrated in FIGS. 2 and 3 but is omitted in FIG. 1. Though not shown in the drawings, the schematic sectional view taken along the line X5–X6 in FIG. 1 is substantially the same as FIG. 3, and the schematic sectional view taken along the line X7–X8 in FIG. 1 is substantially the same as FIG. 4. Note that for explanatory convenience, as illustrated in FIG. 1, X-, Y- and Z-axes orthogonal to each other are defined, and a +X direction and a −X direction opposite to each other along the X-axis direction are defined.

Figure 4A:
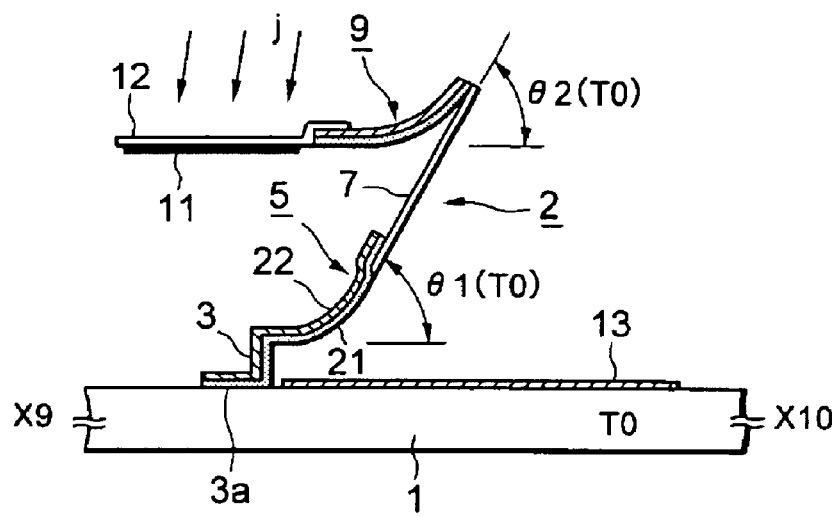
FIGS. 4A, 4B and 4C are schematic sectional views taken along the arrow line X9–X10 in FIG. 1.
Figure 4B:
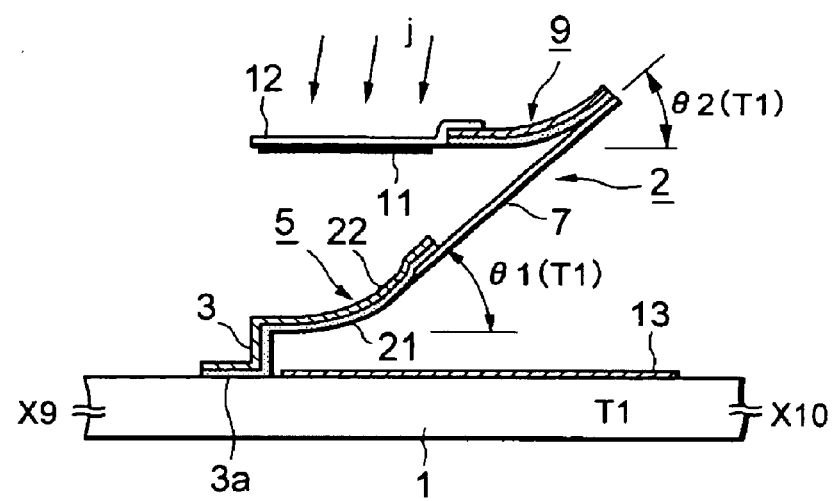
Figure 4C:
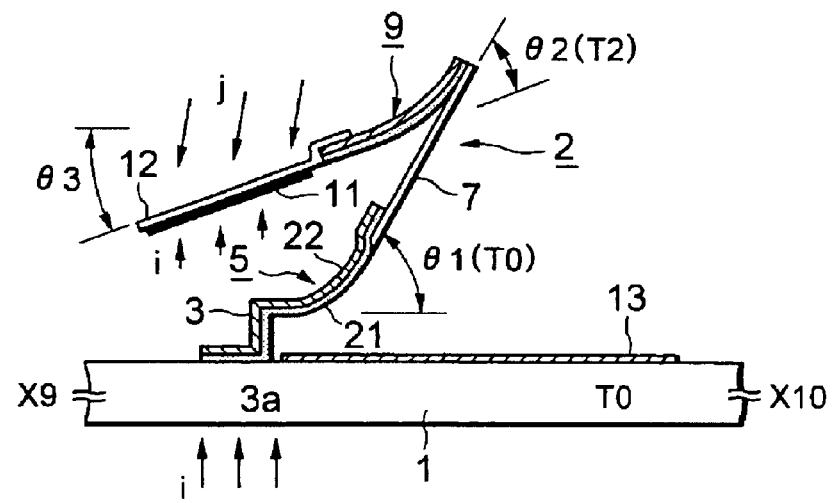

FIGS. 4A–4C are views each schematically showing a state where the radiation detecting device in the present embodiment is completed after removing the sacrifice layer 20, and correspond to views taken along the arrowhead line X9–X10 in FIG. 1. FIG. 4A shows how a temperature of each of a substrate and respective elements comes to T0 when reaching a thermal equilibrium if an ambient temperature is T0 in a state where an infrared-ray I from a target object does not yet enter. FIG. 4B shows how the temperature of each of the substrate and the whole elements comes to T1 when reaching the thermal equilibrium if the ambient temperature is T1 (T1≠T0) in the state where the infrared-ray I from the target object does not yet enter. FIG. 4C illustrates how the infrared-rays i from the target object enter if the ambient temperature and the substrate temperature are T0. Note that for facilitating the understanding, bending degrees of displacement portions are somewhat exaggerated.

The radiation detecting device in the present embodiment includes a substrate 1 (a surface thereof is parallel with an X-Y plane) such as a Si substrate as a base body transmitting the infrared-rays i, a supported member 2 supported on the substrate 1, and a reflection plate 12 that reflects received reading beams j, the reflection plate 12 serving as a displacement reading member used for obtaining predetermined changes corresponding to displacement occurred in second displacement portions 9, 10 of the supported member 2.

According to the present embodiment, the supported member 2 is supported at its two legs 3, 4 erecting in the Z-axis directions (up-and-down directions) on the substrate 1 in a way that makes a large proportion of this supported member 2 afloat above the substrate 1. The supported member 2 has two pieces of first displacement portions 5, 6, two pieces of heat separating portions 7, 8 each exhibiting a high thermal resistance, two pieces of second displacement portions 9, 10 and an infrared-ray absorbing portion 11 that receives the infrared-rays i and converts them into heat.

The radiation detecting device in the present embodiment is configured in symmetry with respect to the right and left in FIG. 1, wherein the leg 4, the first displacement portion 6, the heat separating portion 8 and the second displacement portion 10 correspond to the leg 3, the first displacement portion 5, the heat separating portion 7 and the second displacement portion 9, and therefore explanations of the leg 4, the first displacement portion 6, the heat separating portion 8 and the second displacement portion 10 are omitted. In the present embodiment, two sets of the legs, the first displacement portions, the heat separating portions and the second displacement portions are provided to obtain a stability of a mechanical structure, however, according to the present invention, one or more sets of these components may be enough.

The first displacement portion 5 is constructed of two films (layers) 21, 22 stacked on each other in the Z-axis directions (up-and-down directions), and one side end (proximal end) is connected to the leg 3. Accordingly, the first displacement portion 5 is mechanically continuous to the substrate 1 without through the heat separating portion 7. The first displacement portion 5, at the stage that the sacrifice layer 20 is not yet removed, as shown in FIGS. 2 and 3, extends straight in the x-axis direction in parallel with the substrate 1 without being bent in such a way that the first displacement portion 5 is held by the sacrifice layer 20.

The layers 21, 22 are composed of different materials having expansion coefficients different from each other, and the first displacement portion 5 configures a so-called bi-morph structure (also called bi-material element). Accordingly, after the completion with the sacrifice layer 20 removed, the first displacement portion 5 is, when its temperature rises upon receiving the heat, bent downward corresponding to the temperature if an expansion coefficient of the lower layer 21 is smaller than an expansion coefficient of the upper layer 22 (or an upward bending degree decreases), and bent upward in the opposite case (or a downward bending degree decreases). In this embodiment, the lower layer 21 is composed of a SiN layer while the upper layer 22 is composed of an Al layer (its expansion coefficient is larger than an expansion coefficient of the SiN layer), and the first displacement portion 5 is, when the temperature rises upon receiving the heat, bent downward corresponding to the temperature (or the upward bending degree decreases).

In this embodiment, the SiN layer 21 and the Al layer 22 configuring the first displacement portion 5 extend as they are in continuation, and the leg 3 is thereby formed, wherein a thermal resistance of the leg 3 is very small. Thus, though the small thermal resistance of the leg 3 is preferable, the leg 3 may remain high in its thermal resistance by its being composed of only a material exhibiting, e.g., a high adiabatic property.

The other side end (distal end) of the first displacement portion 5 is connected to one side end of the heat separating portion 7. A direction of the first displacement portion 5 from its proximal end toward its distal end is the +X direction. The heat separating portion 7 is composed of a material exhibiting a high adiabatic property and made of the SiN layer in this embodiment. The heat separating portion 7 is configured in an L-shape extending mainly in the X-direction and thereafter extending somewhat in the Y-axis direction. Note that 3a and 4a in the drawings respectively represent contacts of the legs 3, 4 onto the substrate 1.

One side end (proximal end) of the second displacement portion 9 is connected to the other side end of the heat separating portion 7. The second displacement portion 9 is thereby mechanically continuous to the substrate 1 through the heat separating portion 7 and the first displacement portion 5. The second displacement portion 9, at the stage that the sacrifice layer 20 is not yet removed, as shown in FIGS. 2 and 3, extends straight in the x-axis direction in parallel with the substrate 1 without being bent while held by the sacrifice layer 20. The other side end (distal end) of the second displacement portion 9 is connected to the reflection plate 12. The direction of the second displacement portion 9 from the proximal end toward the distal end is the −X direction. This direction is opposite to the direction of the first displacement portion 5 from the proximal end toward the distal end.

The second displacement portion 9 is, as in the case of the first displacement portion 5, constructed of two films (layers 23, 24 stacked on each other in the Z-axis directions (up-and-down directions), and configures the bi-morph structure (also called the bi-material element). In this embodiment, the two layers 21, 22 of the first displacement portion 5 and the two layers 23, 24 of the second displacement portion 9 are composed of the same materials, and the layers of these materials are stacked in the same sequence. To be specific, the lower layer 23 of the second displacement portion 9 and the lower layer 21 of the first displacement portion 5 are composed of the same SiN layers. The upper layer 24 of the second displacement portion 9 and the upper layer 22 of the first displacement portion 5 are composed of the same Al layers.

In the present embodiment, as shown in FIG. 1, a length L1 of the first displacement portion 5 from the proximal end to the distal end is substantially equal to a length L2 of the second displacement portion 9 from the proximal end to the distal end. Further, thicknesses of the lower layers 21, 23 of the displacement portions 5, 9 are substantially equal to each other. In this embodiment, widths (the widths in the Y-axis direction in FIG. 1) of the displacement portions 5, 9 are equal to each other but do not affect displacement occurrence characteristics of the displacement portions 5, 9 and may therefore be properly set to different values.

Moreover, in this embodiment, the reflection plate 12 is constructed of an Al layer. The infrared-ray absorbing portion 11 is constructed of an infrared-ray absorbing layer of gold black etc, and is formed on the undersurface of reflection plate 12. Accordingly, in this embodiment, the infrared-ray absorbing portion 11 is thermally coupled to the second displacement portion 9 through the reflection plate 12. The infrared-ray absorbing portion 11 is thereby mechanically continuous to the substrate 1 via the heat separating portion 7 and the first displacement portion 5. As a matter of course, instead of forming the infrared-ray absorbing portion 11 on the undersurface of the reflection plate 12, for instance, the layers constituting the second displacement portions 9, 10 may serve as the infrared-ray absorbing portion, or the second displacement portions 9, 10 may also be formed with the infrared-ray absorbing portion of gold black etc as the infrared-ray absorbing portion.

In this embodiment, the infrared rays i enter from under the substrate 1. However, infrared-ray shielding layers 13, 14 composed of Al layers etc are formed as shielding portions for shielding the first displacement portions 5, 6 from the infrared rays i, on the substrate 1 under the first displacement portions 5, 6. Hence, in this embodiment, the SiN layers as the lower layers 21 of the first displacement portions 5, 6 exhibit the infrared-ray absorbing property but do not bring about a decline of a detection sensitivity. As a matter of course, the infrared-ray shielding layers 13, 14 are not necessarily formed. Further, the heat separating portions 7, 8 are composed of the SiN layers having the infrared-ray absorbing property, and therefore the light shielding layers 13, 14 are formed extending downwardly of these portions. However, these portion do not necessarily need shielding from the light.

Moreover, in this embodiment, as shown in FIGS. 1 through 3, when the first and second displacement portions 5, 9 are not in the bent state, the first and second displacement portions 5, 9, the heat separating portion 7, the infrared-ray absorbing portion 11 and the reflection plate 12 are positioned on the same tier higher by one stage than the surface of the substrate 1.

Further, this embodiment gives the structure in which the two layers 21, 22 of the first displacement portion 5 and the two layers 23, 24 of the second displacement portion 9 can be simultaneously formed with respect to every corresponding layer. Namely, the structure is that the lower layer 21 of the first displacement portion 5 and the lower layer 23 of the second displacement portion 9 can be simultaneously formed, and thereafter the upper layer 22 of the first displacement portion 5 and the upper layer 24 of the second displacement portion 9 can be simultaneously formed. That is, according to this embodiment, the displacement portions 5, 9 are disposed not to be overlapped with each other as viewed in the stacking direction (the Z-axis direction) of the layers 21, 22, and there exist neither layers positioned above any one of the lower layers 21, 23 and positioned under the other nor layers positioned above any one of the upper layers 22, 24 and positioned under the other.

Though not illustrated in the drawings, in the radiation detecting device according to this embodiment, the legs 3, 4, the supported member 2, the reflection plate 12 and the infrared-ray shielding layers 13, 14 are grouped as a unit element (pixel), and these pixels are arrayed one-dimensionally or two-dimensionally on the substrate 1. This point is the same with the respective embodiments that follow.

As can be understood from the discussion made above, the substrate 1, the legs 3, 4, the supported member 2, the reflection plate 12 and the infrared-ray shielding layers 13, 14 constitute a thermal displacement element that causes a displacement corresponding to the heat, and the supported member 2 of this thermal displacement element is used singly in every unit pixel.

Herein, one example of a method of manufacturing the radiation detecting device in this embodiment, will be described referring to FIGS. 1 through 3.

To start with, after the Al layers, which are to become the infrared-ray shielding layers 13, 14, have been deposited by a vapor deposition method etc, patterning is effected thereon by a photolithography etching method, thereby configuring the infrared-ray shielding layers 13, 14. Next, a resist serving as the sacrifice layer 20 is coated over the entire surface of the Si substrate 1, and this sacrifice layer 20 is formed with openings corresponding to the contacts 3a, 4a of the legs 3, 4 by the photolithography.

Next, after the SIN layer has been deposited by a P-CVD method etc, the patterning is effected thereon by the photolithography etching method, thereby configuring the heat separating portions 7, 8. Subsequently, after depositing the SiN layers which are to become the lower layers of the legs 3, 4, the lower layers 21 of the first displacement portions 5, 6 and the lower layers 23 of the second displacement portions 9, 10 by the P-CVD method etc, the patterning is effected thereon by the photolithography etching method, thereby obtaining these respective configurations. Herein, as described above, the processing of the SIN layers is carried out twice separately. With this processing, the layer thicknesses of the heat separating portions 7, 8 and the layer thicknesses of other portions (the legs 3, 4, the lower layers 21 of the first displacement portions 5, 6 and the lower layers 23 of the second displacement portions 9, 10), can be set respectively to proper values. The present invention is not, however, limited to this processing, and the layers may be simultaneously integrally processed. With this processing, there is yielded an effect of reducing the number of processes.

Next, after depositing the Al layers that will become the upper layers of the legs 3, 4, the upper layers 22 of the first displacement portions 5, 6 and the upper layers 24 of the second displacement portions 9, 10 by the vapor deposition method etc, the patterning is effected thereon by the photolithography etching method, thereby obtaining the respective configurations. Next, after depositing the gold black layer serving as the infrared-ray absorbing portion 11 by the vapor deposition method etc, the patterning is effected thereon by the photolithography etching method, thereby configuring the infrared-ray absorbing portion 11. Thereafter, the Al layer that is to become the reflection plate 12 is deposited by the vapor deposition method etc, and thereafter the patterning is effected thereon by the photolithography etching method, thereby configuring the reflection plate 12. FIGS. 2 and 3 show this state.

Finally, the substrate in this state is diced into chips by dicing, and the sacrifice layer 20 is removed by the ashing method etc. The radiation detecting device in this embodiment is thereby completed.

Thus, the radiation detecting device in this embodiment is manufactured, and, when removing the sacrifice layer 20, the retention by the sacrifice layer 20 is canceled. Therefore, the first and second displacement portions 5, 9 are initially bent by internal stresses of the respective layers 21 through 24 that are determined by the conditions when forming the layers in the manufacturing process. Now supposing that the ambient temperature (e.g., the predetermined temperature) at this time is T0 and the temperature of each of the substrate 1 and the respective portions of the element comes to T0 upon reaching the thermal equilibrium, the reflection plate 12 becomes parallel to the substrate 1 as shown in FIG. 4A because of the temperatures of the first and second displacement portions 5, 9 being the same temperature T0. The reasons for this will be elucidated as follows.

In this embodiment, as explained above, (a) the first displacement portion 5 and the second displacement portion 9 are opposite to each other in their directions from the proximal ends towards the distal ends; (b) both of them are composed of the double layers, i.e., the Al layers and the SiN layers, and the materials composing the respective layers are the same; (c) upper layers are the Al layers and the lower layers are the SiN layers, and the layers of the respective materials are stacked in the same sequence; (d) the lengths from the proximal ends to the distal ends are the same,; and (e) both of them have the same thicknesses of the corresponding layers. For the reasons (b), (d) and (e), as shown in FIG. 4A, an absolute value of an angle θ1 (corresponding to an angle made by the heat separating portion 7 with respect to the substrate 1) made by the distal end with respect to the proximal end of the first displacement portion 5, is equal to an absolute value of an angle θ2 (corresponding to an angle made by the reflection plate 12 with respect to the heat separating portion 7) made by the distal end with respect to the proximal end of the second displacement portion 9. Then, for the reasons (a) and (c), a relationship between a direction of the angle θ1 and a direction of the angle θ2 is set so that the angle θ1 and the angle θ2 are canceled each other with respect to an angle θ3 (corresponding to an angle made by the reflection plate 12 with respect to the substrate 1, not shown in FIGS. 4A and 4B) made by the distal end of the second displacement portion 9 with respect to the substrate 1. Namely, θ3=θ2−θ1. Accordingly, as illustrated in FIG. 4A, the reflection plate 12 is in parallel with the substrate 1.

Thus, according to this embodiment, though the initial flexures occur in the first and second displacement portions 5, 9, the distal end of the second displacement portion 9 can be made parallel to the substrate 1, and more essentially the reflection plate 12 can be made parallel to the substrate 1.

Next, as shown in FIG. 4B, it is considered that the ambient temperature changes from T0 to T1. When the temperature of each of the substrate 1 and the whole element comes to T1 upon reaching the thermal equilibrium, the temperatures of the first and second displacement portions 5, 9 also come to T1. Accordingly, as shown in FIG. 4B, the angles θ1, θ2 change as compared with the case in FIG. 4A. Even in this case, however, for the reasons (b), (d) and (e), the angle θ1 is equalized to the angle θ2. Hence, the reflection plate 12 remains parallel with the substrate 1. Namely, the distal end of the second displacement portion 9 and the reflection plate 12 remain parallel with the substrate simply with the change in the ambient temperature (or the temperature of the substrate).

On the other hand, there is considered from the state in FIG. 4A a case where the element is irradiated with the infrared-rays i from the target object as shown in FIG. 4C. When the undersurface of the substrate 1 is irradiated with the infrared-rays i, the infrared-rays i penetrates the substrate 1 and is absorbed by the infrared-ray absorbing portion and converted into the heat. The heat separating portion 7 controls a flow of the heat, and therefore the heat is transferred to the second displacement portion 9, with the result that the temperature of the second displacement portion 9 rises up to, e.g., a temperature T2 corresponding to a quantity of the incident infrared-rays. Further, a quantity of the heat generated at the infrared-ray absorbing portion 11 and flowing into the first displacement portion 5, is proximately equal to a quantity of the heat flowing to the substrate 1 from the first displacement portion 5, so that the temperature of the first displacement portion 5 does not substantially increase. Further, the infrared-rays i are shielded by the infrared-ray shielding layer 11 and do not reach the first displacement portion 5. Hence, the first displacement portion 5 does not rise in temperature but stays at the temperature T0.

In this state, there occurs a difference in temperature between the first and second displacement portions 5, 9, and therefore the angles θ1, θ2 have values different from each other. Hence, as shown in FIG. 4C, the angle θ3 made by the distal end of the second displacement portion 9 with respect to the substrate 1, i.e., the angle θ3 of the reflection plate 12 with respect to the substrate 1 is not 0 degree, and the reflection plate 12 is inclined to the substrate 1. The temperature T2 of the second displacement portion 9 depends on the quantity of the incident infrared-rays, while the angle θ3 depends on the temperature T2 of the second displacement portion 9. Accordingly, the angle θ3 is what reflects the quantity of the incident infrared-rays, and the quantity of the incident infrared-rays can be detected as the inclined angle θ3 of the reflection plate 12.

By the way, if it is assumed that the lower layer 21 of the first displacement portion 5 and the lower layer 23 of the second displacement portion 9 be manufactured in separate manufacturing processes, and that the upper layer 22 of the first displacement portion 5 and the upper layer 24 of the second displacement portion 9 be manufactured in separate manufacturing processes, it is in fact difficult to completely equalize the layer forming conditions etc, and hence differences in layer characteristics (the internal stress when forming the layer and the layer thickness) between the two become comparatively large. Accordingly, the first displacement portion 5 and the second displacement portion 9 come to have different degrees of the initial flexures and different degrees of flexures due to a change in the ambient temperature. As a result, the reflection plate 12 is, though slight, inclined to the substrate 1 in the states as shown in FIGS. 4A and 4B.

In this point, the present embodiment has, as described above, such a structure that the layers of the first and second displacement portions 5, 9 can be simultaneously formed with respect to every corresponding layer. Then, there is almost no difference in the layer characteristics between the two by forming these layers at the same time, and it is feasible to completely restrain the inclination of the reflection plate 12 to the substrate from occurring in the states as shown in FIGS. 4A and 4B, which is conceived preferable. As a matter of course, according to the present invention, the layers of the first displacement portion 5 and of the second displacement portion 9 may be formed in separate manufacturing processes.

Figure 5:
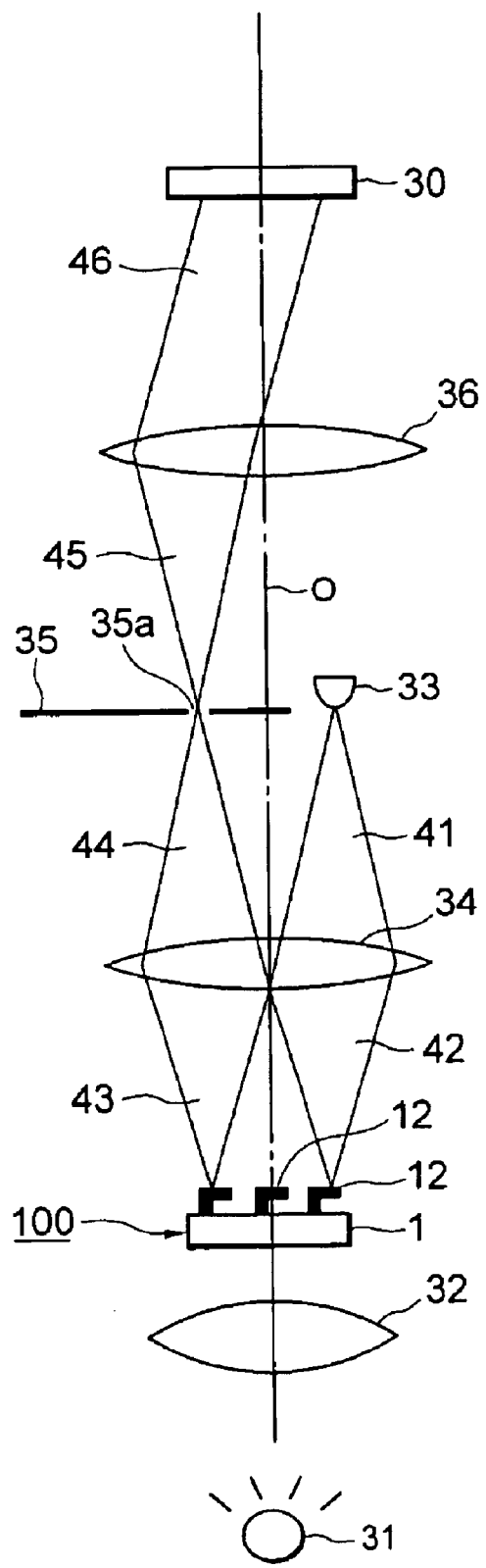
FIG. 5 is a view schematically showing a configuration of a visualizing apparatus.

Herein, one example of a visualizing apparatus using the radiation detecting device in this embodiment, will be explained with reference to FIG. 5. FIG. 5 is a diagram schematically showing a configuration of this visualizing apparatus. Referring to FIG. 5, the radiation detecting device in this embodiment is marked with a numeral 100.

This visualizing apparatus is constructed of, in addition to the radiation detecting device 100, a two-dimensional CCD 30 serving as a reading optical system and an imaging means, and a designed-for-the-infrared-ray image forming lens 32 for forming an infrared-ray image of a heat source 31 on a surface where the infrared-ray absorbing portions 11 of the radiation detecting device 100 are distributed by converging the infrared-rays i emitted from the heat source 31 as an observation target (target object).

In this visualizing apparatus, the reading optical system is constructed of an LD (Laser Diode) 33 as a reading light supplying means for supplying the reading beams, a first lens system 34 for leading a reading beam from the LD 33 to the reflection plates 12 of all the pixels of the radiation detecting device 100, a beam flux restriction member 35 that transmits selectively only desired beams among the reading beams reflected by the reflection plates of all the pixels after penetrating the first lens system 34, and a second lens system 36 for forming conjugate positions to the reflection plates 12 of the respective pixels in cooperation with the first lens system 34, and leading the beams penetrating the beam flux restriction member 35 to the conjugate positions. Light receiving surface of the CCD 30 is disposed in the conjugate position, and the reflection plates 12 of all the pixels and the plurality of light receiving elements of the CCD 30 are in an optically conjugate relationship through the lens systems 34, 36.

The LD 33 is disposed on one side (the right side in FIG. 5) with respect to an optical axis O of the first lens system 34, and supplies the reading beam so that the reading beam travel through an area on one side. In this example, the LD 33 is disposed in the vicinity of a focal surface of the first lens system 34 on the side of the second lens system 36, and irradiates the reflection plates 12 of all the pixels with substantially parallel beams into which the reading beams are collimated through the first lens 34. A reading beam stop may be provided in front of the LD 33 in order to enhance a contrast of the optical image on the CCD 30. In this example, the radiation detecting device 100 is disposed so that the surface (parallel with the surface of the layer 12 as the reflecting portion if the infrared-rays are not incident in this example) of the substrate 1 thereof is orthogonal to the optical axis O. As a matter of course, there is no limitation to this layout.

The beam flux restriction member 35 is configured so that a portion selectively transmitting only the desired beams is disposed in an area on the other side (the left side in FIG. 5) with respect to the optical axis O of the first lens system 34. In this example, the beam flux restriction member 35 is configured as an aperture stop constructed of a light shielding plate having an aperture 35a. In this example, if the infrared-rays from the heat source 31 are incident upon none of the infrared-ray absorbing portions 11 of the pixels and if the reflection plates 12 of all the pixels are parallel with the substrate 1, the beam flux restriction member 35 is disposed so that a position of a converging point at which the first lens system 34 converges the flux of beams (the flux of individual beams reflected by the respective reflection plates 12) reflected by the reflection plates of all the pixels, is substantially coincident with a position of the aperture 35a. Further, a size of the aperture 35a is set so as to substantially coincident with a size of section of this beam flux at this converging point. As a matter of course, there is no limitation to the layout or the size described above.

According to the visualizing apparatus illustrated in FIG. 5, a reading beam flux 41 emitted from the LD 33 enters the first lens system 34 and becomes a substantially collimated beam flux 42. Next, the substantially collimated beam flux 42 is incident at a given angle to the normal line of the substrate 1 upon the reflection plates 12 of all the pixels of the radiation detecting device 100.

On the other hand, the image forming lens 32 converges the infrared-rays from the heat source 31, whereby the infrared-ray image of the heat source 31 is formed on the surface where the infrared-ray absorbing portions 11 of the radiation detecting device are distributed. The infrared-rays are thereby incident upon the infrared-ray absorbing portions 11 of the respective pixels of the radiation detecting device 100. These incident infrared-rays are converted into inclinations of the reflection plates of the respective pixels.

It is now assumed that the infrared-rays from the heat source 31 do not enter the infrared-ray absorbing portions 11 of all the pixels and that the reflection plates 12 of all the pixels are parallel with the substrate 1. The beam flux 42 entering the reflection plates 12 of all the pixels is reflected by these reflection plates 12 into a beam flux 43. The beam flux 43 again enters the first lens system 34 from the side opposite to the side of the LD 33 this time and becomes a converged beam flux 44. The converged beam flux 44 converges at the aperture 35a of the beam flux restriction member 35 disposed in the position of the converging point of this converged beam flux 44. As a result, the converged beam flux 44 travels through the aperture 35a and becomes a divergent beam flux 45. The divergent beam flux 45 enters the second lens system 36. The divergent beam flux 45 entering the second lens system 36 is collimated by the second lens system 36 into, e.g., a substantially collimated beam flux 46. The collimated beam flux 46 enter the light receiving surfaces of the CCD 30. Herein, the reflection plates 12 of the respective pixels and the light receiving surfaces of the CCD 30 are in the conjugate relationship through the lens systems 34, 36, and therefore images of the reflection plates 12 are formed in corresponding positions on the light receiving surfaces of the CCD 30, whereby an optical image as a distribution image of the reflection plates 12 of all the pixels is formed on the whole.

It is now presumed that a certain quantity of infrared-rays from the heat source 32 be incident upon the displacement portion of a certain pixel and that the reflection plate 12 of this pixel be inclined by a quantity corresponding to this incident quantity to the surface of the substrate 1. Of the beam flux 42, the individual beam entering this reflection plate 12 is reflected by the reflection plate 12 in a direction different corresponding to that inclined quantity and therefore converges at a position deviating by a quantity corresponding to this inclined quantity from the position of the converging point (i.e., the aperture 35a), with the result that the thus converged beam is shielded with a quantity corresponding to this inclined quantity by the beam flux restriction member 35. Accordingly, a light quantity of the image of that reflection plate 12 with respect to the optical image as a whole formed on the CCD 30 decreases by a quantity corresponding to the inclined quantity of the reflection plate 12.

Accordingly, the optical image formed by the reading beams on the light receiving surfaces of the CCD 30 is what reflects the infrared-ray image incident upon the radiation detecting device 100. This optical image is captured by the CCD 30. Note that the optical image may be observed by naked eyes by use of a eyepiece etc without using the CCD 30.

It is to be noted that the layout of the reading optical system is not, as a matter of course, limited to the layout described above.

What has been discussed above is the example of the visualizing apparatus, however, referring to FIG. 5, if a radiation detecting device including only the single pixel (element) is used as the radiation detecting device 100 and if a photo detector having only the single light receiving portion is used as a substitute for the two-dimensional CCD 30, a detection device can be constructed as a so-called point sensor for the infrared-rays. This point is the same with respective embodiments that will be discussed later on.

By the way, the visualizing apparatus shown in FIG. 5 involves the use of the radiation detecting device in this embodiment and therefore acquires, e.g., the following advantages.

Namely, each of the reflection plates 12 is not initially inclined to the substrate 1, and hence an alignment etc of the reading optical system described above is facilitated. Further, the reflection plate 12 of each pixel is not initially inclined to the substrate, and the respective reflection plates 12 can be initially positioned within the same plane. Therefore, the reading optical system does not need to have a depth of field that is large, and it does not happen that the image obtained by the CCD 30 appears to be an image as the original image that is viewed obliquely.

Moreover, even when the ambient temperature changes, each of the reflection plates 12 is not inclined, and it is therefore possible to detect the infrared-rays i from the target object with a high accuracy without being affected by the ambient temperature. Accordingly, even in the case of controlling the temperature of the substrate in order not to be affected by the ambient temperature, the strict temperature control is not required, and the costs can be reduced.

As a matter of course, when using the radiation detecting device in this embodiment, the influence of the change in the ambient temperature may be prevented by encasing the radiation detecting device in a vacuum container or strictly controlling the temperature of the substrate.

(Second Embodiment)

Figure 6:
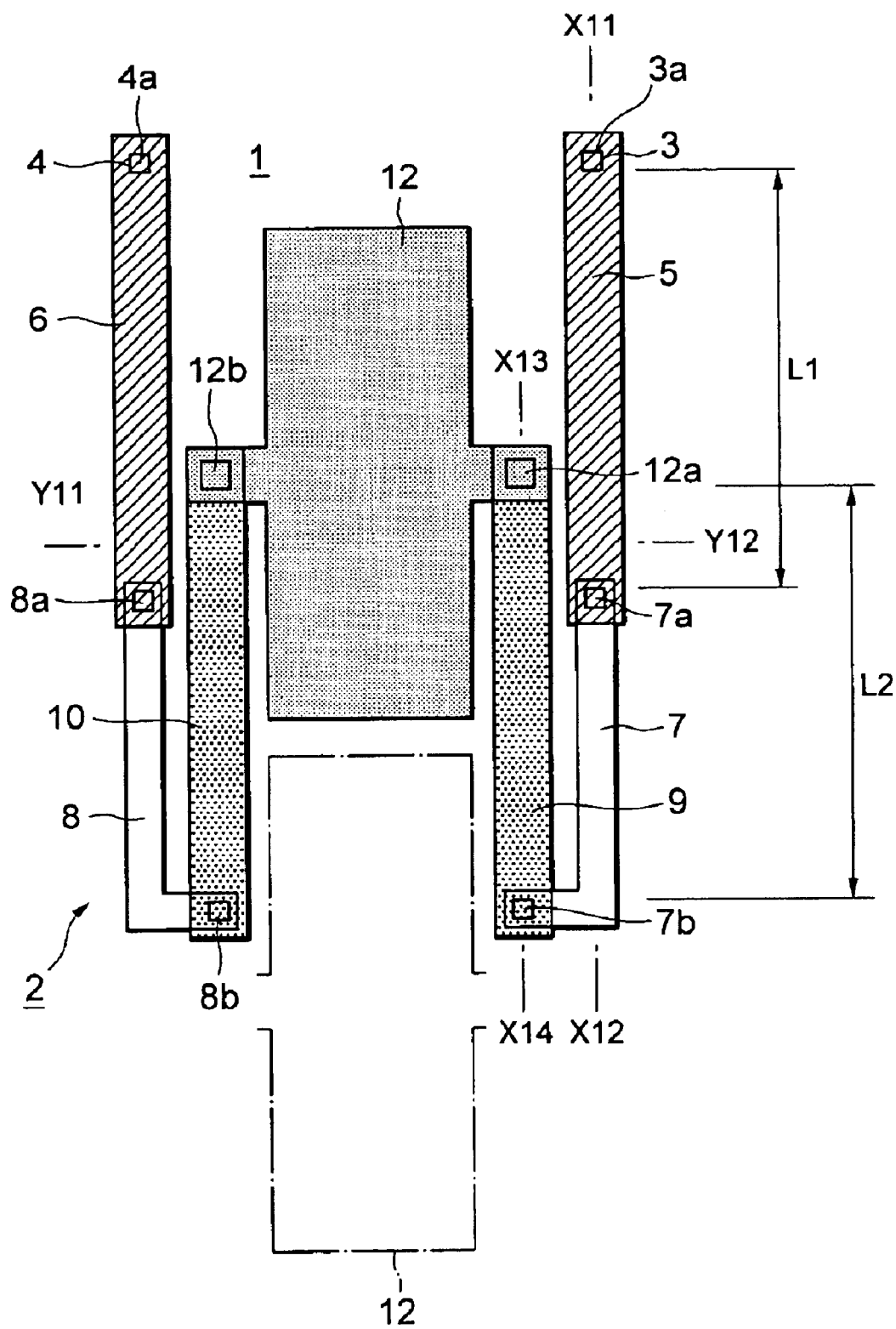
FIG. 6 is a schematic plan view schematically showing a unit pixel of a radiation detecting device in a second embodiment of the present invention.
Figure 7:
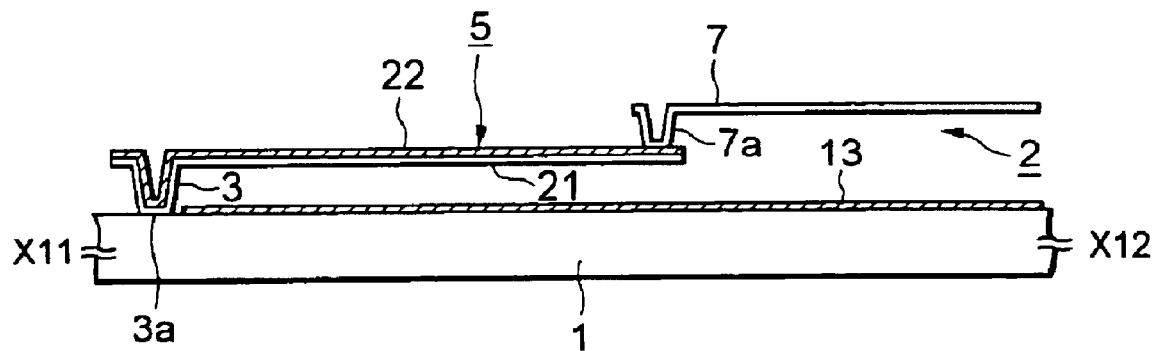
FIG. 7 is a schematic sectional view taken along the line X11–X12 in FIG. 6.
Figure 8:
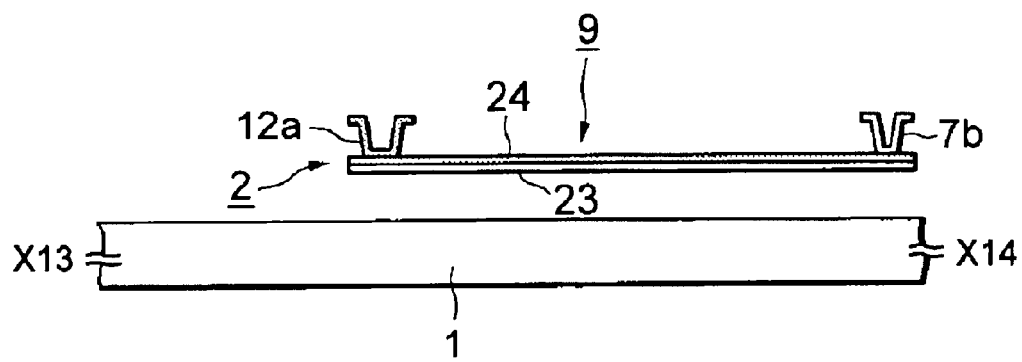
FIG. 8 is a schematic sectional view taken along the line X13–X14 in FIG. 6.
Figure 9:
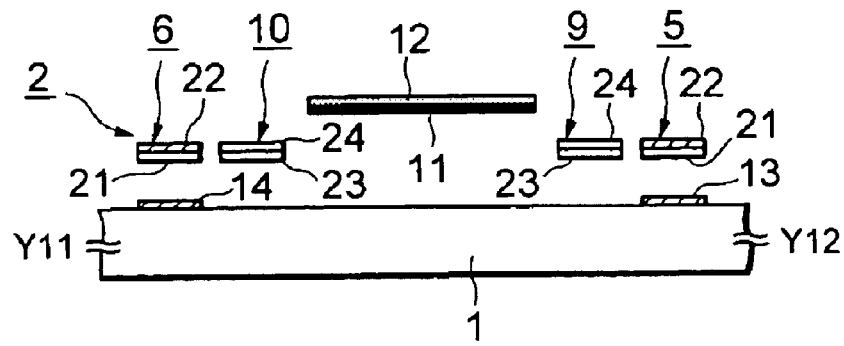
FIG. 9 is a schematic sectional views taken along the line Y11–Y12 in FIG. 6.

FIG. 6 is a schematic plan view schematically showing the unit pixel of the radiation detecting device in a second embodiment of the present invention. FIG. 7 is a schematic sectional view taken along the line X11–X12 in FIG. 6. FIG. 8 is a schematic sectional view taken along the line X13–X14 in FIG. 6. FIG. 9 is a schematic sectional view taken along the line Y11–Y12 in FIG. 6. Referring to FIGS. 6 through 9, the elements that are the same as or correspond to the elements in FIGS. 1 through 4A–4C are marked with the same numerals, and the repetitive explanations thereof are omitted.

FIGS. 6 through 9 each shows a state before removing the sacrifice layer (unillustrated) in the process of manufacturing the radiation detecting device in this embodiment. Accordingly, in FIGS. 6 through 9, the first and second displacement portions 5, 6, 9, 10 are held by the sacrifice layer and not bent. Though not illustrated in the drawings, when the radiation detecting device in this embodiment is completed by removing the sacrifice layer, as in the first embodiment, the first and second displacement portions 5, 6, 9, 10 are bent.

Note that for clarifying a layout of an adjacent pixel, the reflection plate 12 of this adjacent pixel is depicted by an imaginary line in FIG. 6. Referring again to FIG. 6, the infrared-ray shielding portions 13, 14 are omitted.

A different point of this embodiment from the first embodiment is such a layout that when the first and second displacement portions 5, 6, 9, 10 are, as illustrated in FIGS. 6 through 9, set in an unbent state, the heat separating portions 7, 8, the reflection plate 12 and the infrared-ray absorbing portion 11 are positioned on a tier much higher by one stage than the tier on which the first and second displacement portions 5, 6, 9, 10 are positioned.

Referring to FIGS. 6 through 9, 7a, 7b, 8a, 8b represent connection portions connected to the heat separating portions 7, 8 and the first and second displacement portions 5, 6, 9, 10, and these connection portions are what the SiN layers composing the heat separating portions 7, 8 continuously extend as they are. Further, referring to FIGS. 6 through 9, 12a, 12b designate connection portions for connecting the reflection plate 12 to the second displacement portions 9, 10 respectively, and these connection portions are what the Al layer composing the reflection plate continuously extends as it is.

The radiation detecting device in this embodiment can be also manufactured, as in the case of the radiation detecting device in the first embodiment, by utilizing the semiconductor manufacturing technology such as forming the layers, patterning, and forming and removing the sacrifice layer. This point is the same with the embodiments which will be explained later on.

According to this embodiment, the same advantages as those in the first embodiment are obtained. Besides, the heat separating portions 7, the reflection plate 12 and the infrared-ray absorbing portion 11 are positioned on the tier higher than the tier on which the first and second displacement portions 5, 6, 9, 10 are positioned, and therefore the first displacement portions 5, 6 of the adjacent pixel can be respectively so disposed as to be stacked under the heat separating portions 7, 8 of the pixel concerned. Accordingly, a density in the vertical direction in FIG. 6 can be increased. Further, along with this, the reflection plate 12 of the adjacent pixel can be disposed in close proximity, and hence an aperture ratio can be enhanced.

(Third Embodiment)

Figure 10:
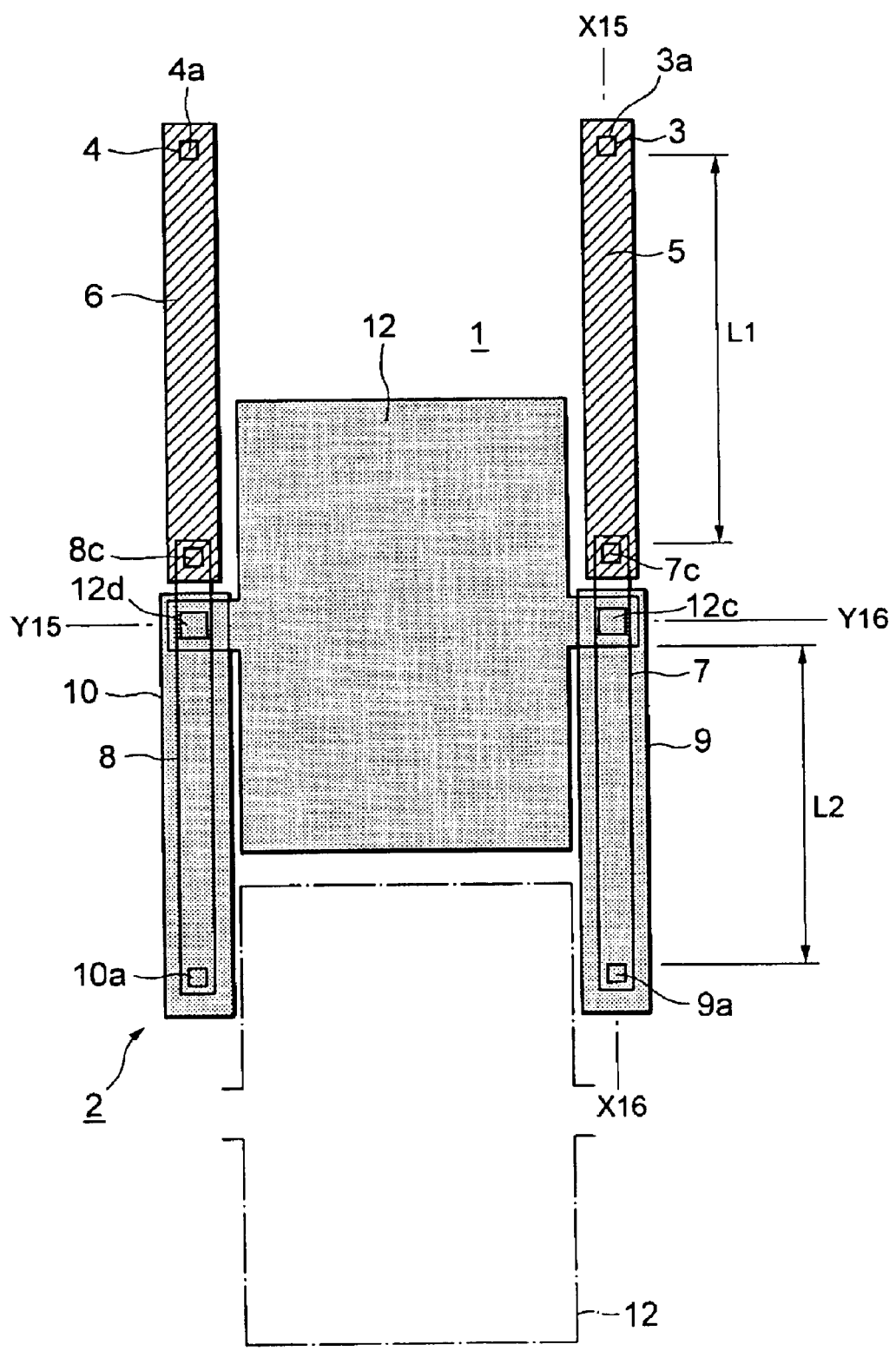
FIG. 10 is a schematic plan view schematically showing a unit pixel of a radiation detecting device in a third embodiment of the present invention.
Figure 11:
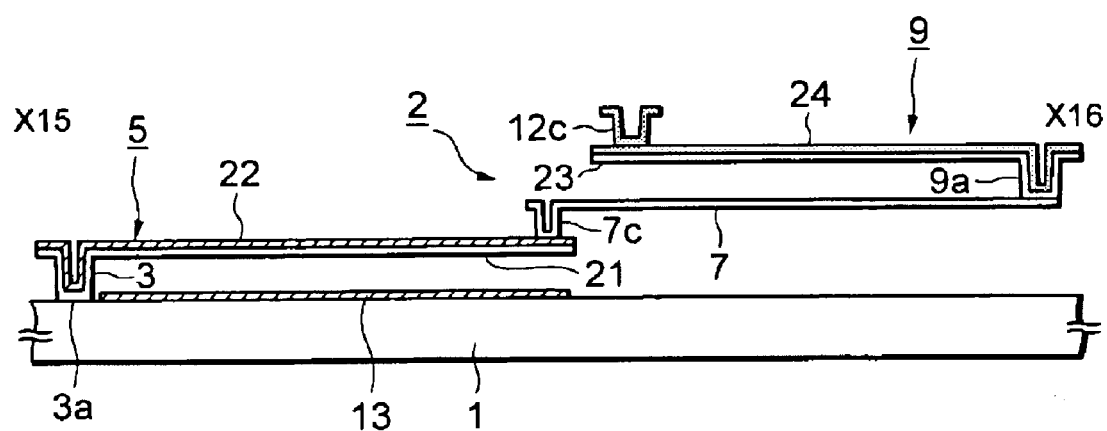
FIG. 11 is a schematic sectional view taken along the line X15–X16 in FIG. 10.
Figure 12:
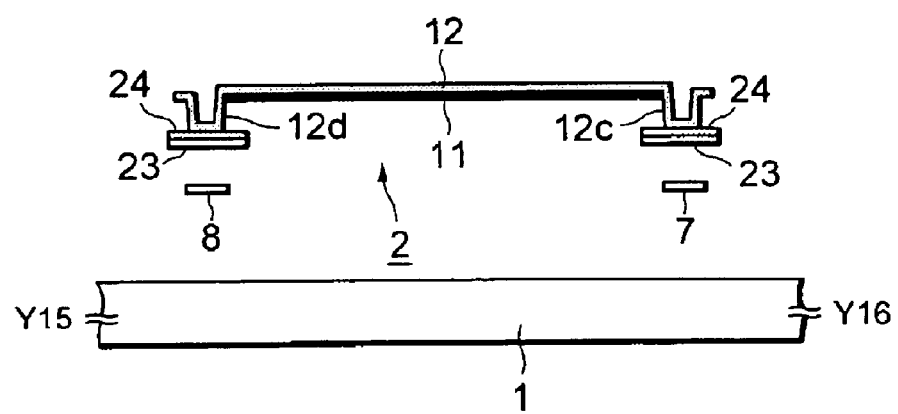
FIG. 12 is a schematic sectional view taken along the line Y15–Y16 in FIG. 10.

FIG. 10 is a schematic plan view schematically showing the unit pixel of the radiation detecting device in a third embodiment of the present invention. FIG. 11 is a schematic sectional view taken along the line X15–X16 in FIG. 10. FIG. 12 is a schematic sectional view taken along the line Y15–Y16 in FIG. 10. Referring to FIGS. 10 through 12, the elements that are the same as or correspond to the elements in FIGS. 1 through 4A–4C are marked with the same numerals, and the repetitive explanations thereof are omitted.

FIGS. 10 through 12 each shows a state before removing the sacrifice layer (unillustrated) in the process of manufacturing the radiation detecting device in this embodiment. Accordingly, in FIGS. 10 through 12, the first and second displacement portions 5, 6, 9, 10 are held by the sacrifice layer and not bent. Though not illustrated in the drawings, when the radiation detecting device in this embodiment is completed by removing the sacrifice layer, as in the first embodiment, the first and second displacement portions 5, 6, 9, 10 are bent.

Note that for clarifying a layout of an adjacent pixel, the reflection plate 12 of this adjacent pixel is depicted by an imaginary line in FIG. 10. Referring again to FIG. 10, the infrared-ray shielding portions 13, 14 are omitted.

A different point of this embodiment from the first embodiment is as follows. As shown in FIGS. 10 through 12, the heat separating portions 7, 8 are configured not in the L-shape but in a rectilinear shape. Further, when the first and second displacement portions 5, 6, 9, 10 are set in an unbent state, the heat separating portions 7, 8 are positioned on a tier higher by one stage than the tier on which the first and second displacement portions 5, 6, 9, 10 are positioned, and the second displacement portions 9, 10 are so positioned on a tier much higher by one stage than the heat separating portions 7, 8 as to be stacked respectively on the heat separating portions 7, 8.

Referring to FIGS. 10 through 12, 7c, 8c represent connection portions for respectively connecting the heat separating portions 7, 8 to the first displacement portions 5, 6, 9a, 10a designate connection portions for respectively connecting the second displacement portions to the heat separating portions 7, 8; and 12c, 12d represent connection portions for respectively connecting the reflection plate 12 to the second displacement portions 9, 10.

According to this embodiment, the same advantages as those in the first embodiment are obtained. Besides, with the above-mentioned layout adopted, the first displacement portions 5, 6 of the adjacent pixel can be so disposed as to be stacked under the heat separating portions 7, 8. Accordingly the density in the vertical direction in FIG. 10 can be increased. Further, along with this, the reflection plate 12 of the adjacent pixel can be disposed in close proximity, and hence the aperture ratio can be enhanced. As can be understood by comparing FIG. 10 with FIG. 6, according to this embodiment, the areas of the reflection plate 12 and of the infrared-ray absorbing portion 11 can be made larger without increasing the occupied area of the pixel than in the second embodiment, and the aperture ratio can also be more enhanced than in the second embodiment.

In this embodiment, however, as shown in FIG. 11, the heat separating portions 7, 8 are positioned between the first displacement portions 5, 6 and the second displacement portions 9, 10, and therefore two layers 21, 22 of the first displacement portion 5 and two layers 23, 24 of the second displacement portions 9, 10 can not be simultaneously formed respectively with respect to every corresponding layer.

(Fourth Embodiment)

Figure 13:
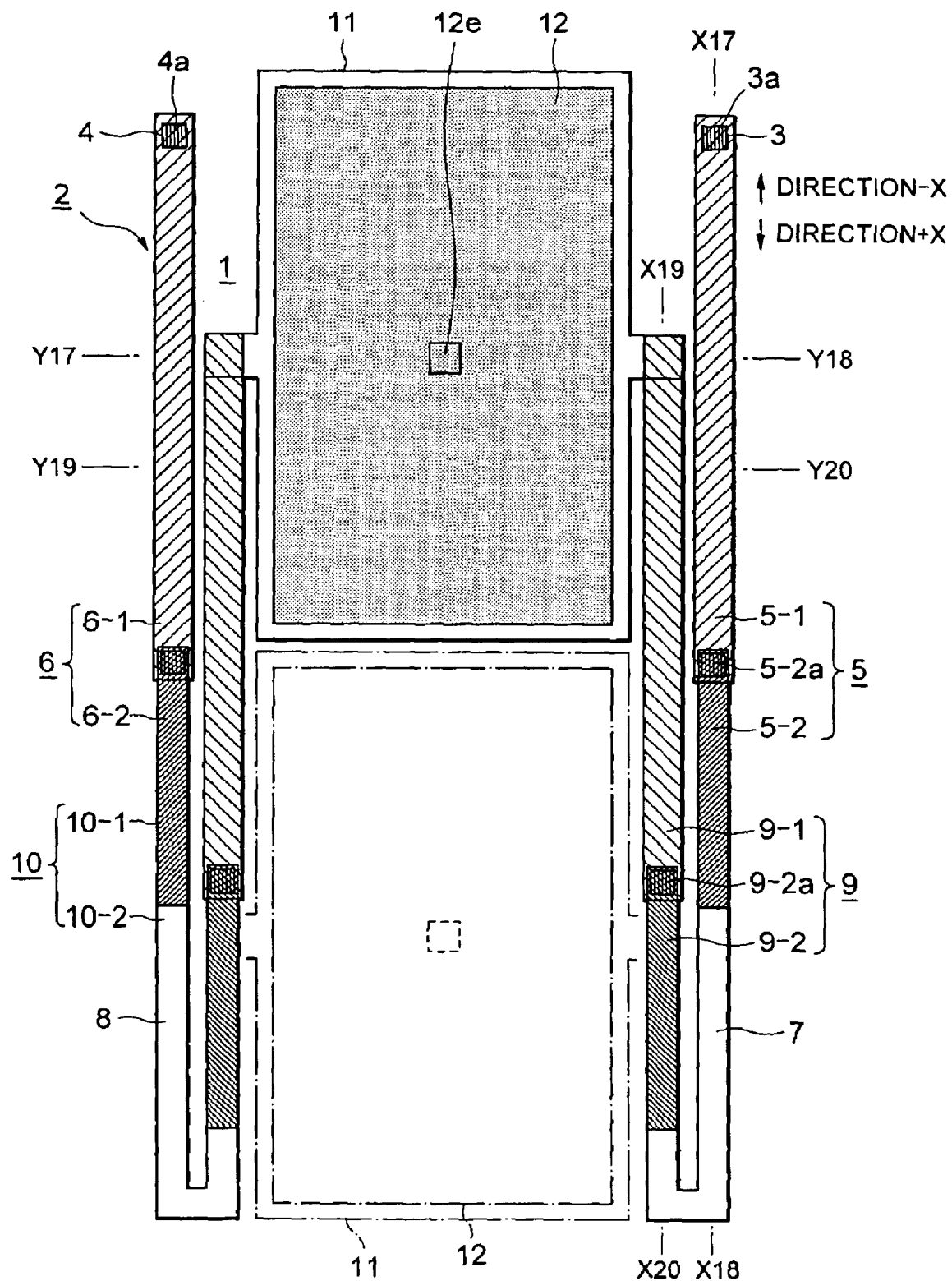
FIG. 13 is a schematic plan view schematically showing a unit pixel of a radiation detecting device in a fourth embodiment of the present invention.
Figure 14:
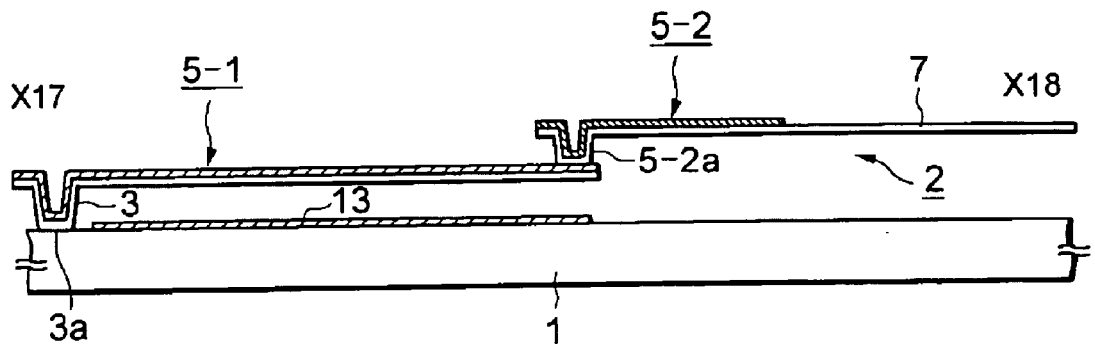
FIG. 14 is a schematic sectional view taken along the line X17–X18 in FIG. 13.
Figure 15:
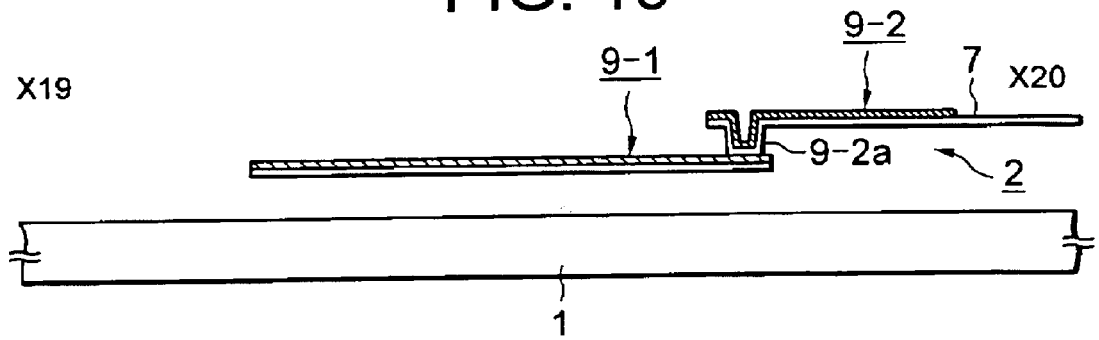
FIG. 15 is a schematic sectional view taken along the line X19–X20 in FIG. 13.
Figure 16:
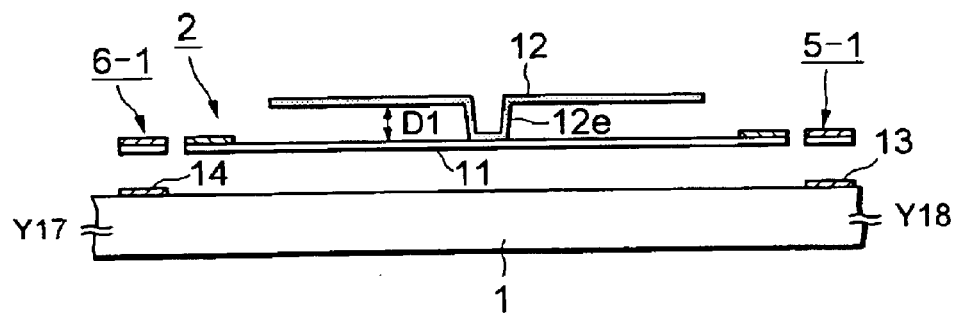
FIG. 16 is a schematic sectional view taken along the line Y17–Y18 in FIG. 13.
Figure 17:
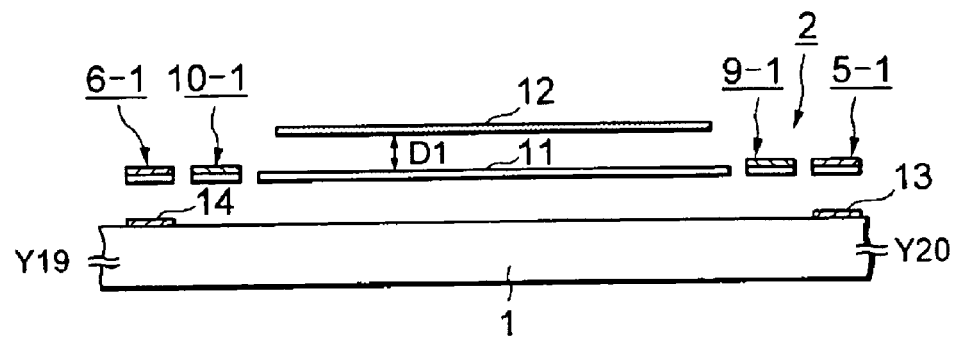
FIG. 17 is a schematic sectional view taken along the line Y19–Y20 in FIG. 13.

FIG. 13 is a schematic plan view schematically showing the unit pixel of the radiation detecting device in a fourth embodiment of the present invention. FIG. 14 is a schematic sectional view taken along the line X17–X18 in FIG. 13. FIG. 15 is a schematic sectional view taken along the line X19–X20 in FIG. 13. FIG. 16 is a schematic sectional view taken along the line Y17–Y18 in FIG. 13. FIG. 17 is a schematic sectional view taken along the line Y19–Y20 in FIG. 13. Referring to FIGS. 13 through 17, the elements that are the same as or correspond to the elements in FIGS. 1 through 4A–4C are marked with the same numerals, and the repetitive explanations thereof are omitted.

FIGS. 13 through 17 each show a state before removing the sacrifice layer (unillustrated) in the process of manufacturing the radiation detecting device in this embodiment. Accordingly, in FIGS. 13 through 17, the first and second displacement portions 5, 6, 9, 10 are held by the sacrifice layer and not bent. Though not illustrated in the drawings, when the radiation detecting device in this embodiment is completed by removing the sacrifice layer, as in the first embodiment, the first and second displacement portions 5, 6, 9, 10 are bent.

Note that for clarifying a layout of an adjacent pixel, the reflection plate 12 and the infrared-ray absorbing portion 11 of this adjacent pixel are depicted by imaginary lines in FIG. 13. Referring again to FIG. 13, the infrared-ray shielding portions 13, 14 are omitted.

Differences of this embodiment from the first embodiment are a point that an optical cavity structure is adopted as an infrared-ray-absorbing structure, a point that the first and second displacement portions 5, 6, 9, 10 are constructed respectively of a plurality of individual displacement portions, and a point that positions of tiers thereof are different. These points will be explained as follows.

The infrared-ray absorbing portion 11 is composed of not a layer of gold black etc but a SiN layer having a predetermined thickness and exhibiting a characteristic that reflects some of the infrared-rays i. An infrared-ray reflectance of the infrared-ray absorbing portion is preferably about 33%. The infrared-ray absorbing portion 11 is disposed so that an interval D1 between the infrared-ray absorbing portion 11 and the reflection plate 12 is given substantially by $n\lambda_0/4$, where n is an odd-number, and $\lambda_0$ is a central wavelength of a desired wavelength band of the infrared-ray i. For example, $\lambda_0$ may be set to 10 μm, n is 1, and the interval d1 may be set to approximately 2.5 μm. In this embodiment, the reflection plate 12 reflecting the reading beam j also serves as an infrared-ray reflecting portion that substantially totally reflects the infrared rays i, and the infrared-ray absorbing portion 11 and the reflection plate 12 configure the optical cavity structure. As a matter of course, this type of infrared-ray reflecting portion may be formed separately from the reflection plate 12.

The reflection plate 12 is fixed to the infrared-ray absorbing portion 11 through a connection portion 12e. The connection portion 12e is what the Al layer composing the reflection plate 12 extends continuously as it is.

The first displacement portion 5 is constructed of two pieces of individual displacement portions 5-1, 5-2 mechanically connected in sequence in the +X direction from its proximal end to its distal end. The second displacement portion 9 is constructed of two pieces of individual displacement portions 9-2, 9-1 mechanically connected in sequence in the −X direction from its proximal end to its distal end. The first displacement portion 6 is constructed of two pieces of individual displacement portions 10-2, 10-1 mechanically connected in sequence in the −X direction from its proximal end to its distal end.

This embodiment also gives the symmetrical configuration with respect to the right and left in FIG. 1, and hence only the first and second displacement portions 5, 9 will be herein explained. All the individual displacement portions 5-1, 5-2, 9-1, 9-2 are composed of lower SiN layers and upper Al layers that are stacked on each other. When the first and second displacement portions 5, 9 are in the unbent state, the heat separating portion 7 and the individual displacement portions 5-2, 9-2 are so disposed as to be positioned on a tier higher by one stage than the individual displacement portions 5-1, 9-1. A length of the individual displacement portion 5-1 from its proximal end to its distal end is substantially equal to a length of the individual displacement portion 9-1 from the proximal end to the distal end. A length of the individual displacement portion 5-2 from its proximal end to its distal end is substantially equal to a length of the individual displacement portion 9-2 from the proximal end to the distal end.

The lower SiN layer composing the individual displacement portion 9-1 and the SiN layer composing the infrared-ray absorbing portion 11, are formed in a way that one single SiN layer extends continuously. The lower SiN layers of the individual displacement portions 5-2, 9-2 and the heat separating portion 7 are formed in a way that one single SiN layer extends continuously. Referring to FIGS. 13 through 17, 5-2a represents a connection portion for connecting the individual displacement portion 5-2 to the individual displacement portion 5-1, and 9-2a represents a connection portion for connecting the individual displacement portion 9-2 to the individual displacement portion 9-1.

Note that this embodiment also has, as in the first embodiment, the structure in which the two layers of the individual displacement portions 5-1, 5-2 of the first displacement portion 5 and the two layers of the individual displacement portions 9-1, 9-2 of the second displacement portion 9, are formed simultaneously with respect to every corresponding layer, and it is therefore preferable that these layers be formed at the same time when manufacturing.

According to this embodiment, the same advantages as those in the first embodiment are obtained. Besides, the optical cavity structure is adopted, so that the radiation absorbing rate of the infrared-ray absorbing portion 11 increases. Accordingly, even when a thermal capacity is reduced by decreasing the thickness of the infrared-ray absorbing portion 11, the infrared-ray absorbing rate can be increased. As a result, both of a detection sensitivity and a detection response can be enhanced.

Moreover, according to this embodiment, as explained above, the displacement portions 5, 6, 9, 10 have the plurality of individual displacement portions, and the heat separating portions 7, 8 and the individual displacement portions 5-2, 6-2, 9-2, 10-2 are so disposed as to be positioned on the tier higher by one stage than the individual displacement portions 5-1, 6-1, 9-1, 10-1. Accordingly, the individual displacement portions 5-1, 6-1, 9-1, 10-1 of the adjacent pixel can be so disposed as to be stacked under the heat separating portions 7, 8 and the individual displacement portions 5-2, 6-2, 9-2, 10-2 of the pixel concerned in a way that increases the inclination (i.e., the detection sensitivity) to the quantity of the incident infrared-rays by increasing the lengths of the first and second displacement portions 5, 6, 9, 10 from the proximal ends to the distal ends. Accordingly, the density in the vertical direction in FIG. 13 can be enhanced. Further, along with this, the reflection plate 12 of the adjacent pixel can be disposed in close proximity, and hence the aperture ratio can be enhanced.

(Fifth Embodiment)

Figure 18:
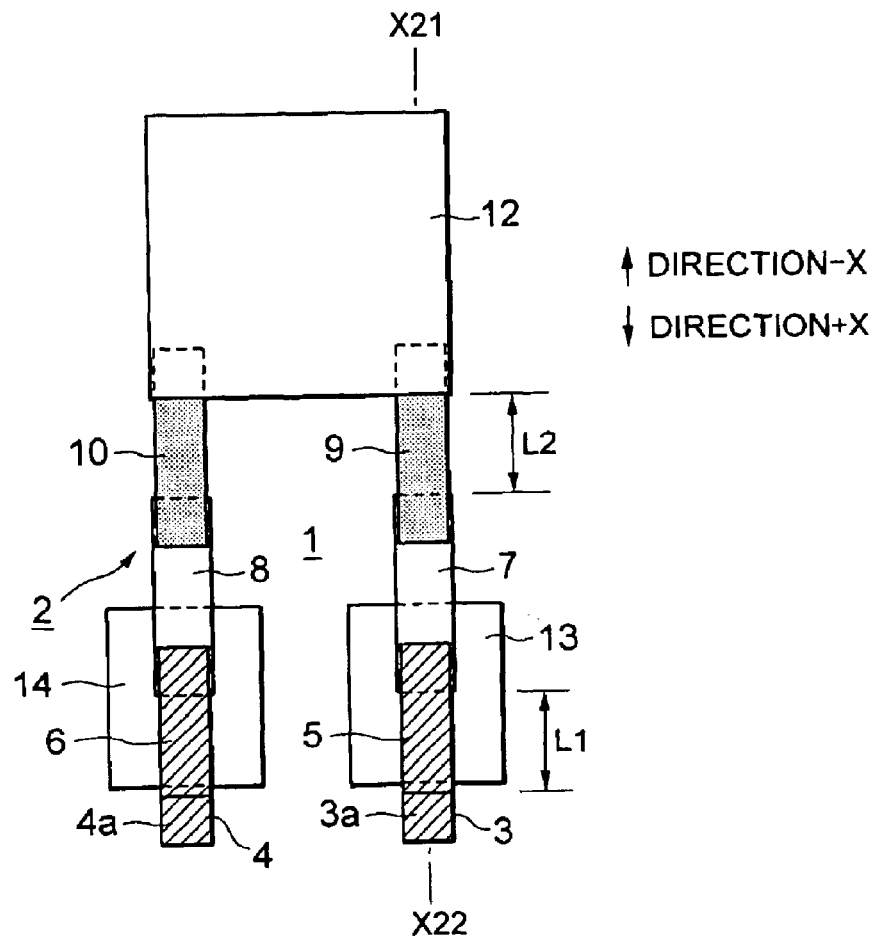
FIG. 18 is a schematic plan view schematically showing a unit pixel of a radiation detecting device in a fifth embodiment of the present invention.

FIG. 18 is a schematic plan view schematically showing the unit pixel of the radiation detecting device in a fifth embodiment of the present invention. FIG. 18 shows a state before the sacrifice layer (not shown) is removed in the process of manufacturing the radiation detecting device in this embodiment.

Figure 19:
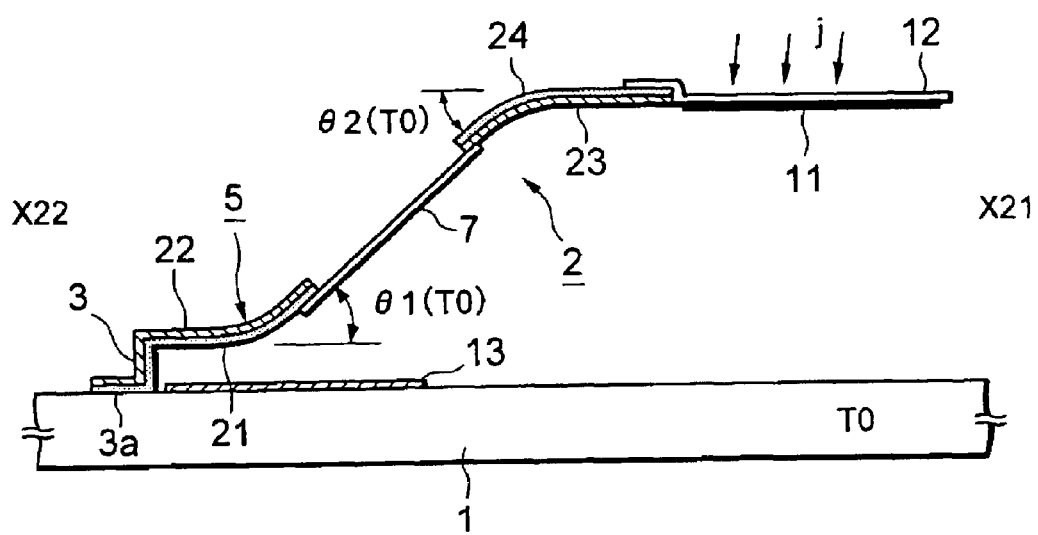
FIG. 19 is a schematic sectional view taken along the line X21–X22 in FIG. 18.

FIG. 19 is a diagram schematically showing a completed state after removing the sacrifice layer, and corresponds to a schematic sectional view taken along the ling X21–X22 in FIG. 18. FIG. 19 shows how the temperature of each of the substrate and the respective portions of the element comes to T0 upon reaching the thermal equilibrium if the ambient temperature is T0 in the state where the infrared-rays i from the target object do not enter, and corresponds to FIG. 4A.

Referring to FIGS. 18 and 19, the elements that are the same as or correspond to the elements in FIGS. 1 through 4A–4C are marked with the same numerals, and the repetitive explanations thereof are omitted.

The following points are differences of this embodiment from the first embodiment. As illustrated in FIGS. 18 and 19, the heat separating portions 7, 8 are formed in not the L-shape but the rectilinear shape. (a') The directions of the first displacement portion 5 and of the second displacement portion 9 from their proximal ends to their distal ends are opposite (the +X direction and the –X direction) in the first embodiment; however, the directions are the same (the –X direction and the –X direction) in this embodiment; and (c') the stacking sequences of the SiN layers and the Al layers are the same in the first embodiment but are opposite in this embodiment. Namely, either in this embodiment or in the first embodiment, the lower layer 21 of the first displacement portion 5 is the SiN layer while the upper layer 22 is the Al layer. In the first embodiment, however, the lower layer 23 of the second displacement portion 9 is the SiN layer while the upper layer 24 is the Al layer. By contrast, in this embodiment, the lower layer 23 of the second displacement portion 9 is the Al layer while the upper layer 24 is the SiN layer.

Thus, even when modifying the first embodiment, as in the case of the first embodiment, for the reasons (b), (d) and (e), as shown in FIG. 19, the absolute value of the angle $\theta 1$ (corresponding to the angle made by the heat separating portion 7 with respect to the substrate 1) made by the distal end with respect to the proximal end of the first displacement portion 5, is equal to the absolute value of the angle $\theta 2$ (corresponding to the angle made by the reflection plate 12 with respect to the heat separating portion 7) made by the distal end with respect to the proximal end of the second displacement portion 9. Then, in this embodiment also, for the reasons (a') and (c'), the relationship between the direction of the angle $\theta 1$ and the direction of the angle $\theta 2$ is set so that the angle $\theta 1$ and the angle $\theta 2$ cancel each other with respect to the angle $\theta 3$ (corresponding to the angle made by the reflection plate 12 with respect to the substrate 1, not shown in FIG. 19) made by the distal end of the second displacement portion 9 with respect to the substrate 1. Namely, $\theta 3 = \theta 2 - \theta 1$. Accordingly, as illustrated in FIG. 19, the reflection plate 12 is in parallel with the substrate 1.

Then, in this embodiment also, as in the first embodiment, the distal end of the second displacement portion 9 and the reflection plate 12 remain parallel to the substrate simply with the change in the ambient temperature (or the temperature of the substrate). Moreover, in this embodiment also, as in the first embodiment, when the infrared-rays i, the reflection plate 12 is inclined corresponding to the quantity of the incident infrared-rays.

Therefore, according to this embodiment also, the same advantages as those in the first embodiment are obtained.

(Sixth Embodiment)

Figure 20:
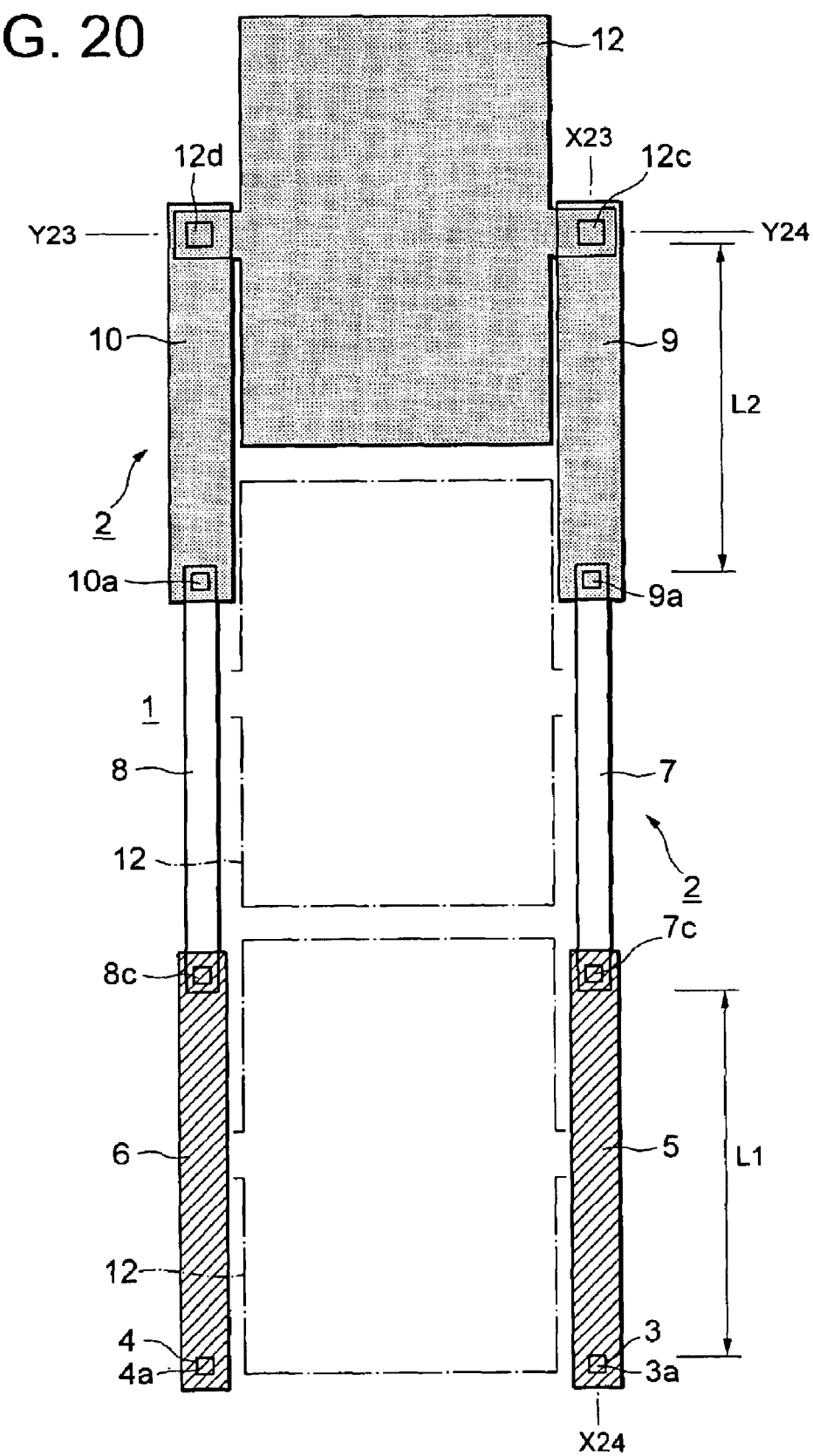
FIG. 20 is a schematic plan view schematically showing a unit pixel of a radiation detecting device in a sixth embodiment of the present invention.
Figure 21:
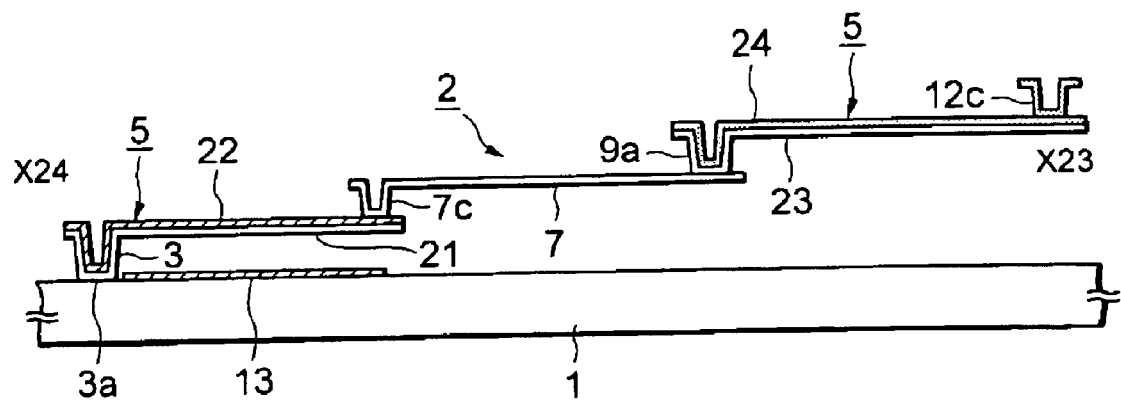
FIG. 21 is a schematic sectional view taken along the line X23–X24 in FIG. 20.
Figure 22:
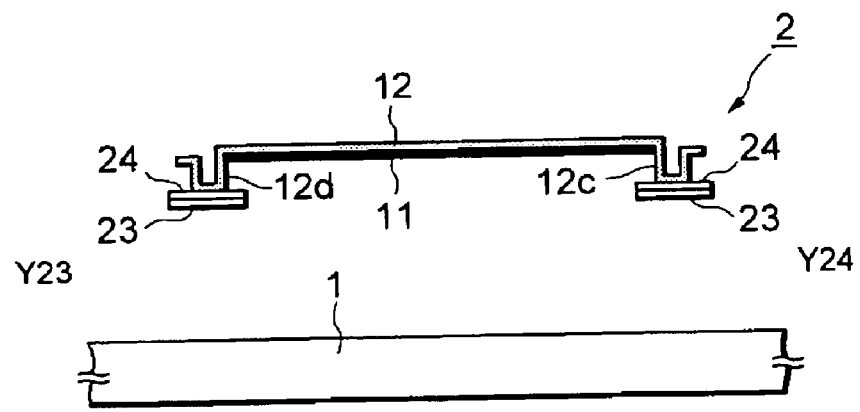
FIG. 22 is a schematic sectional view taken along the line Y23–Y24 in FIG. 20.

FIG. 20 is a schematic plan view schematically showing the unit pixel of the radiation detecting device in a sixth embodiment of the present invention. FIG. 21 is a schematic sectional view taken along the line X23–X24 in FIG. 20. FIG. 22 is a schematic sectional view taken along the line Y23–Y24 in FIG. 20. Referring to FIGS. 20 through 22, the elements that are the same as or correspond to the elements in FIGS. 1 through 4A–4C are marked with the same numerals, and the repetitive explanations thereof are omitted.

FIGS. 20 through 22 each show a state before the sacrifice layer (not shown) is removed in the process of manufacturing the radiation detecting device in this embodiment. Therefore, in FIGS. 20 through 22, the first and second displacement portions 5, 6, 9, 10 are held by the sacrifice layer and not bent. Though not illustrated in the drawings, when the radiation detecting device in this embodiment is completed by removing the sacrifice layer, as in the fifth embodiment, the first and second displacement portions 5, 6, 9, 10 are bent.

Note that for clarifying a layout of an adjacent pixel, the reflection plate 12 of this adjacent pixel is depicted by an imaginary line in FIG. 20. Referring again to FIG. 20, the infrared-ray shielding portions 13, 14 are omitted.

The following is a different point of this embodiment from the fifth embodiment. As illustrated in FIGS. 20 through 22, when the first and second displacement portions 5, 6, 9, 10 are set in the unbent state, the heat separating portions 7, 8 are positioned on a tier higher by one stage than the first displacement portions 5, 6, and the second displacement portions 9, 10 are positioned on a tier much higher by one stage than the heat separating portions 7, 8.

Referring to FIGS. 20 through 22, 7c, 8c represent connection portions for connecting respectively the heat separating portions 7, 8 to the first displacement portions 5, 6, 9a, 10a stand for connection portions for connecting respectively second displacement portions 9, 10 to the heat separating portions 7, 8, and 12c, 12d designate connection portions for connecting respectively the reflection plate 12 to the second displacement portions 9, 10.

According to this embodiment, the same advantages as those in the fifth embodiment are acquired. Besides, with the above-mentioned layout adopted, the first displacement portions 5, 6 of the adjacent pixel can be so disposed as to be stacked under the heat separating portions 7, 8 of the pixel concerned, and the heat separating portions 7, 8. of the adjacent pixel can be so disposed as to be stacked under the second displacement portions 9, 10 of the pixel concerned. Accordingly the density in the vertical direction in FIG. 20 can be increased. Further, along with this, the reflection plate 12 of the adjacent pixel can be disposed in close proximity, and hence the aperture ratio can be enhanced.

(Seventh Embodiment)

Figure 23:
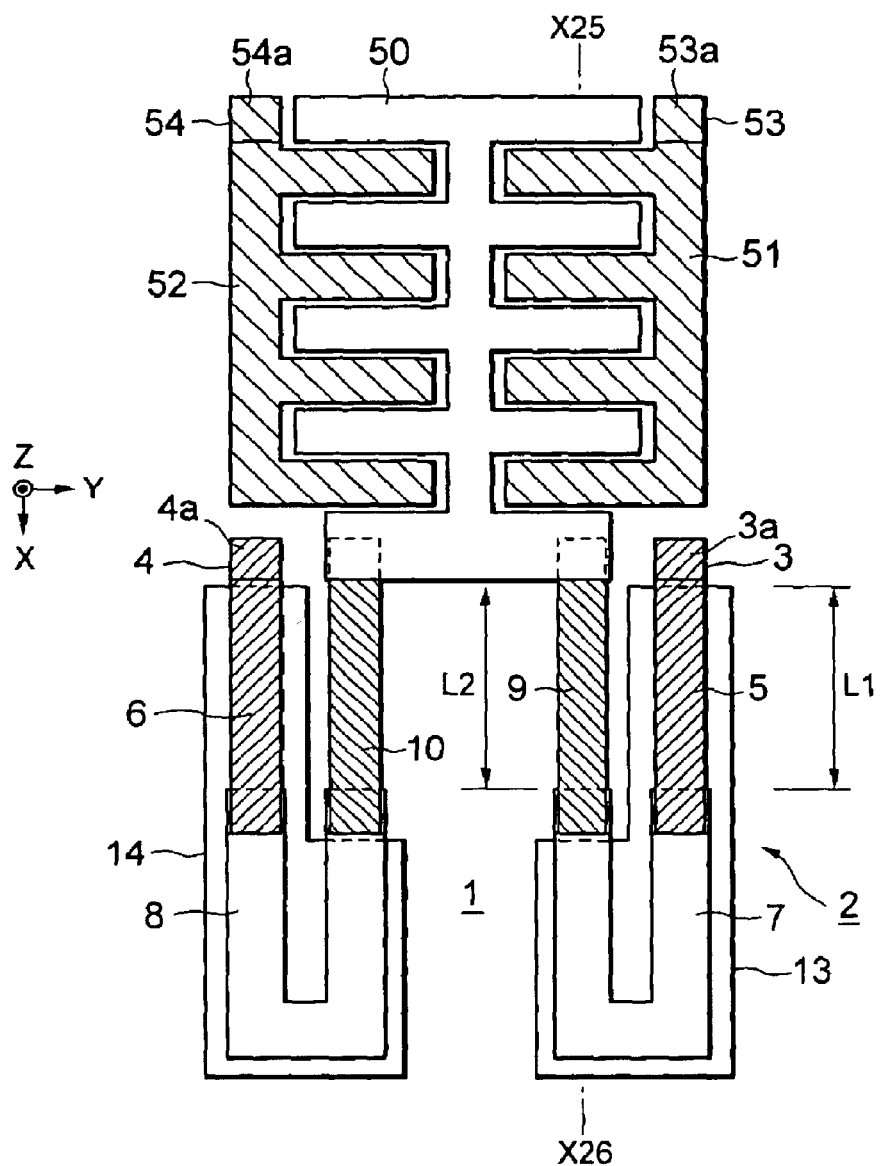
FIG. 23 is a schematic plan view schematically showing a unit pixel of a radiation detecting device in a seventh embodiment of the present invention.

FIG. 23 is a schematic plan view schematically showing the unit pixel of the radiation detecting device in a seventh embodiment of the present invention. FIG. 23 shows a state before the sacrifice layer (not shown) is removed in the process of manufacturing the radiation detecting device in this embodiment.

Figure 24:
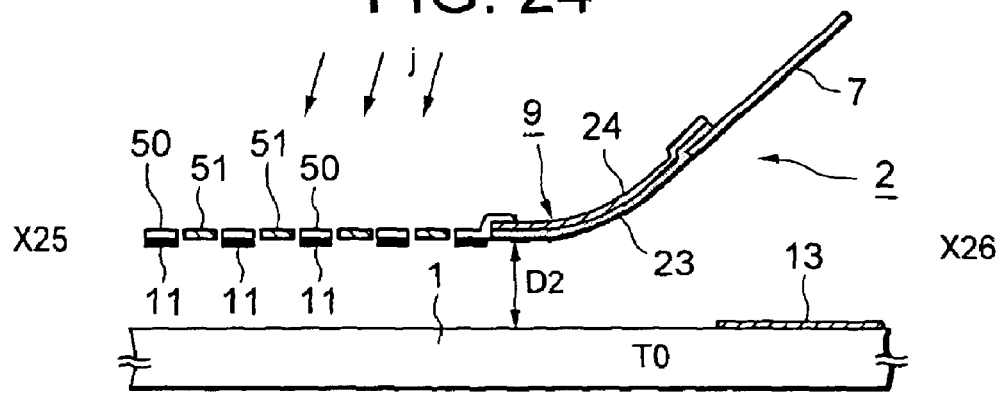
FIG. 24 is a schematic sectional view taken along the line X25–X26 in FIG. 23.

FIG. 24 is a diagram schematically showing a completed state after removing the sacrifice layer, and corresponds to a schematic sectional view taken along the ling X25–X26 in FIG. 23. FIG. 24 shows how the temperature of each of the substrate and the respective portions of the element comes to T0 upon reaching the thermal equilibrium if the ambient temperature is T0 in the state where the infrared-rays i from the target object do not enter, and corresponds to FIG. 4A.

Referring to FIGS. 23 and 24, the elements that are the same as or correspond to the elements in FIGS. 1 through 4A–4C are marked with the same numerals, and the repetitive explanations thereof are omitted.

The following points are differences of this embodiment from the first embodiment. In the first embodiment, the positions of the proximal ends of the first displacement portions 5, 6 and the positions of the distal ends of the second displacement portions 9, 10 as viewed in the widthwise direction (the Y-axis direction) of the first and second displacement portions 5, 6, 9, 10, are substantially the same. As in the first embodiment, the length L1 of the first displacement portion 5 from the proximal end to the distal end is equal to the length L2 of the second displacement portion 9 from the proximal end to the distal end. Hence, the positions of the distal ends of the first displacement portions 5, 6 and the positions of the proximal ends of the second displacement portions 9, 10 as viewed in the Y-axis direction, are substantially the same. Along with this, the heat separating portions 7, 8 are configured in a U-shape.

Hence, according to this embodiment, as far as the infrared-rays i from the target object are not incident, irrespective of the initial flexures of the first and second displacement portions 5, 6, 9, 10 and the change in the ambient temperature, as in the first embodiment, the distal ends of the second displacement portions 9, 10 become parallel with the substrate 1, and besides a height D2 of the distal end of each of the second displacement portions 9, 10 is fixed.

Further, in this embodiment, as a substitute for the reflection plate 12 in FIG. 1, a movable reflection plate 50 serving as displacement reading members and composed of Al layers with their both sides formed in a comb-toothed shape, is fixed to the distal ends of the second displacement portions 9, 10. The infrared-ray absorbing portion 11 composed of the infrared-ray absorbing layer such as gold black etc is formed on the undersurface of the movable reflection portion 50. Two pieces of fixed reflection portions 51, 52 with one sides formed in the comb-toothed shape are fixed to the substrate 1. The fixed reflection portions 51, 52 are supported on the substrate 1 afloat substantially at the height D2 respectively through the legs 53, 54. The two fixed reflection portions 51, 52 are disposed so that the comb-toothed portions thereof mesh with both sides of the movable reflection portion 50. With this configuration, according to this embodiment, the fixed reflection portions 51, 52 and the movable reflection portion 50 substantially form diffraction gratings. A light quantity of reflected diffraction beam, e.g., +first-order diffraction beam of the reading beam entering from above, changes corresponding to a level difference quantity (a height difference) between the fixed reflection portions 51, 52 and the movable reflection portion 50.

According to this embodiment, as far as the infrared-rays i from the target object do not enter, the movable reflection portion 50 is parallel with the substrate 1 and remains at the fixed height. When the infrared-rays i from the target object enter, the movable reflection portion 50 is inclined corresponding to the quantity of the incident infrared-rays, and the above level difference quantity changes, for example, the light quantity of the +first-order diffraction beam change.

The radiation detecting device in this embodiment can be used as a substitute for the radiation detecting device 100 in the above-mentioned visualizing apparatus illustrated in the FIG. 5. In this case, however, the beam flux restriction member 35 is so structured as to selectively transmit only, for instance, the +first-order diffraction beams of the diffraction beams reflected by the reflection portions 50, 51, 52 upon the irradiation of the reading beam. A scheme is that the beam flux restriction member 35 restricts nothing about the flux of the +first-order diffraction beams. In this visualizing apparatus also, as in the case of the visualizing apparatus using the radiation detecting device 100 shown in FIG. 5, the optical image of the reading beam, which is formed on the light receiving surfaces of the CCD 30, is what reflects the image of the incident infrared-rays.

Note that the reflection plate 12 in FIG. 1 may be, as a matter of course, used as a displacement reading member and as a substitute for the movable reflection portion 50 in this embodiment. In this case, the fixed reflection portions 51, 52 are removed.

Further, according to this embodiment, the positions of the proximal ends of the first displacement portions 5, 6 and the positions of the distal ends of the second displacement portions 9, 10 are the same as viewed in the widthwise direction, and the length of the first displacement portions 5, 6 is equal to the length of the second displacement portions 9, 10. This yields such an effect that the initial stress is hard to occur when manufacturing and the deterioration can be reduced. Especially when removing the sacrifice layer, this effect is conspicuous. The displacement portion is narrower in width than the reflection portion. Therefore, the sacrifice layer existing under the displacement portion completes its removable ahead in the sacrifice layer removing process. Then, the bending stresses act on the sacrifice layer. With the configuration described above, the stresses occur so as to cancel each other, with the result that the stresses are substantially reduced. Therefore, the yield rises.

(Eighth Embodiment)

Figure 25:
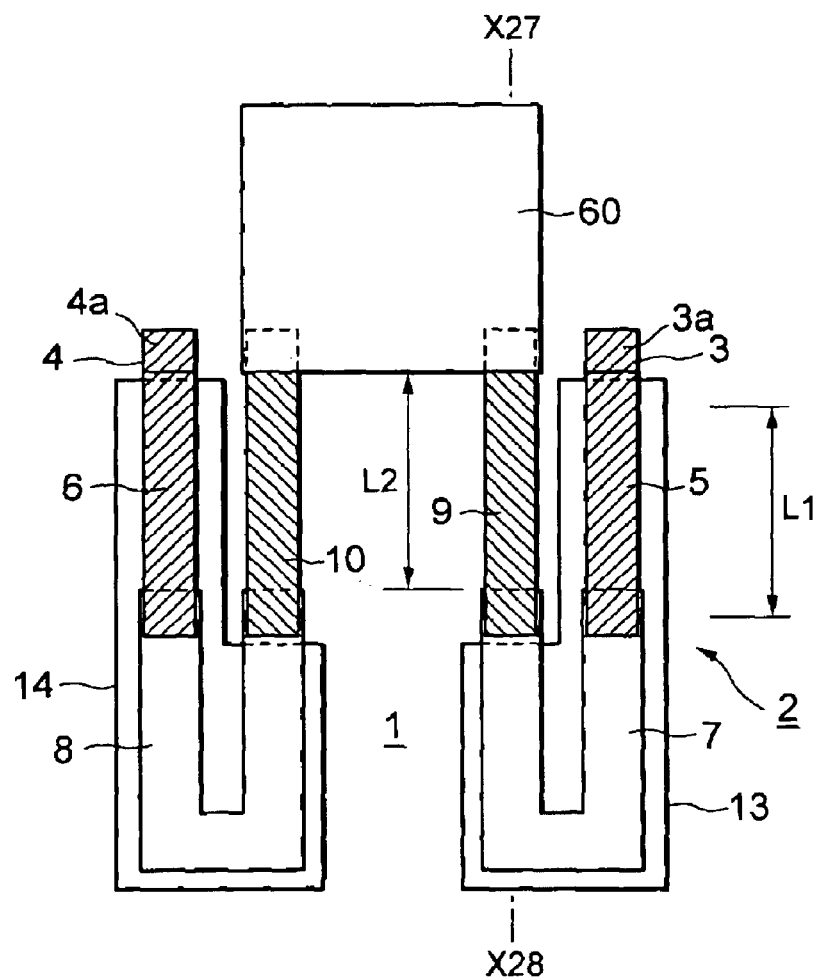
FIG. 25 is a schematic plan view schematically showing a unit pixel of a radiation detecting device in an eighth embodiment of the present invention.

FIG. 25 is a schematic plan view schematically showing the unit pixel of the radiation detecting device in an eighth embodiment of the present invention. FIG. 25 shows a state before the sacrifice layer (not shown) is removed in the process of manufacturing the radiation detecting device in this embodiment.

Figure 26:
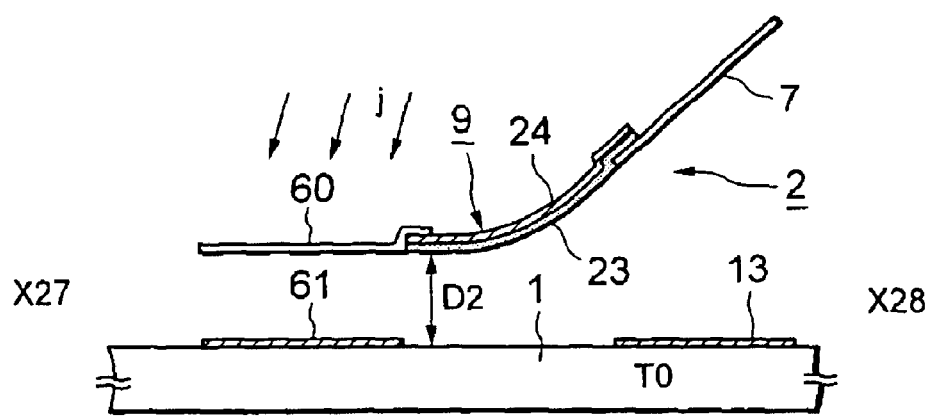
FIG. 26 is a schematic sectional view taken along the line X27–X28 in FIG. 25.

FIG. 26 is a diagram schematically showing a completed state after removing the sacrifice layer, and corresponds to a schematic sectional view taken along the ling X27–X28 in FIG. 25. FIG. 26 shows how the temperature of each of the substrate and the respective portions of the element comes to T0 upon reaching the thermal equilibrium if the ambient temperature is T0 in the state where the infrared-rays i from the target object do not enter, and corresponds to FIG. 24.

Referring to FIGS. 25 and 26, the elements that are the same as or correspond to the elements in FIGS. 23 and 24 are marked with the same numerals, and the repetitive explanations thereof are omitted.

The following points are differences of this embodiment from the seventh embodiment. In this embodiment, a half-mirror portion 60 for reflecting only a part of the received reading beam j is used as a substitute for the movable reflection portion 50 and as a displacement reading member, is provided at the distal end of each of the second displacement portions 9, 10. The fixed reflection portions 51, 52 are removed. Further, a total reflection mirror 61 composed of the Al layer and serving as a reflection portion for reflecting the reading beam penetrating the half-mirror portion 60, is provided on the substrate 1 in a way that faces to the half-mirror portion 60. Further, in this embodiment, the infrared-ray absorbing portion 11 of gold black etc is removed, and the lower SiN layer of each of the second displacement portions 9, 10 serves as the infrared-ray absorbing portion.

According to this embodiment, as in the seventh embodiment, as far as the infrared-rays i from the target object do not enter, the half-mirror portion 60 is parallel with the substrate 1 and remains at the fixed height. When the infrared-rays i from the target object enter, half-mirror portion 60 is inclined corresponding to the quantity of the incident infrared-rays, and an interval between the half-mirror portion 60 and the total reflection mirror 61 changes. When the reading beam j is irradiated from above, the reflected beam from the total reflection mirror 61 and the reflected beam from the half-mirror portion 60 interfere with each other into interference beams, and these beams travel back upwards. An intensity of the interference beams depends on the interval between the half-mirror portion 60 and the total reflection mirror 61, thereby obtaining the interference beams having the intensity corresponding to the quantity of the incident infrared-rays.

The radiation detecting device in this embodiment can be used as a substitute for the radiation detecting device 100 in the above-mentioned visualizing apparatus illustrated in the FIG. 5. In this case, however, the beam flux restriction member 35 is removed. In this visualizing apparatus also, as by the visualizing apparatus using the radiation detecting device 100 shown in FIG. 5, the optical image of the reading beam, which is formed on the light receiving surfaces of the CCD 30, is what reflects the image of the incident infrared-rays.

According to this embodiment also, the same advantages as those in the seventh embodiment are obtained.

(Ninth Embodiment)

Figure 27:
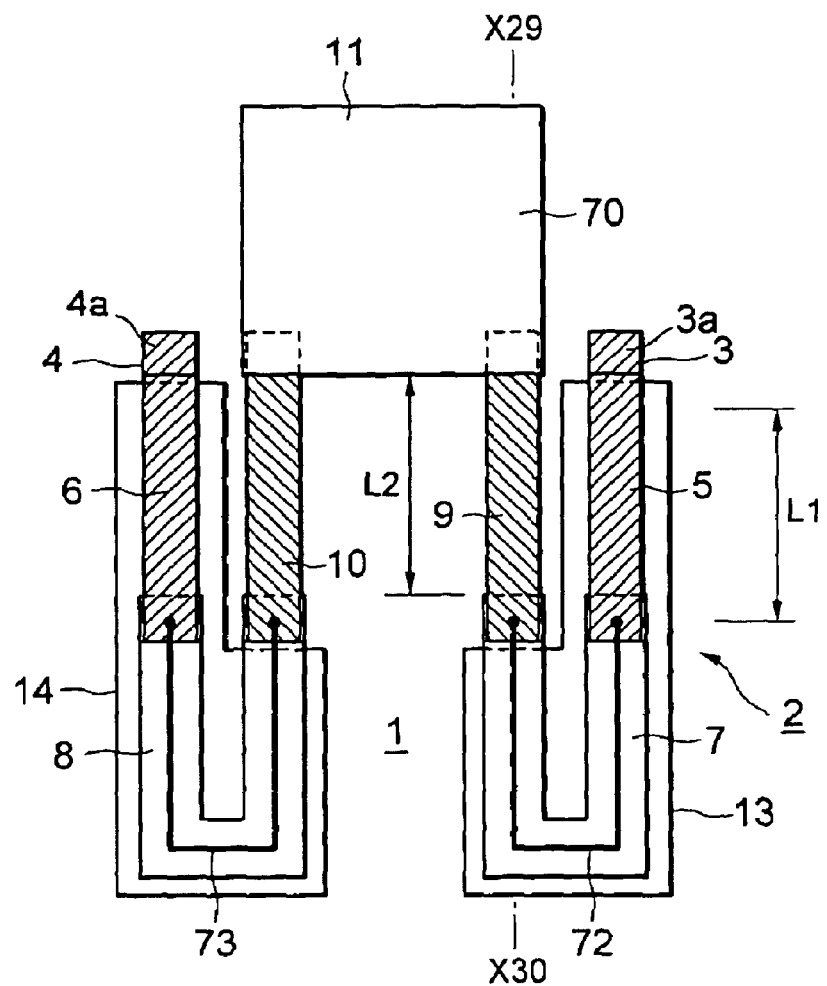
FIG. 27 is a schematic plan view schematically showing a unit pixel of a radiation detecting device in a ninth embodiment of the present invention.

FIG. 27 is a schematic plan view schematically showing the unit pixel of the radiation detecting device in a ninth embodiment of the present invention. FIG. 27 shows a state before the sacrifice layer (not shown) is removed in the process of manufacturing the radiation detecting device in this embodiment.

Figure 28:
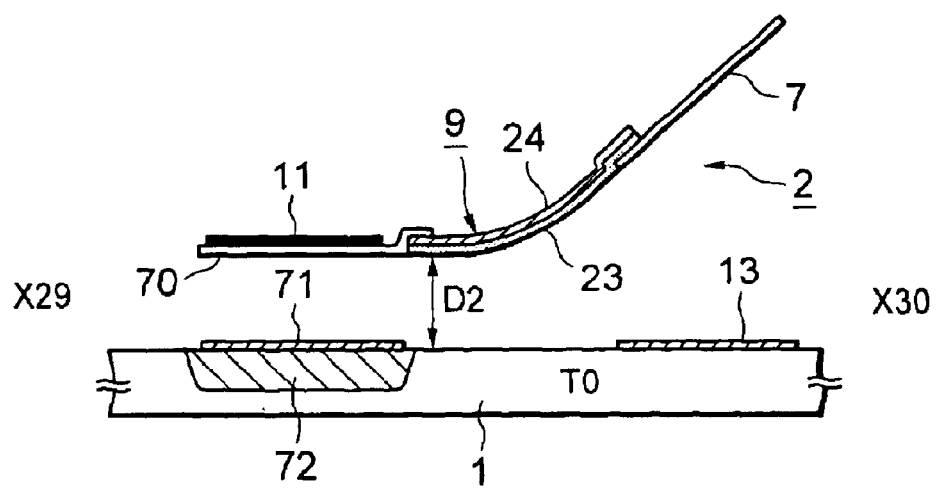
FIG. 28 is a schematic sectional view taken along the line X29–X30 in FIG. 27.

FIG. 28 is a diagram schematically showing a completed state after removing the sacrifice layer, and corresponds to a schematic sectional view taken along the ling X29–X30 in FIG. 27. FIG. 28 shows how the temperature of each of the substrate and the respective portions of the element comes to T0 upon reaching the thermal equilibrium if the ambient temperature is T0 in the state where the infrared-rays i from the target object do not enter, and corresponds to FIG. 24.

Referring to FIGS. 27 and 28, the elements that are the same as or correspond to the elements in FIGS. 25 and 26 are marked with the same numerals, and the repetitive explanations thereof are omitted.

The following points are differences of this embodiment from the seventh embodiment. In this embodiment, a movable electrode portion 70 composed of the Al layer is used as a substitute for the movable reflection portion 50 and as a displacement reading member, is provided at the distal end of each of the second displacement portions 9, 10. The fixed reflection portions 51, 52 are removed. Further, a fixed electrode portion 71 composed of the Al layer is provided on the substrate 1 in a way that faces to the movable electrode portion 70. The infrared-ray absorbing portion 11 of gold black etc is formed on the upper surface of the movable reflection portion 70, and receives from above the infrared-rays i coming from the target object.

A diffused layer 72 is formed under the fixed electrode portion 71 on the substrate 1, thereby electrically connecting the layer 72 and the substrate 1. Further, though not shown in the drawings, diffused layers are also formed under the contacts 3a, 4a of the legs 3, 4, and these diffused layers are electrically connected via contact holes to the upper Al layers of the first and second displacement portions 5, 6. The upper Al layers 22 of the first displacement portions 5, 6 are electrically connected to the upper Al layers of the second displacement portions 9, 10 via Ti wiring layers 72, 73 formed on the heat separating portions 7, 8. The diffused layers under the contacts 3a, 4a are thereby electrically connected to the movable electrode portion 70. Though not illustrated, there is formed a known reading circuit for reading an electrostatic capacitance between the diffused layers and the wiring layer 72.

According to this embodiment, as in the seventh embodiment, as far as the infrared-rays i from the target object do not enter, the movable electrode portion 70 is parallel with the substrate 1 and remains at the fixed height. When the infrared-rays i from the target object enter from above, movable electrode portion 70 is inclined corresponding to the quantity of the incident infrared-rays, and an interval between the movable electrode portion 70 and the fixed electrode portion 71 changes. This change is read as a change in the electrostatic capacitance by the reading circuit. The unit pixels are arrayed one-dimensionally or two-dimensionally, thereby obtaining image signals of the infrared-rays.

According to this embodiment also, the same advantages as those in the seventh embodiment are obtained. Especially in this embodiment, the following advantages are obtained. The movable electrode portion 70 is not initially inclined to the substrate 1, and it is therefore possible to set the inter-electrode interval narrow without impinging on the fixed electrode portion 71. Therefore, it is feasible to perform the high-sensitivity infrared-ray detection, and the dynamic range is not restricted.

By the way, in each of the embodiments discussed above and of embodiment that will hereinafter be described, it is preferable that the components (e.g., the reflection plate 12, the heat separating portions 7, 8, the infrared-ray absorbing portion 11 in FIG. 13, the reflection portions 50 through 52, the half-mirror portion 60, the movable electrode portion 70 etc) other than the first and second displacement portions 5, 6, 9, 10, be respectively configured to include a plane portion and an erect-up or erect-down portion formed erecting up or down over at least a part of the periphery of the plane portion. In this case, the plane portion is reinforced by the erect-up or erect-down portion, and the layer thickness can be reduced in a way that ensures a desired strength, which is conceived as preferable.

Further, in each of the embodiments discussed above and twelfth and thirteenth embodiments which will hereinafter be explained, it is preferable that each of the connection portions between the first displacement portions 5, 6 and the legs 3, 4 be reinforced. Examples of this reinforcing structure will be explained by way of tenth and eleventh embodiments of the present invention.

(Tenth Embodiment)

Figure 29A:
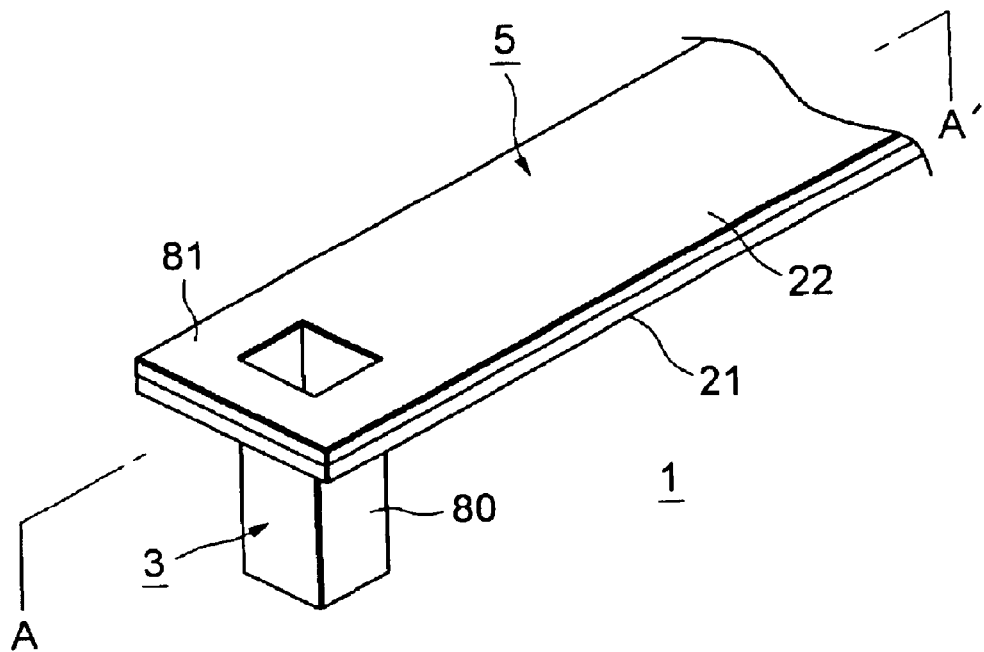
FIGS. 29A and 29B are views each schematically showing the vicinity of a connection portion between a first displacement portion and a leg in the radiation detecting device in the second embodiment of the present invention.
Figure 29B:
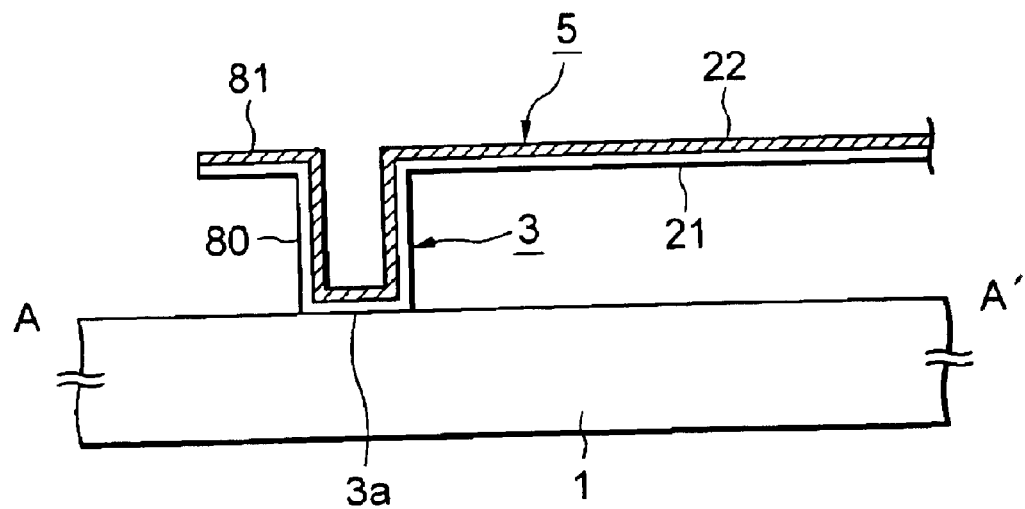

Before discussing a tenth embodiment of the present invention, the reinforcing structure in the second embodiment in comparison with the tenth embodiment and the eleventh embodiment that will be described later on, will be explained referring to FIGS. 29A and 29B. FIGS. 29A and 29B are views each schematically showing the vicinity of the connection portion between the first displacement portion 5 and the leg 3 in the radiation detecting device in the second embodiment shown in FIGS. 6 through 9. FIG. 29A is the schematic perspective view thereof. FIG. 29B is a schematic sectional view taken along the line A–A' in FIG. 29A. Note that the light shielding layer 13 in FIG. 7 is omitted in FIGS. 29A and 29B.

In the second embodiment, as shown in FIGS. 29A and 29B, the leg 3 is constructed of a bottomed column portion 80 with its upper portion opened, and a plane portion 81 provided along the periphery of the upper opening edge of the column portion 80 and continuous substantially in parallel with the surface of the substrate 1. The first displacement portion 5 is configured as what this plane portion 81 extends substantially in the same plane shape. The column portion 80 and the plane portion 81 constituting the leg 3 are formed by continuously extending the SiN layer 21 and the Al layer 22 as they are, which compose the first displacement portion 5. Though not illustrated in FIGS. 29A and 29B, the leg 4 and the first displacement portion 6 are configured in the same way as the leg 3 and the first displacement portion 5.

In the second embodiment, the leg 3 is constructed of the plane portion 81 and the column portion 80, and hence the strength of the connect portion between the leg 3 and the first displacement portion 5 is more reinforced than configuring the leg 3 simply in the L-shape in section as in the first embodiment illustrated in FIGS. 1 through 4A–4C.

Figure 30A:
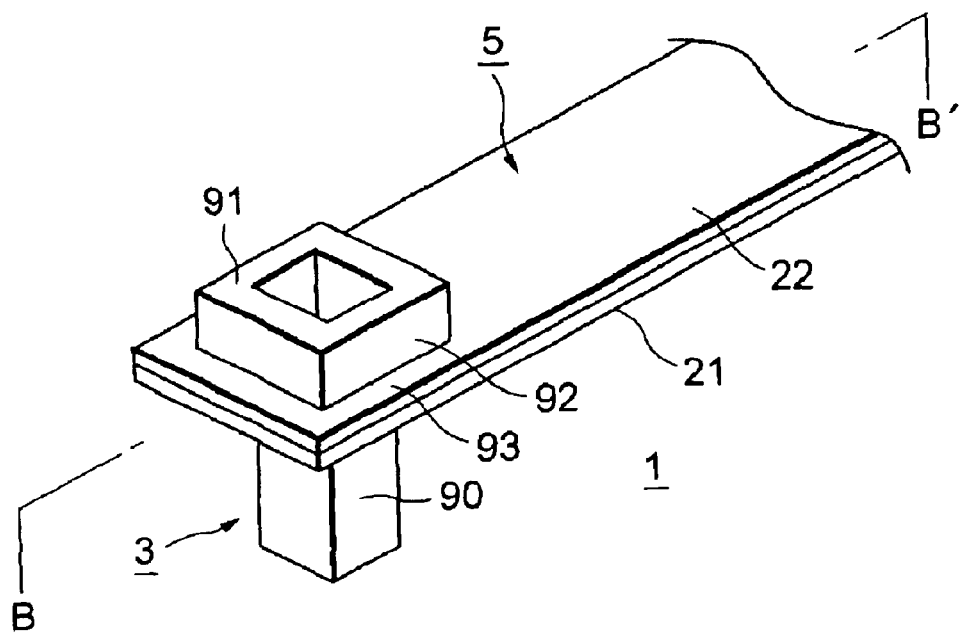
FIGS. 30A and 30B are views each schematically showing the vicinity of a connection portion between a first displacement portion and a leg in the radiation detecting device in the tenth embodiment of the present invention.
Figure 30B:
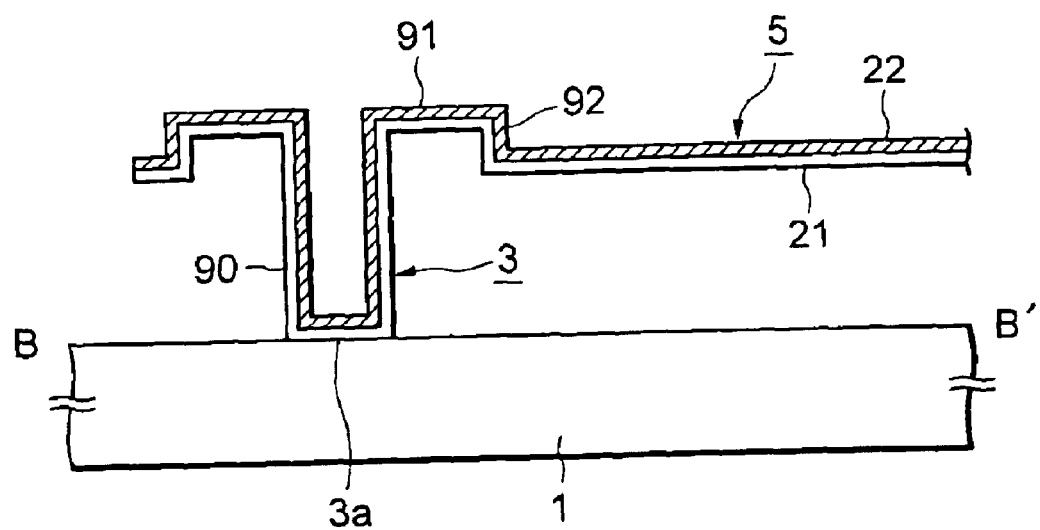

On the other hand, FIGS. 30A and 30B are views each schematically showing the vicinity of the connection portion between the first displacement portion 5 and the leg 3 in the radiation detecting device in the tenth embodiment of the present invention. FIG. 30A is the schematic perspective view thereof. FIG. 30B is a schematic sectional view taken along the line B–B' in FIG. 30A. Referring to FIGS. 30A and 30B, the elements that are the same as or correspond to the elements in FIGS. 29A and 29B are marked with the same numerals, and the repetitive explanations thereof are omitted. Note that a light shielding layer corresponding to the light shielding layer in FIG. 7 is omitted in FIGS. 30A and 30B.

A difference of the tenth embodiment of the present invention from the second embodiment is only a configuration of the leg 3. To be specific, in this embodiment, as shown in FIGS. 30A and 30B, the leg 3 is constructed of a bottomed column portion 90 with its upper portion opened, a plane portion 91 provided along the periphery of the upper opening edge of the column portion 90 and continuous substantially in parallel with the surface of the substrate 1, an erect-down portion 92 erecting down toward the substrate 1 from the peripheral edge of the plane portion 91, and a plane portion 93 extending along the periphery from the lower edge of the erect-down portion 92 and continuous substantially in parallel with the surface of the substrate 1. The first displacement portion 5 is configured as what the plane portion 93 extends as it is substantially in the same plane shape. The column portion 90, the plane portion 91, the erect-down portion 92 and the plane portion 93 constituting the leg 3 are formed by continuously extending the SiN layer 21 and the Al layer 22 as they are, which compose the first displacement portion 5. Though not illustrated in the drawings, the components corresponding to the leg 4 and the first displacement portion 6 in the second embodiment are also configured in the same way as the leg 3 and the first displacement portion 5.

Figure 31A:
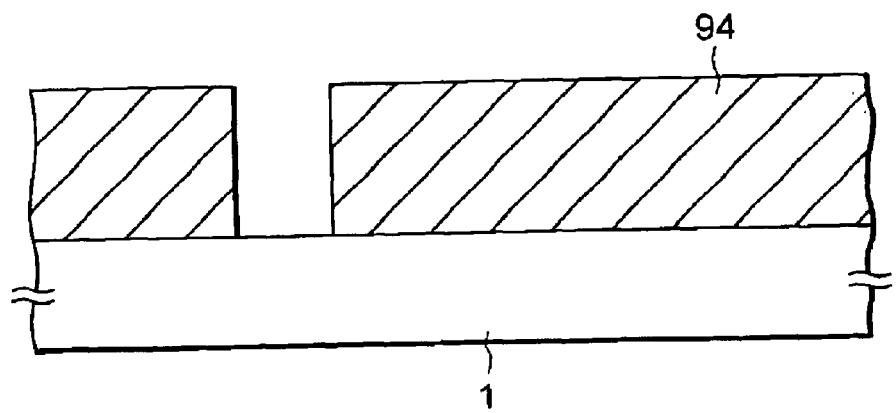
FIGS. 31A, 31B and 31C are views showing processes of a method of manufacturing the radiation detecting device in the tenth embodiment of the present invention.

One example of a method of manufacturing the radiation detecting device in the tenth embodiment will be explained referring to FIGS. 31A through 31C. Herein, however, the discussion will be focused on portions related to the legs 3, 4 and the first displacement portions 5, 6. Note that FIGS. 31A through 31C are views showing processes of the radiation detecting device manufacturing method in the tenth embodiment, and correspond to schematic views each corresponding to FIG. 30B.

To begin with, after depositing, on the substrate 1 by the vapor deposition method etc, Al layers (not shown) which are to become the light shielding layers corresponding to the infrared-ray light shielding layers 13, 14 in FIG. 9, the patterning is effected thereon by the photolithography etching method, thereby configuring the light shielding layers (not shown). Next, a resist serving as a sacrifice layer 94 is coated over the entire surface of the Si substrate 1, and openings corresponding to the contacts 3a, 4a of the legs 3, 4 are formed in this sacrifice layer 94 by the photolithography (FIG. 31A).

Figure 31B:
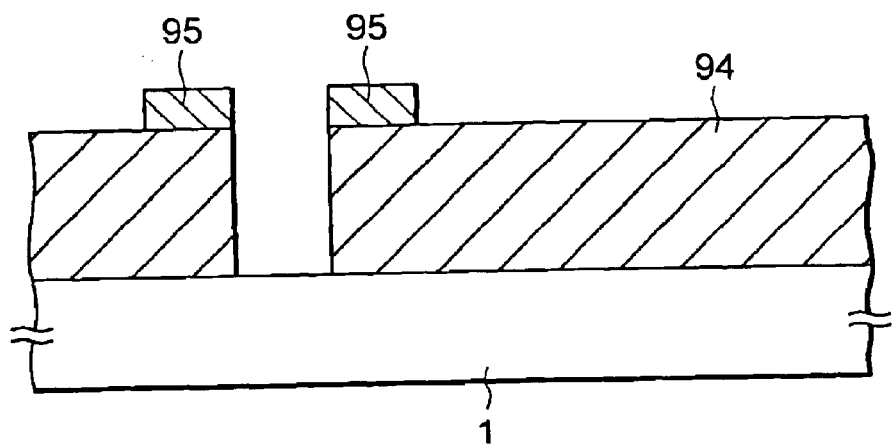
Figure 31C:
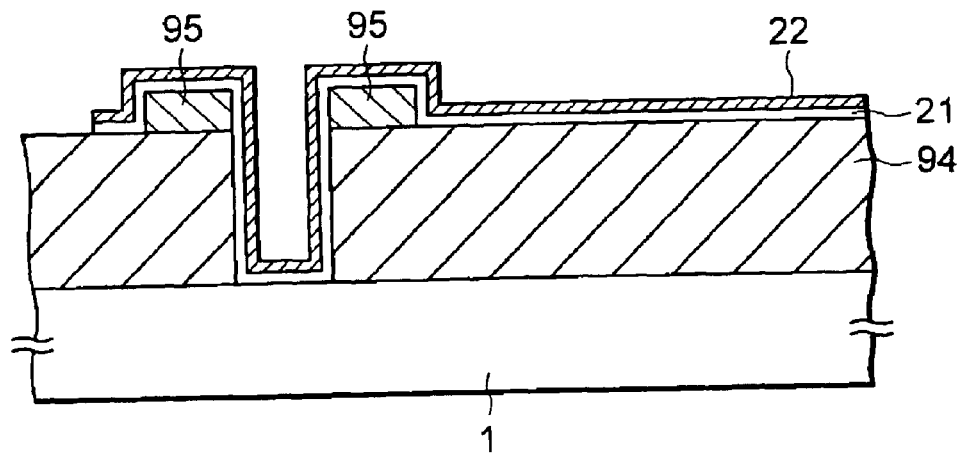

Subsequently, the resist as the sacrifice layer 95 is coated over the substrate in this state, and the sacrifice layer 95 is etched in an island-like shape by the photolithography etching method in a way that removes other areas of the layer 95 so that the island-shaped sacrifice layer 95 corresponding to the plane portions 91 of the legs 3, 4 remains (FIG. 31B).

Next, after depositing the SiN layers 21 that are to become the lower layers 21 of the first displacement portions 5, 6 and the legs 3, 4 by the P-CVD method, the patterning is effected thereon by the photolithography etching method, thereby obtaining the respective configurations. Next, after depositing the Al layers 22 that are to become the upper layers 22 of the first displacement portions 5, 6 and the legs 3, 4 by the vapor deposition method etc, the patterning is effected thereon by the photolithography etching method, thereby obtaining the respective configurations (FIG. 31C).

Thereafter, through the same processes as those for manufacturing it in the second embodiment, the substrate in this state is diced into chips by dicing, and the sacrifice layers 94, 95 and other sacrifice layers are removed by the ashing method etc. The radiation detecting device in this embodiment is thereby completed.

The present inventors empirically confirmed that the reinforcing structure as shown in FIGS. 30A and 30B reinforces and gives a higher rigidity to the proximal portion of the first displacement portion 5 than by the reinforcing structure as shown in FIGS. 29A and 29B. An assumption for this is that the erect-down portion 92 is formed and its rigidity is thereby increased.

(Eleventh Embodiment)

Figure 32A:
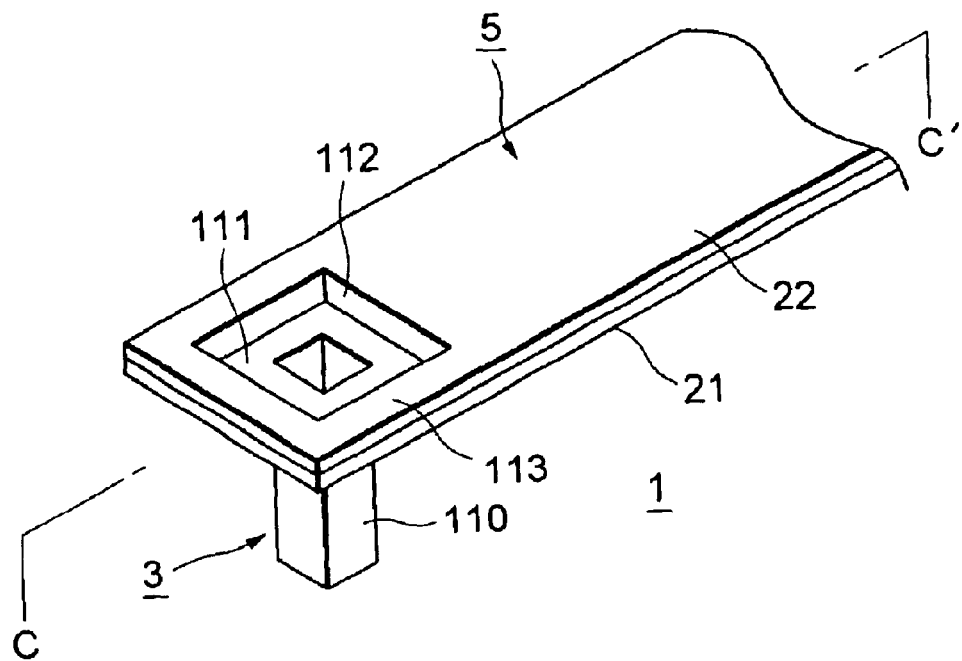
FIGS. 32A and 32B are views each schematically showing the vicinity of a connection portion between a first displacement portion and a leg in the radiation detecting device in the eleventh embodiment of the present invention.
Figure 32B:
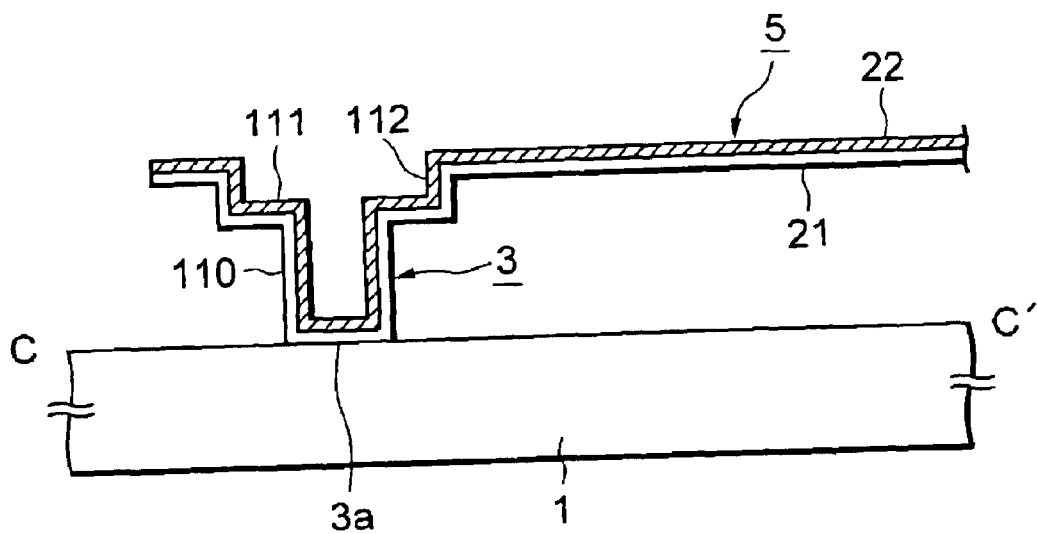

FIGS. 32A and 32B are views each schematically showing the vicinity of the connection portion between the first displacement portion 5 and the leg 3 in the radiation detecting device in an eleventh embodiment of the present invention. FIG. 32A is the schematic perspective view thereof. FIG. 32B is a schematic sectional view taken along the line C–C' in FIG. 32A. Referring to FIGS. 32A and 32B, the elements that are the same as or correspond to the elements in FIGS. 29A and 29B are marked with the same numerals, and the repetitive explanations thereof are omitted. Note that a light shielding layer corresponding to the light shielding layer 13 in FIG. 7 is omitted in FIGS. 32A and 32B.

A difference of the eleventh embodiment of the present invention from the second embodiment is only a configuration of the leg 3. To be specific, in this embodiment, as shown in FIGS. 32A and 32B, the leg 3 is constructed of a bottomed column portion 110 with its upper portion opened, a plane portion 111 provided along the periphery of the upper opening edge of the column portion 110 and continuous substantially in parallel with the surface of the substrate 1, an erect-up portion 112 erecting up on the opposite side to the substrate 1 from the peripheral edge of the plane portion 111, and a plane portion 113 extending along the periphery from the upper edge of the erect-up portion 112 and continuous substantially in parallel with the surface of the substrate 1. The first displacement portion 5 is configured as what the plane portion 113 extends as it is substantially in the same plane shape. The column portion 110, the plane portion 111, the erect-up portion 112 and the plane portion 113 constituting the leg 3 are formed by continuously extending the SiN layer 21 and the Al layer 22 as they are, which compose the first displacement portion 5. Though not illustrated in the drawings, the components corresponding to the leg 4 and the first displacement portion 6 in the second embodiment are also configured in the same way as the leg 3 and the first displacement portion 5.

Figure 33A:
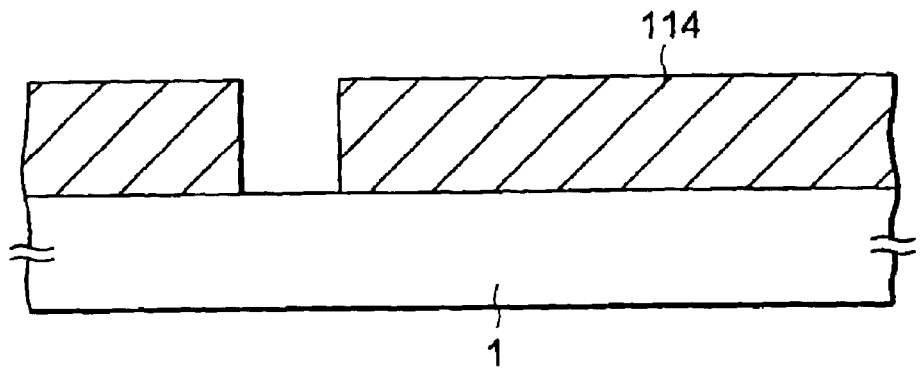
FIGS. 33A, 33B and 33C are views showing processes of a method of manufacturing the radiation detecting device in the eleventh embodiment of the present invention.

One example of a method of manufacturing the radiation detecting device in the eleventh embodiment will be explained referring to FIGS. 33A through 33C. Herein, however, the discussion will be focused on portions related to the legs 3, 4 and the first displacement portions 5, 6. Note that FIGS. 33A through 33C are views showing processes of the radiation detecting device manufacturing method in the eleventh embodiment, and correspond to schematic views each corresponding to FIG. 32B.

To start with, after depositing, on the substrate 1 by the vapor deposition method etc, Al layers (not shown) which are to become the light shielding layers corresponding to the infrared-ray light shielding layers 13, 14 in FIG. 9, the patterning is effected thereon by the photolithography etching method, thereby configuring the light shielding layers (not shown). Next, a resist serving as a sacrifice layer 114 is coated over the entire surface of the Si substrate 1, and openings corresponding to the contacts 3a, 4a of the legs 3, 4 are formed in this sacrifice layer 114 by the photolithography (FIG. 33A).

Figure 33B:
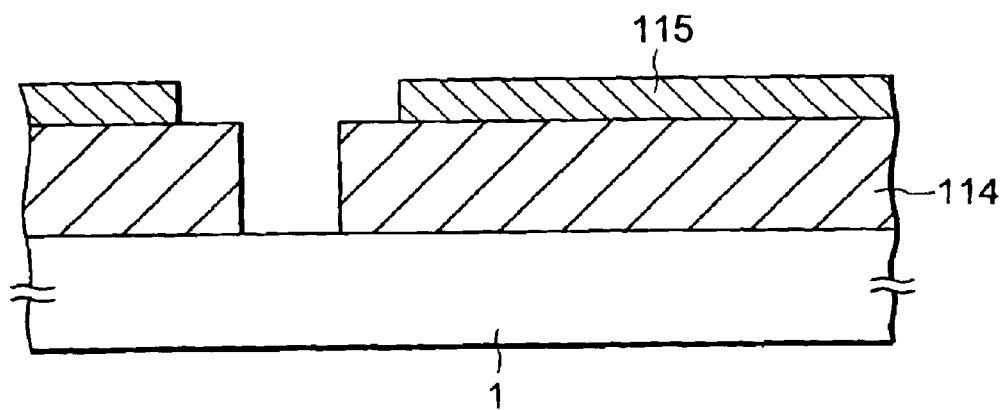
Figure 33C:
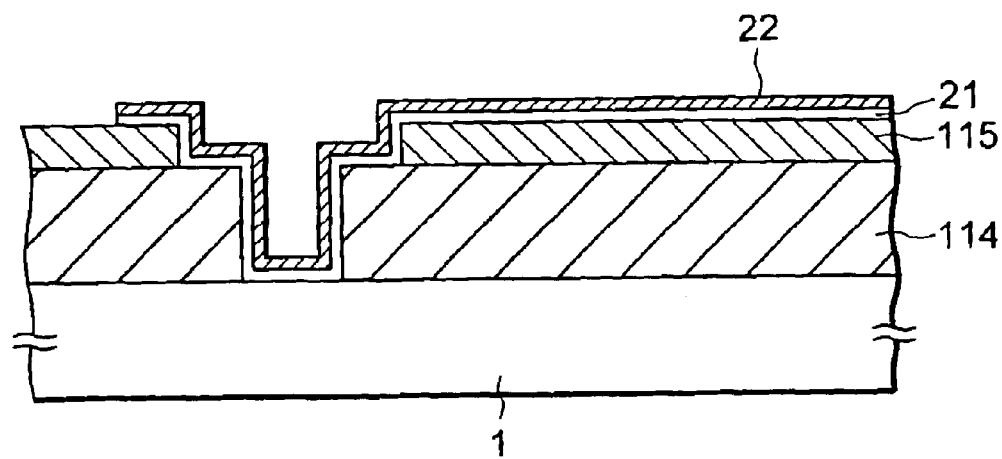

Subsequently, the resist as the sacrifice layer 115 is coated over the substrate in this state, and areas corresponding to the plane portion 111 and the column portion 110 of the legs 3, 4 are removed by the photolithography etching method (FIG. 33B).

Next, after depositing the SiN layers 21 that are to become the lower layers 21 of the first displacement portions 5, 6 and the legs 3, 4 by the P-CVD method etc, the patterning is effected thereon by the photolithography etching method, thereby obtaining the respective configurations. Next, after depositing the Al layers that are to become the upper layers 22 of the first displacement portions 5, 6 and the legs 3, 4 by the vapor deposition method etc, the patterning is effected thereon by the photolithography etching method, thereby obtaining the respective configurations (FIG. 33C).

Thereafter, through the same processes as those for manufacturing it in the second embodiment, the substrate in this state is diced into chips by dicing, and the sacrifice layers 114, 115 and other sacrifice layers are removed by the ashing method etc. The radiation detecting device in this embodiment is thereby completed.

As by the reinforcing structure shown in FIGS. 30A and 30B, The reinforcing structure as shown in FIGS. 32A and 32B, with the erect-up portion 112 formed, reinforces and gives a higher rigidity to the proximal portion of the first displacement portion 5 than by the reinforcing structure as shown in FIGS. 29A and 29B.

Note that the reinforcing structures as shown in FIGS. 30A, 30B and FIGS. 32A, 32B can be adopted similarly for, e.g., the connection portions 7a, 8a, 7b, 8b, 12a, 12b in the second embodiment shown in FIGS. 6 through 9. In this case, the connection portion 7a and others may be structured in the same way as the leg 3. This is because, for example, in FIG. 7, the heat separating portion 7 as a substantially flat thin layer member is supported via the erect-up connect portion 7a on the first displacement portion 5 as the base portion of the heat separating portion 7 in the same way as the first displacement portion 5 defined as a substantially flat thin layer member is supported on the substrate 1 via the erect-up leg 3. Further, the reinforcing structures as shown in FIGS. 30A, 30B and FIGS. 32A, 32B can be adopted in multi-purposed thin layer structural body having such a structure that the substantially flat thin layer member is supported via the erect-up leg or connect portion on the substrate or the base portion.

(Twelfth Embodiment)

Figure 34:
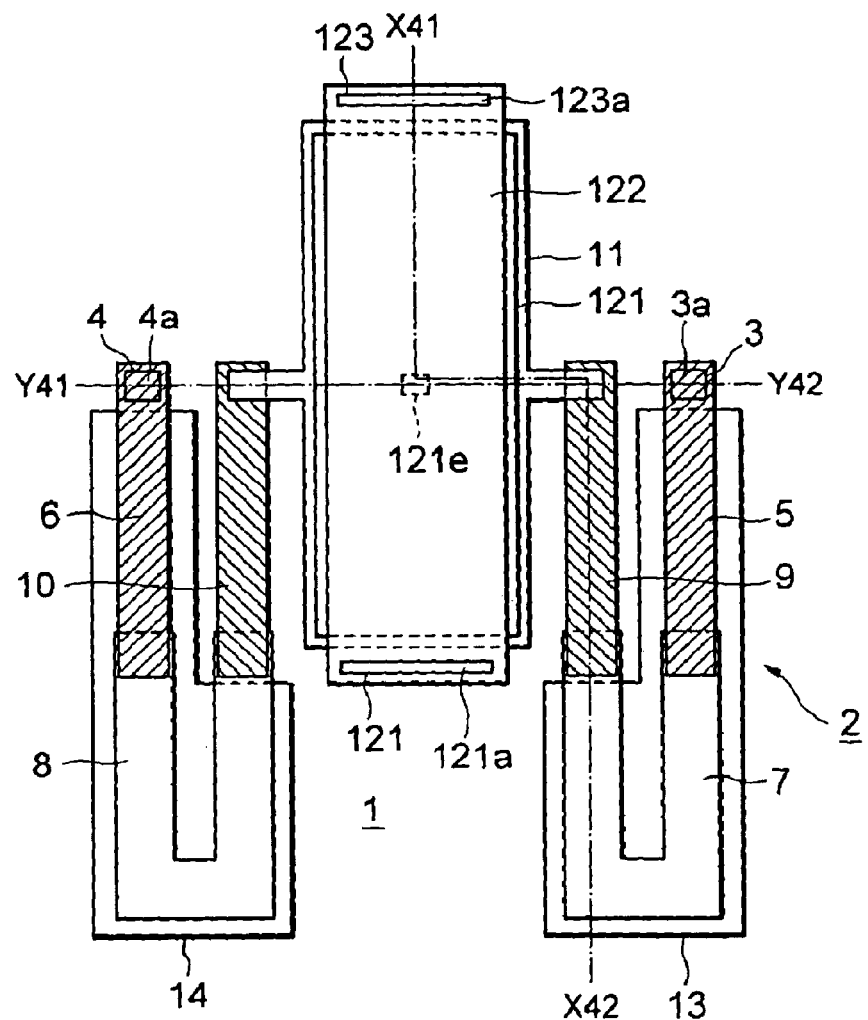
FIG. 34 is a schematic plan view schematically showing a unit pixel of a radiation detecting device in a twelfth embodiment of the present invention.

FIG. 34 is a schematic plan view schematically showing the unit pixel of the radiation detecting device in a twelfth embodiment of the present invention. FIG. 34 shows a state before the sacrifice layer (not shown) is removed in the process of manufacturing the radiation detecting device in this embodiment.

Figure 35:
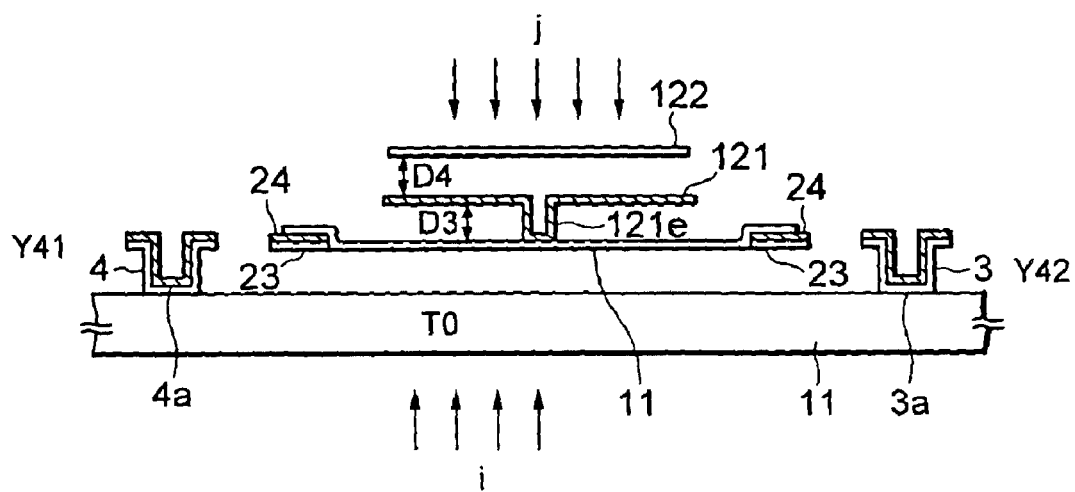
FIG. 35 is a schematic sectional view taken along the line Y41–Y42 in FIG. 34.
Figure 36:
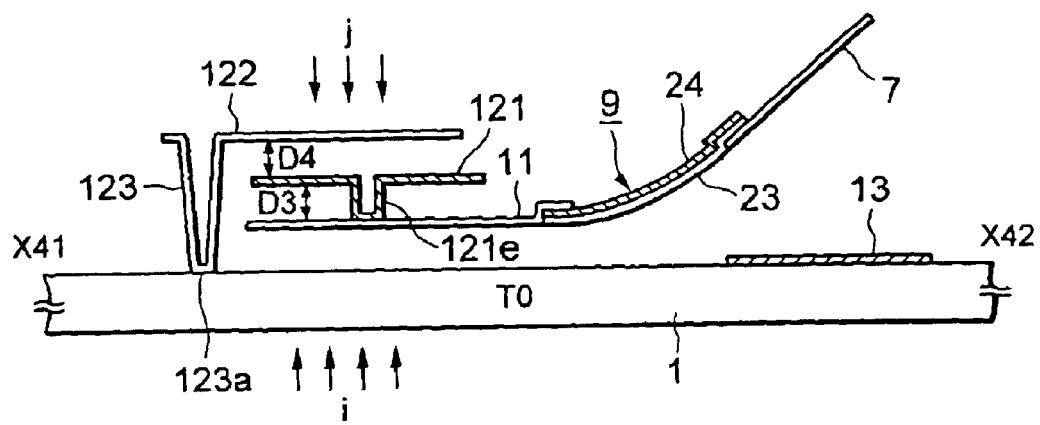
FIG. 36 is a schematic sectional view taken along the line X41–X42 in FIG. 34.

FIGS. 35 and 36 are views each schematically showing a completed state after removing the sacrifice layer. FIG. 35 corresponds to a schematic sectional view taken along the line Y41–Y42 in FIG. 34. FIG. 36 corresponds to a schematic sectional view taken along the line X41–X42 in FIG. 34. FIGS. 35 and 36 each show how the temperature of each of the substrate and the respective portions of the element comes to T0 upon reaching the thermal equilibrium if the ambient temperature is T0 in the state where the infrared-rays i from the target object do not enter, and correspond to FIG. 24.

Referring to FIGS. 34 through 36, the elements that are the same as or correspond to the elements in FIGS. 23, 24 and FIGS. 1 through 4A–4C are marked with the same numerals, and the repetitive explanations thereof are omitted. Differences of this embodiment from the seventh embodiment are mainly the following points that will hereinafter be explained.

In this embodiment, the movable reflection portion 50 and the fixed reflection portions 51, 52 (see FIGS. 23 and 24) are removed, the infrared-ray absorbing portions 11 each composed of the SiN layer having a predetermined thickness and a characteristic that reflects some of the infrared-rays i as in the fourth embodiment shown in FIGS. 13 through 17, are fixed to the distal ends of the second displacement portions 9, 10. In this embodiment, the displacement reading member involves the use of a reading beam reflection plate 121 composed of an Al layer that substantially totally reflects the received reading beam, as a substitute for the movable reflection portion 50. The reading beam reflection plate 121 is disposed so that an interval D3 between the infrared-ray absorbing portion 11 and the reflection plate 121 is given substantially by $n\lambda_0/4$, where n is an odd-number, and $\lambda_0$ is a central wavelength of a desired wavelength band of the infrared-ray i. In this embodiment, the reading beam reflection plate 121 reflecting the reading beam j also serves as an infrared-ray reflecting portion that substantially totally reflects the infrared rays i, and the infrared-ray absorbing portion 11 and the reading beam reflection plate 121 configure the optical cavity structure. The reading beam reflection plate 121 is fixed to the infrared-ray absorbing portion 11 via a connection portion 121*e*. The connection portion 121*e* is what the Al layer composing the reflection plate 121 continuously extends as it is.

In this embodiment, a half-mirror portion 122 reflecting only a part of the received reading beam j is fixed to the substrate 1, facing via a space to the reading beam reflection plate 121, but is disposed above the reading beam reflection plate 121 (i.e., on the opposite side to the substrate 1 with respect to the reading beam reflection plate 121). The half-mirror portion 122 can be composed of, e.g., the SiN layer. Alternatively, the half-mirror portion 122 can be constructed of a silicon oxide layer serving as a support portion and of a metal such as titanium coated very thin thereon in order to obtain a desired reflectance by a sputtering method etc. This point is the same with the half-mirror portion 60 in FIGS. 25 and 26.

In this embodiment, the half-mirror portion 122 is, as illustrated in FIGS. 34 and 36, fixed at both side ends thereof to the substrate 1 via two legs 123, 124 erecting from the substrate 1. The legs 123, 124 are formed by extending the layers as they are, which constitute the half-mirror portion 122. Note that 123*a*, 124*a* represent respectively contacts, onto the substrate 1, of the legs 123, 124. In this embodiment, the half-mirror portion 122 is individually provided for an individual thermal displacement element however, there is no limitation to this. For instance, if the thermal displacement elements are disposed two-dimensionally, one continuous half-mirror portion covers the reading beam reflection plates 121 of the plurality of thermal displacement elements, and only one leg for connecting the half-mirror portion 122 to the substrate 1 may be formed for the plurality of thermal displacement elements.

According to this embodiment, as in the seventh embodiment, as far as the infrared-rays i from the target object do not enter, the reading beam reflection plate 121 is parallel with the substrate 1 and remains at the fixed height. When the infrared-rays i from the target object enter, the reading beam reflection plate 121 is inclined corresponding to the quantity of the incident infrared-rays, and an interval D4 between the reading beam reflection plate 121 and the half-mirror portion 122 changes. When the reading beam j is irradiated from above, the reflected beam from the reading beam reflection plate 121 and the reflected beam from the half-mirror portion 122 interfere with each other into interference beams, and these beams travel back upwards. An intensity of the interference beams depends on the interval D4 between the reading beam reflection plate 121 and the half-mirror portion 122, thereby obtaining the interference beams having the intensity corresponding to the quantity of the incident infrared-rays.

The radiation detecting device in this embodiment can be used as a substitute for the radiation detecting device 100 in the above-mentioned visualizing apparatus illustrated in the FIG. 5. In this case, however, the beam flux restriction member 35 is removed. In this visualizing apparatus also, as by the visualizing apparatus using the radiation detecting device 100 shown in FIG. 5, the optical image of the reading beam, which is formed on the light receiving surfaces of the CCDs 30, is what reflects the image of the incident infrared-rays.

According to this embodiment, the same advantages as those in the seventh embodiment are obtained, and besides there are obtained the following advantages that will hereinafter be explained.

This embodiment and the eighth embodiment shown in FIGS. 25 and 26 are common to each other in terms of the point of obtaining the interference beams having the intensity corresponding to the quantity of the incident infrared-rays by use of the half-mirror portion and the reading beam reflection portion, wherein fluctuations in the light receiving quantity of the infrared-rays can be read out with a high sensitivity because of utilizing the principle of interference. In the eighth embodiment, however, the half-mirror portions 60 are fixed to the second displacement portions 9, 10, and the total reflection mirror (the reading beam reflection portion) 61 composed of the Al layer is formed on the substrate 1 under the half-mirror portion 60. Accordingly, the infrared-rays i are cut off by the mirror 61 with the result that the area corresponding to the half-mirror portion 60 is unusable as an area for absorbing the infrared-rays, and the lower SiN layers under the second displacement portions 9, 10 serve as the infrared-ray absorbing portions. Therefore, the aperture ratio with respect to the incidence of the infrared-rays can not be increased so much.

By contrast, according to this embodiment, the reading beam reflection plates 121 are fixed to the second displacement portions 9, 10 through the infrared-ray absorbing portions 11, and the half-mirror portion 122 is fixed to the substrate 1 but disposed above the reading beam reflection plate 121. Accordingly, the incidence of the infrared-rays i upon the infrared-ray absorbing portion 11 is not cut off by the reading beam reflection plate 121, and the infrared-ray absorbing portion 11 can be disposed in the area under the half-mirror portion 122. This area can be utilized as the area for absorbing the infrared-rays. Hence, according to this embodiment, there is obtained an advantage that the aperture ratio with respect to the incidence of the infrared-rays is enhanced.

In this embodiment, the first and second displacement portions 5, 6, 9, 10 and the heat separating portions 7, 8 take the same configurations as those in the seventh and eighth embodiments. Namely, the two layers 21, 22 of the first displacement portions 5, 6 and the two layers 23, 24 of the second displacement portions are composed of the same materials and stacked in the same sequence, i.e., in the SiN layer—Al layer sequence from the side of the substrate 1. Stacking them in this sequence schemes to bend the first displacement portions 5, 6 upward from the substrate 1 so that the first displacement portions 5, 6 do not impinge on the substrate in the initial state. On the other hand, the direction of the first displacement portions 5, 6 from their proximal ends toward their distal ends is substantially opposite to the direction of the second displacement portions 9, 10 from their proximal ends toward their distal ends. Hence, the second displacement portions 9, 10 are bent so as to get close to the substrate 1, i.e., so as to cancel the flexures of the first displacement portions 5, 6. Accordingly, the infrared-ray reflection portion 11 and the reflection plate 121, which are coupled to the second displacement portions 9, 10, are disposed in close proximity to the substrate 1.

The sacrifice layer must be provided on the reflection plate 121 in order to form the half-mirror portion 122 above the reflection plate 121 fixed to each of the second displacement portions 9, 10. In this embodiment, as explained above, the reflection plate 121 is disposed in close proximity to the substrate 1, and therefore this sacrifice layer may be thin. Hence, according to this embodiment, there is obtained an advantage that the half-mirror portion 122 can be easily formed above the reflection plate 121 fixed to each of the second displacement portions 9, 10.

Further, in this embodiment, as discussed above, the infrared-ray absorbing portion 11 and the reading beam reflection plate 121 configure the optical cavity structure with respect to the incident infrared-rays i. Hence, according to this embodiment, as in the fourth embodiment, the advantage obtained herein is that the infrared-ray absorbing rate can be increased, and both of the detection sensitivity and the redetection respondency can be enhanced. Moreover, the reading beam reflection plate 121 serves as the infrared-ray reflection portion that substantially totally reflects the infrared-rays i, whereby the structure can be simplified and the cost can be reduced down. As a matter of course, the infrared-ray reflection portion can also be provided separately from the reading beam reflection plate 121.

(Thirteenth Embodiment)

Figure 37:
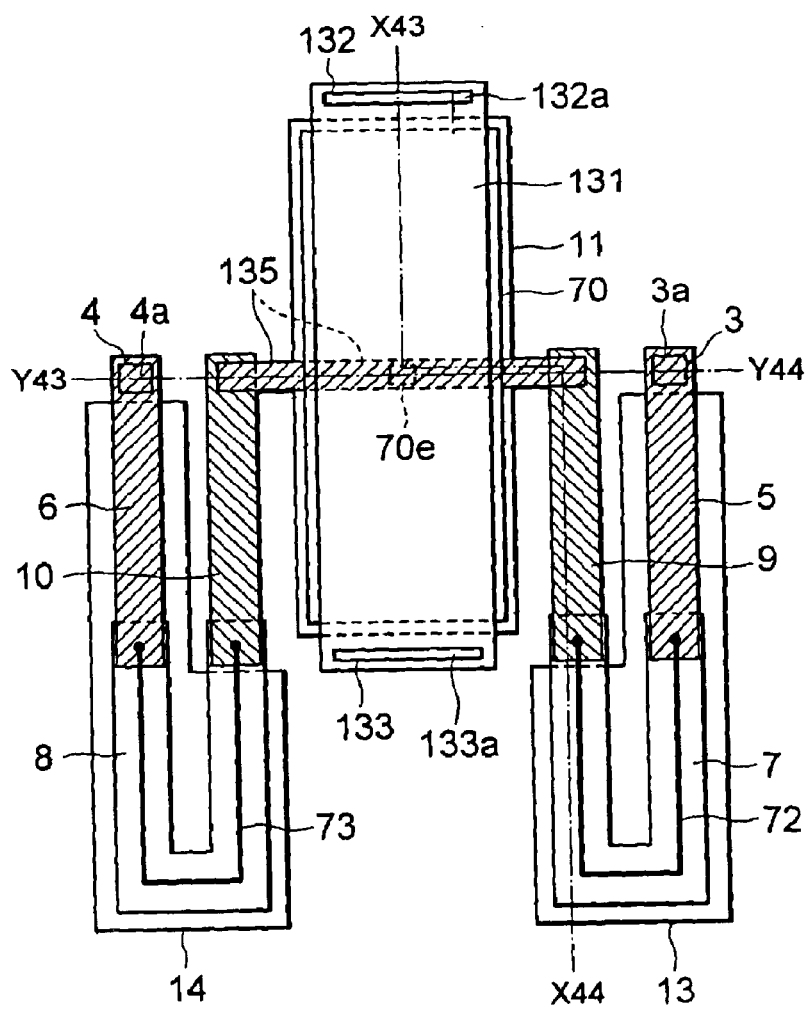
FIG. 37 is a schematic plan view schematically showing a unit pixel of a radiation detecting device in a thirteenth embodiment of the present invention.

FIG. 37 is a schematic plan view schematically showing the unit pixel of the radiation detecting device in a thirteenth embodiment of the present invention. FIG. 37 shows a state before the sacrifice layer (not shown) is removed in the process of manufacturing the radiation detecting device in this embodiment.

Figure 38:
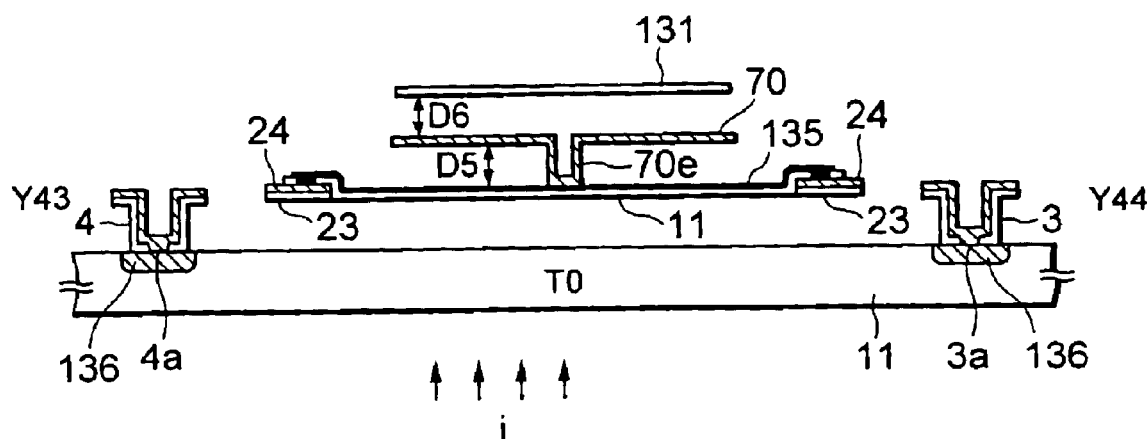
FIG. 38 is a schematic sectional view taken along the line Y43–Y44 in FIG. 37.
Figure 39:
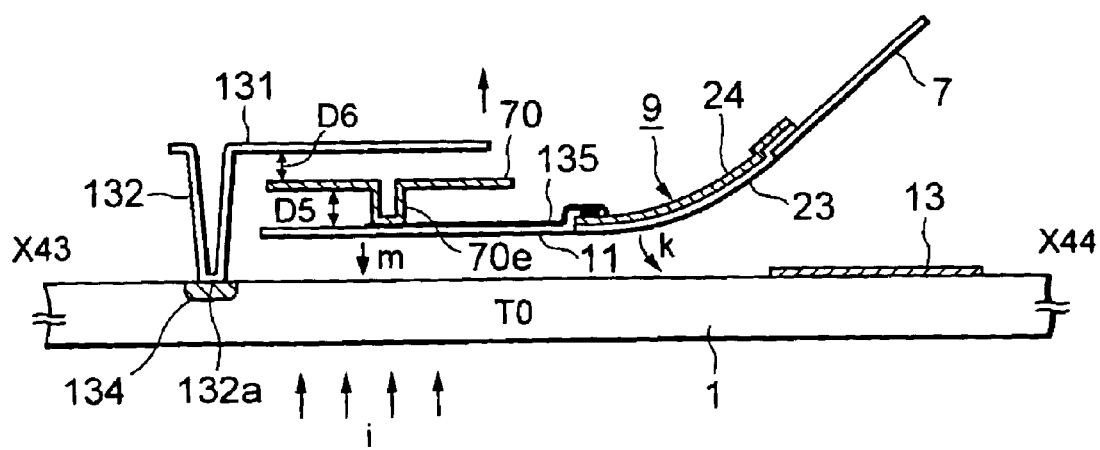
FIG. 39 is a schematic sectional view taken along the line X43–X44 in FIG. 37.

FIGS. 38 and 39 are views each schematically showing a completed state after removing the sacrifice layer. FIG. 38 corresponds to a schematic sectional view taken along the line Y43–Y44 in FIG. 37. FIG. 39 corresponds to a schematic sectional view taken along the line X43–X44 in FIG. 37. FIGS. 38 and 39 each show how the temperature of each of the substrate and the respective portions of the element comes to T0 upon reaching the thermal equilibrium if the ambient temperature is T0 in the state where the infrared-rays i from the target object do not enter, and correspond to FIG. 24.

Referring to FIGS. 37 through 39, the elements that are the same as or correspond to the elements in FIGS. 27, 28 and FIGS. 1 through 4A–4C are marked with the same numerals, and the repetitive explanations thereof are omitted. Differences of this embodiment from the ninth embodiment are mainly the following points that will hereinafter be explained.

In this embodiment, as in the fourth embodiment illustrated in FIGS. 13 through 17, the infrared-ray absorbing portion 11 composed of the SiN layer having a predetermined thickness and exhibiting a characteristic that reflects some of the infrared-rays i, is fixed to the distal end of each of the second displacement portions 9, 10. A movable electrode portion 70 composed of the Al layer and serving as a displacement reading member is disposed so that an interval D5 between the infrared-ray absorbing portion 11 and the movable electrode portion 70 is given substantially by $n\lambda_0/4$, where n is an odd-number, and $\lambda_0$ is a central wavelength of a desired wavelength band of the infrared-rays i. In this embodiment, the movable electrode portion 70 serves as an infrared-ray reflecting portion that substantially totally reflects the infrared rays i, and the infrared-ray absorbing portion 11 and the movable electrode portion 70 configure the optical cavity structure. The movable electrode portion 70 is fixed to the infrared-ray absorbing portion 11 via a connect portion 70e. The connect portion 70e is what the Al layer composing the movable electrode portion 70 continuously extends as it is. In this embodiment, the infrared-rays i from the target object are received from under.

Then, in this embodiment, as a substitute for the fixed electrode portion 71 (see FIGS. 27 and 28) disposed to cover the surface of the substrate 1 under the movable electrode portion 70, a fixed electrode portion 131 composed of the Al layer and fixed to the substrate 1 is provided, facing via a space to the movable electrode portion 70, but is disposed above the movable electrode portion 70 (i.e., on the opposite side to the substrate 1 with respect to the movable electrode portion 70). Along with this, in this embodiment, the diffused layer 72 (see FIG. 28) under the fixed electrode portion 71 is removed. The fixed electrode portion 131 is, as illustrated in FIGS. 37 and 39, fixed at both side ends thereof to the substrate 1 via two legs 132, 133 erecting up from the substrate 1. The legs 132, 133 are formed by extending the Al layers as they are, which constitute the fixed electrode portion 131. Note that 132a, 133a represent respectively contacts, onto the substrate 1, of the legs 132, 133.

The substrate 1 has a diffused layer 134 formed under the contact portions 132a, 133a, and the fixed electrode portion 131 is electrically connected to the diffused layer 134 via the legs 132, 133. A wiring layer 135 composed of the Al layer is formed on the infrared-ray absorbing portion 11. The connect portion 70e is fixed onto this wiring layer 135, and the movable electrode portion 70 is electrically connected to the wiring layer 135 via the connect portion 70e. The wiring layer 135 is, as shown in FIGS. 38 and 39, electrically connected respectively to the upper Al layers constituting the second displacement portions 9, 10 via the contact holes formed in the SiN layer composing the infrared-ray absorbing portion 11. With this configuration, the movable electrode portion 70 is electrically connected to the diffused layer 136 under the contact portions 3a, 4a. Though not illustrated in the drawings, there is formed a known reading circuit for reading an electrostatic capacitance between the diffused layers 136 and 134.

According to this embodiment, the infrared-ray absorbing portion 11 absorbs the incident infrared-rays i, and, when the temperature of each of the second displacement portions 9, 10 rises, the second displacement portions 9, 10 displace so as to get close to the substrate 1 in the direction indicated by an arrowhead k in FIG. 39. Along with this, the movable electrode portion 70 provided on the infrared-ray absorbing portion 11 displaces in the direction indicated by an arrowhead m in FIG. 39. The fixed electrode portion 131 is fixed to the substrate 1, and therefore the interval D6 between the fixed electrode portion 131 and the movable electrode portion 70 largely fluctuates. Hence, the incident infrared-rays i can be detected by measuring the electrostatic capacitance between the two electrode portions 131 and 70.

Note that the capacitance type radiation detecting device in this embodiment is manufactured so as to increase the interval D6 between the two electrodes 131, 70 when the temperature thus rises from the vicinity of a room temperature. The capacitance becomes larger as the interval D6 between the two electrodes 131, 70 gets smaller, and, if the fluctuation quantity of the interval D6 between the two electrodes 131, 70 remains unchanged, the fluctuation quantity of the capacitance becomes larger in an area with the smaller interval D6. Accordingly, the device in this embodiment exhibits a high sensitivity in the vicinity of the room temperature because of the interval D6 getting larger as the temperature rises. Hence, for instance, if used for an infrared-ray image sensor, the sensitivity can be increased in the vicinity of the room temperature with a maximum using frequency.

According to this embodiment, in addition to the advantages described above, the same advantages as those in the ninth embodiment are obtained. Moreover, according to this embodiment, as explained above, the infrared-ray absorbing portion 11 and the movable electrode portion 70 configure the optical cavity structure with respect to the incident infrared-rays i. Therefore, according to this embodiment, as in the fourth embodiment, there is obtained an advantage in which the infrared-ray absorbing rate can be increased, and both of the detection sensitivity and the detection respondency can be enhanced. Further, the movable electrode portion 70 serves as the infrared-ray reflection portion that substantially totally reflects the infrared-rays i, whereby the structure can be simplified and the cost can be reduced down. As a matter of course, the infrared-ray reflection portion can be provided separately from the movable electrode portion 70.

Note that according to the present invention the same modification as the second through sixth embodiments are obtained by modifying the first embodiment can be applied to each of the seventh, eighth, ninth, twelfth and thirteenth embodiments.

Moreover, according to the present invention, the same modification as the tenth and eleventh embodiments are obtained by modifying the second embodiment can be applied to each of other embodiments.

The discussions on the respective embodiments and the modified examples according to the present invention have been made so far. However, the present invention is not limited to those embodiments and modified examples. For example, the layer materials and others are not confined to the examples given above.

As discussed above, according to the present invention, it is possible to obviate the various inconveniences which have hitherto occurred due to the initial flexures of the displacement portions, and to provide the thermal displacement element and the radiation detecting device using this element.

Moreover, according to the present invention, if the temperature is not strictly controlled and so on, it is feasible to provide the thermal displacement element and the radiation detecting device using this element, which are capable of restraining the influence by the change in the ambient temperature to a greater degree and detecting the radiation with a higher accuracy than by the prior art.

What is claimed is:

1. A thermal displacement element comprising:

a substrate; and a supported member that is supported on said substrate at a portion of the supported member, with another portion of the supported member floating in an air space relative to the substrate, said supported member including first and second displacement portions which displace respectively depending on heat, a heat separating portion exhibiting a high thermal resistance and a radiation absorbing portion receiving the radiation and converting it into heat, wherein each of said first and second displacement portions has at least two films of different, materials having different expansion coefficients and stacked on each other, said first displacement portion is mechanically continuous to said substrate without through said heat separating portion, said second displacement portion is mechanically continuous to said substrate through said heat separating portion and said first displacement portion in this order, and said second displacement portion is thermally connected to said radiation absorbing portion.

2. A thermal displacement element according to claim 1, wherein a direction of said first displacement portion from a proximal end toward a distal end of said first displacement portion is substantially opposite to a direction of said second displacement portion from a proximal end toward a distal end of said second displacement portion, and at least said two films of said first displacement portion and at least said two films of said second displacement portion are composed of the same materials and stacked in the same sequence.

3. A thermal displacement element according to claim 2, wherein a length of said first displacement portion from a proximal end toward a distal end of said first displacement portion is substantially equal to a length of said second displacement portion from a proximal end toward a distal end of said second displacement portion.

4. A thermal displacement element according to claim 3, wherein a position of the proximal end of said first displacement portion is substantially the same as a position of the distal end of said second displacement portion as viewed in a widthwise direction of said first and second displacement portions.

5. A thermal displacement element according to claim 2, wherein said at least two films of said first displacement portion and said at least two films of said second displacement portion have a same laminated structure and the respective corresponding films of the first and second displacement portions are ones formed simultaneously.

6. A thermal displacement element according to claim 1, wherein a direction of said first displacement portion from a proximal end toward a distal end of said first displacement portion is substantially the same as a direction of said second displacement portion from a proximal end toward a distal end of said second displacement portion, and at least said two films of said first displacement portion and at least said two films of said second displacement portion are composed of the same materials and stacked in the reversed sequence.

7. A thermal displacement element according to claim 6, wherein a length of said first displacement portion from a proximal end toward a distal end of said first displacement portion is substantially equal to a length of said second displacement portion from a proximal end toward a distal end of said second displacement portion.

8. A thermal displacement element according to claim 1, wherein when said first and second displacement portions are set in an unbent state, a tier on which at least one of said first displacement portion, said second displacement portion, at least a part of said heat separating portion and said radiation absorbing portion is positioned, is different from a tier on which the rest of them are positioned.

9. A thermal displacement element according to claim 1, further comprising a shielding portion for substantially shielding said first displacement portion from the radiation.

10. A thermal displacement element according to claim 1, wherein said radiation absorbing portion includes a radiation reflection portion having such a characteristic as to reflect some of the incident radiation, and said radiation absorbing portion is disposed from said radiation absorbing portion at an interval substantially given by $n\lambda_0/4$, where n is an odd-number, and $\lambda_0$ is a central wavelength of a desired wavelength band of the radiation, and substantially totally reflects the radiation.

11. A radiation detecting device comprising:

a thermal displacement element claimed in claim 1; and a displacement reading member fixed to said second displacement portion and used for obtaining a predetermined change corresponding to a displacement in said second displacement portion.

12. A radiation detecting device according to claim 11, wherein said displacement reading member is a reflection portion reflecting received reading beams.

13. A radiation detecting device according to claim 11, wherein maid displacement reading member is a movable reflection portion and includes a fixed reflection portion fixed to said substrate, and
said movable reflection portion and said fixed reflection portion substantially configure reflection type diffraction gratings and reflect the received reading beams as diffraction light.

14. A radiation detecting device according to claim 11, wherein said displacement reading member is a half-mirror portion reflecting only some of the received reading beams and including a reflection portion fixed to said substrate in a way that faces to said half-mirror portion.

15. A radiation detecting device according to claim 11, wherein said displacement reading member is a reading beam reflection portion reflecting the received reading beams, and includes a half-mirror portion fixed to, said substrate in a way that faces to said reading beam reflection portion and reflecting only some of the received reading beams.

16. A radiation detecting device according to claim 15, wherein said displacement reading member serves as a radiation reflection portion disposed from said radiation absorbing portion at an interval substantially given by $n\lambda_0/4$, where n is an odd-number, and $\lambda_0$ is a central wavelength of a desired wavelength band of the radiation, and substantially totally reflecting the radiation.

17. A radiation detecting device according to claim 11, wherein said displacement reading member is a movable electrode portion and includes a fixed electrode portion fixed to said substrate in a way that faces to said movable electrode portion.

18. A radiation detecting device according to claim 17, wherein said fixed electrode portion is disposed on the opposite side to said substrate with respect to said movable electrode portion.

19. A radiation detecting device according to claim 18, wherein said movable electrode portion serves as a radiation reflection portion disposed from said radiation absorbing portion at an interval substantially given by $n\lambda_0/4$, where n is an odd-number, and $\lambda_0$ is a central wavelength of a desired wavelength band of the radiation, and substantially totally reflecting the radiation.

20. A thermal displacement element comprising:
a substrate; and
a supported member supported on said substrate,
said supported member including a heat separating portion exhibiting a high thermal resistance, a radiation absorbing portion receiving a radiation and converting it into heat and first and second displacement portions,
wherein each of said first and second displacement portions has a plurality of individual displacement portions,
each of said plurality of individual displacement portions of said first displacement portion has at least two layers stacked on each other and composed of different materials having different expansion coefficients;
each of said plurality of individual displacement portions of said second displacement portion has at least two layers stacked on each other and composed of different materials having different expansion coefficients;
said first displacement portion is mechanically continuous to said substrate without through said heat separating portion,
said radiation absorbing portion and said second displacement portion are mechanically continuous to said substrate through said heat separating portion and said first displacement portion, and
said second displacement portion is thermally connected to said radiation absorbing portion.

21. A thermal displacement element according to claim 20, wherein said plurality of individual displacement portions of said first displacement portion are sequentially mechanically connected in a predetermined direction from the proximal end of said first displacement portion toward the distal end of said first displacement portion,
said plurality of individual displacement portions of said second displacement portion are sequentially mechanically connected in a predetermined direction from the proximal end of said second displacement portion toward the distal end of said second displacement portion,
a direction of said first displacement portion from a proximal end toward a distal end of said first displacement portion is substantially opposite to a direction of said second displacement portion from a proximal end toward a distal end of said second displacement portion, and
at least said two layers of each of said plurality of individual displacement portions of said first displacement portion and at least said two layers of each of said plurality of individual displacement portions of said second displacement portion, are composed of the same materials and stacked in the same sequence.

22. A thermal displacement element according to claim 20, wherein there is provided such a structure that at least said two layers of each of said plurality of individual displacement portions of said first displacement portion and at least said two layers of each of said plurality of individual displacement portions of said second displacement portion can be formed simultaneously for every corresponding layer.

23. A thermal displacement element according to claim 20, wherein when said first and second displacement portions are set in an unbent state, a tier on which at least one of said plurality of individual displacement portions of said first displacement portion, said plurality of individual displacement portions of said second displacement portion, at least a part of said heat separating portion and said radiation absorbing portion is positioned, is different from a tier on which the rest of them are positioned.

24. A thermal displacement element according to claim 20, further comprising a shielding portion for substantially shielding said first displacement portion from the radiation.

25. A thermal displacement element according to claim 20, wherein said radiation absorbing portion includes a radiation reflection portion having such a characteristic as to reflect some of the incident radiation,
and said radiation absorbing portion is disposed from said radiation absorbing portion at an interval substantially given by $n\lambda_0/4$, where n is an odd-number, and $\lambda_0$ is a central wavelength of a desired wavelength band of the radiation, and substantially totally reflects the radiation.

26. A radiation detecting device comprising:
a thermal displacement element claimed in claim 20; and
a displacement reading member fixed to said second displacement portion and used for obtaining a predetermined change corresponding to a displacement in said second displacement portion.

27. A radiation detecting device according to claim 26, wherein said displacement reading member is a reflection portion reflecting received reading beams.

28. A radiation detecting device according to claim 26, wherein said displacement reading member is a movable reflection portion and includes a fixed reflection portion fixed to said substrate, and
said movable reflection portion and said fixed reflection portion substantially configure reflection type diffraction gratings and reflect the received reading beams as diffraction light.

29. A radiation detecting device according to claim 26, wherein said displacement reading member is a half-mirror portion reflecting only some of the received reading beams and including a reflection portion fixed to said substrate in a way that faces to said half-mirror portion.

30. A radiation detecting device according to claim 26, wherein said displacement reading member is a reading beam reflection portion reflecting the received reading beams, and includes a half-mirror portion fixed to said substrate in a way that faces to said reading beam reflection portion and reflecting only some of the received reading beams.

31. A radiation detecting device, according to claim 30, wherein said displacement reading member serves as a radiation reflection portion disposed from said radiation absorbing portion at an interval substantially given by $n\lambda_0/4$, where n is an odd-number, and $\lambda_0$ is a central wavelength of a desired wavelength band of the radiation, and substantially totally reflecting the radiation.

32. A radiation detecting device according to claim 26, wherein said displacement reading member is a movable electrode portion and includes a fixed electrode portion fixed to said substrate in a way that faces to said movable electrode portion.

33. A radiation detecting device according to claim 32, wherein said fixed electrode portion is disposed on the opposite side to said substrate with respect to said movable electrode portion.

34. A radiation detecting device according to claim 33, wherein said movable electrode portion serves as a radiation reflection portion disposed from said radiation absorbing portion at an interval substantially given by $n\lambda_0/4$, where n is an odd-number, and $\lambda_0$ is a central wavelength of a desired wavelength band of the radiation, and substantially totally reflecting the radiation.

* * * * *